(12) United States Patent
Mitani

(10) Patent No.: US 9,041,147 B2
(45) Date of Patent: May 26, 2015

(54) SEMICONDUCTOR SUBSTRATE, THIN FILM TRANSISTOR, SEMICONDUCTOR CIRCUIT, LIQUID CRYSTAL DISPLAY APPARATUS, ELECTROLUMINESCENT APPARATUS, SEMICONDUCTOR SUBSTRATE MANUFACTURING METHOD, AND SEMICONDUCTOR SUBSTRATE MANUFACTURING APPARATUS

(71) Applicant: Sharp Kabushiki Kaisha, Osaka-shi, Osaka (JP)

(72) Inventor: Masahiro Mitani, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/370,543

(22) PCT Filed: Jan. 10, 2013

(86) PCT No.: PCT/JP2013/050332
§ 371 (c)(1),
(2) Date: Jul. 3, 2014

(87) PCT Pub. No.: WO2013/105614
PCT Pub. Date: Jul. 18, 2013

(65) Prior Publication Data
US 2014/0367691 A1 Dec. 18, 2014

(30) Foreign Application Priority Data
Jan. 10, 2012 (JP) ................................ 2012-002598

(51) Int. Cl.
*H01L 29/00* (2006.01)
*H01L 21/20* (2006.01)
(Continued)

(52) U.S. Cl.
CPC .......... *H01L 27/124* (2013.01); *H01L 27/1266* (2013.01); *H01L 21/76254* (2013.01);
(Continued)

(58) Field of Classification Search
CPC .............. H01L 27/124; H01L 27/1259; H01L 27/1266; H01L 25/0753; H01L 29/16; H01L 21/3065; H01L 21/76254; G02F 1/136277
USPC .................... 257/72, 506, 507, 760, E27.111, 257/E29.001, E29.282, E21.567, E21.568; 438/151, 406, 455, 458, 459, 478, 530
See application file for complete search history.

(56) References Cited

U.S. PATENT DOCUMENTS 7,851,332 B2 * 12/2010 Yamazaki et al. ............ 438/463
8,110,478 B2 * 2/2012 Yamazaki et al. ............ 438/406
(Continued)

FOREIGN PATENT DOCUMENTS

JP 2005-294800 A 10/2005
JP 2009-507363 A 2/2009
(Continued)

OTHER PUBLICATIONS

Official Communication issued in International Patent Application No. PCT/JP2013/050332, mailed on Feb. 19, 2013.

*Primary Examiner* — Dao H Nguyen
(74) *Attorney, Agent, or Firm* — Keating & Bennett, LLP

(57) ABSTRACT

According to a semiconductor substrate (40), a space (A) between a plurality of Si thin film (16), which are provide apart from one another on the insulating substrate (30), is (I) larger than a difference between elongation of part of the insulating substrate which part corresponds to the space (A) and elongation of each of Si wafers (10) when a change is made from room temperature to 600° C. and (II) smaller than 5 mm. This causes an increase in a region of each of a plurality of semiconductor thin films which region has a uniform thickness, and therefore prevents transferred semiconductor layers and the insulating substrate from being fractured or chipped.

20 Claims, 22 Drawing Sheets

(51) Int. Cl.
  *H01L 21/762* (2006.01)
  *H01L 27/12* (2006.01)
  *H01L 21/3065* (2006.01)
  *G02F 1/1362* (2006.01)
  *H01L 25/075* (2006.01)

(52) U.S. Cl.
  CPC ...... *H01L21/3065* (2013.01); *G02F 1/136277* (2013.01); *H01L 27/1259* (2013.01); *H01L 25/0753* (2013.01)

(56) References Cited

U.S. PATENT DOCUMENTS

| | | | |
|---|---|---|---|
| 8,324,086 B2* | 12/2012 | Shimomura et al. | 438/479 |
| 2007/0026638 A1 | 2/2007 | Henley | |
| 2007/0110917 A1 | 5/2007 | Okada | |
| 2007/0117354 A1 | 5/2007 | Gadkaree et al. | |
| 2008/0038908 A1 | 2/2008 | Henley | |
| 2008/0286952 A1* | 11/2008 | Miyairi et al. | 438/517 |
| 2009/0079024 A1* | 3/2009 | Yamazaki | 257/506 |
| 2009/0081845 A1 | 3/2009 | Yamazaki et al. | |
| 2009/0098710 A1* | 4/2009 | Yamazaki | 438/458 |
| 2009/0181518 A1 | 7/2009 | Omata et al. | |
| 2010/0055872 A1 | 3/2010 | Moriwaka | |
| 2010/0304550 A1* | 12/2010 | Moriwaka | 438/458 |
| 2013/0221481 A1 | 8/2013 | Mitani | |

FOREIGN PATENT DOCUMENTS

| | | |
|---|---|---|
| JP | 2009-094488 A | 4/2009 |
| JP | 2009-094496 A | 4/2009 |
| JP | 2009-516929 A | 4/2009 |
| JP | 2009-194375 A | 8/2009 |
| JP | 2010-080938 A | 4/2010 |
| JP | 2011-009723 A | 1/2011 |
| WO | 2007/014320 A2 | 2/2007 |

* cited by examiner

F I G. 5
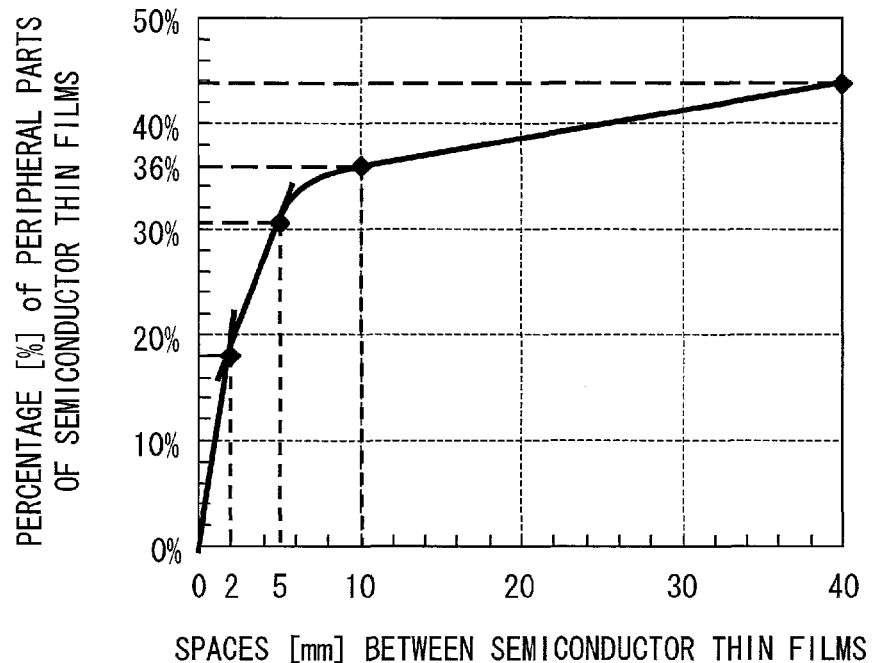
F I G. 6
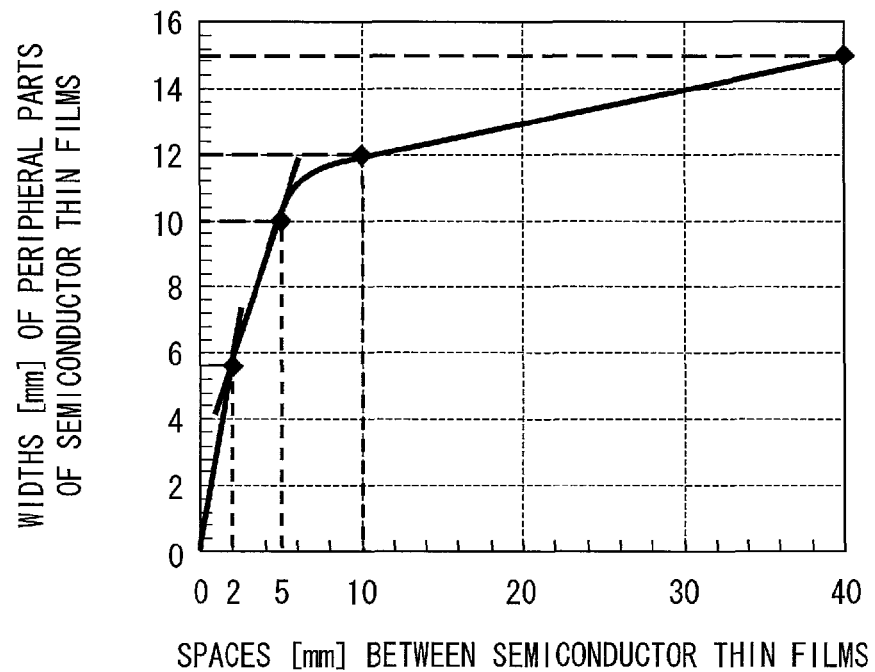

F I G. 9
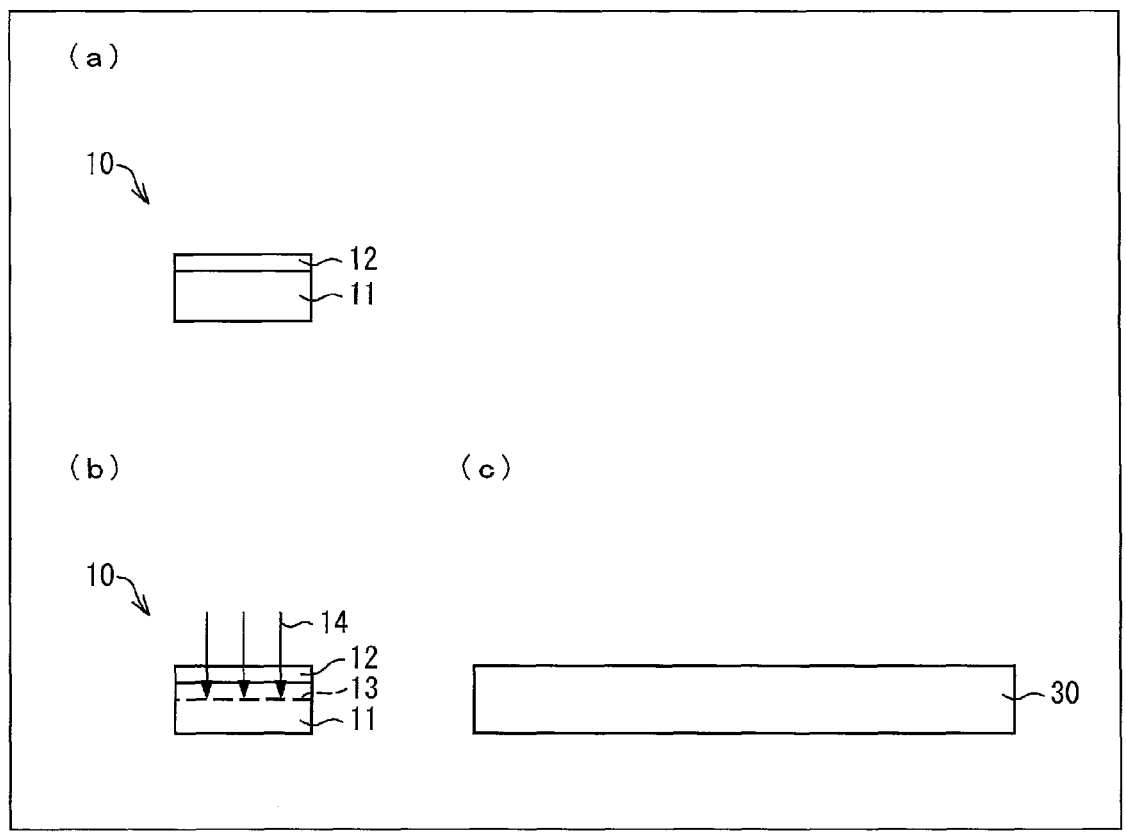

SEMICONDUCTOR SUBSTRATE, THIN FILM TRANSISTOR, SEMICONDUCTOR CIRCUIT, LIQUID CRYSTAL DISPLAY APPARATUS, ELECTROLUMINESCENT APPARATUS, SEMICONDUCTOR SUBSTRATE MANUFACTURING METHOD, AND SEMICONDUCTOR SUBSTRATE MANUFACTURING APPARATUS

TECHNICAL FIELD

The present invention relates to a semiconductor substrate, a thin film transistor, a semiconductor circuit, a liquid crystal display device, an electroluminescence device, a method of producing a semiconductor substrate, and a semiconductor substrate production device.

BACKGROUND ART

A transistor in which an SOI (Silicon on Insulator) substrate is used can reduce parasitic capacitance by a large amount than can a transistor in which a bulk silicon Si (silicon) substrate is used, and therefore achieves an increase in operation speed and a reduction in electric power consumption.

Among methods of producing an SOI substrate, a generally well-known method is the one in which a single-crystal Si layer is directly transferred onto an insulating layer by employing hydrogen ions implantation. An example of such a method is the Smart Cut (Registered Trademark) method.

However, since such a general SOI substrate is made from an Si substrate (wafer) having a size of approximately 6 inches Φ to 8 inches Φ, it was difficult to produce a large SOI substrate.

In view of the circumstances, as disclosed in Patent Literatures 1 through 6 for example, there has recently been development of technologies for producing a large-surface-area SOI substrate by a plurality of Si wafers are combined with a large glass substrate and then transferring an Si thin film by use of the Smart Cut method.

According to Patent Literature 3, a plurality of semiconductor substrates are combined with a single large glass substrate.

According to Patent Literature 3, silicon substrates are provided in respective four substrate placement regions (which are concave parts) that are provide on a substrate supporting base of a device. Then, a single large base substrate is provided so as to cover the silicon substrates provided in the respective four concave parts. Since the base substrate is large, the base substrate is supported by convex parts surrounding the respective four substrate placement regions so that the flexure of the base substrate is prevented.

Note that a plurality of substrate supporting mechanisms are provided (i) on respective bottom parts of the silicon substrates and (ii) so as to penetrate through the substrate supporting base. The silicon substrates, which are provided in the respective substrate placement regions, are lifted/lowered by the substrate supporting mechanisms. Then, when lifted, the silicon substrates come into contact with and pressed against the base substrate. This is how the plurality of silicon substrates are combined with the base substrate.

According to Patent Literature 3, a plurality of silicon substrates are thus combined at once with a single base substrate which is a large glass substrate.

Since the base substrate is supported by the convex parts surrounding the four substrate placement regions of the substrate supporting base as described above, each of the silicon substrates are combined with the base substrate apart from the other silicon substrates.

Patent Literatures 4 and 5 each disclose a method in which (i) silicon substrates are provided in respective trays each having a concave form and then (ii) silicon layers, which have been separated from the silicon substrates, are transferred onto a single base substrate.

The method disclosed in Patent Literatures 4 and 5 for producing an SOI substrate will be described below with reference to FIG. 21.

FIG. 21 is a view for describing the method, disclosed in Patent Literatures 4 and 5, of producing an SOI substrate.

As illustrated in (a) of FIG. 21, silicon substrates 812 are provided in respective concave parts which are provided on a tray 810 and are provided apart from one another.

Note that in a case where the silicon substrates 812 are to be provided on the concave parts by machine or the like, it is necessary to use a jig to hold or vacuum-hold the silicon substrates 812 by their side surfaces or back surfaces, so that combining surfaces of the silicon substrates 812 will not become dirty. Therefore, in order to secure clearance through which the jig is to be removed after providing the silicon substrates 812, the concave parts provided on the tray 810 are arranged apart from one another.

Then, as illustrated in (b) of FIG. 21, breakable regions 813 (fragile layers) are formed at a predetermined depth of the silicon substrates 812 by implanting hydrogen ions 821 in the silicon substrates 812 provided in the concave parts.

Then, as illustrated in (c) of FIG. 21, a base substrate 814, which is a single, common, large glass substrate, is combined with front surfaces (opposite surfaces facing the tray 810) of the silicon substrates 812 by applying pressure. In so doing, the base substrate 814 and the tray 810 are inverted.

Then, by heating, semiconductor layers 815 are separated from remaining parts of the silicon substrates 812 at the breakable regions 813. This allows the plurality of semiconductor layers 815 to be transferred onto the base substrate 814.

Then, as illustrated in (d) of FIG. 21, front surfaces of the semiconductor layers 815 are made flat by irradiating the front surfaces with a laser beam.

According to Patent Literatures 6 and 7, the single base substrate 814 is thus combined with the plurality of semiconductor layers 815.

Since the silicon substrates 812 are provided apart from one another on the tray 810, the semiconductor layers 815 are combined with the base substrate 814 apart from one another accordingly.

Note that the semiconductor layers 815 provided on the base substrate 814 are each required to be a thin film in order to (i) bring about a desired TFT characteristic (low off-leakage current) and (ii) secure coverage to be provided over the semiconductor layer 815. However, if a thin semiconductor layer 815 (which is made thin by forming a breakable region 813 at a shallow depth) is directly transferred to the base substrate 814, then such a thin semiconductor layer 815 becomes prone to a hole(s), and therefore causes a decrease in yield.

Hence, semiconductors, which have a thickness thicker than a desired thickness, are transferred in advance onto the base substrate 814. Then, a laser beam is used to irradiate the semiconductor layers so as to cause front surfaces of the semiconductor layers to be flat (see (d) of FIG. 21), and then the semiconductor layers are subjected to a dry etching process (which is an etch back process for thinning the semiconductor layers, and is hereinafter referred to as "etch back process"). This causes the semiconductor layers to be thin.

The etch back process is carried out by (i) placing a base substrate, on which semiconductor layers are provided, in a chamber, (ii) introducing process gas into the chamber, and then (iii) generating plasma on front surfaces of the base substrate.

Patent Literature 6 discloses a method in which (i) a plurality of silicon substrates are provided on a base substrate, (ii) the silicon substrates are each covered with a covering, (iii) the silicon substrates are broken apart at their respective breakable regions, and then (iv) silicon layers are transferred onto the base substrate.

By separating the silicon substrates at their respective breakable regions after covering each of the silicon substrates with a covering, semiconductor layers transferred onto the base substrate are prevented from being damaged by the other parts of the silicon substrates which parts could otherwise shift sideways after being broken apart from the semiconductor layers.

CITATION LIST

Patent Literatures

Patent Literature 1
Japanese Translation of PCT International Publication, Tokuhyo, No. 2009-507363 A (Publication Date: Feb. 19, 2009)
Patent Literature 2
Japanese Translation of PCT International Publication, Tokuhyo, No. 2009-516929 A (Publication Date: Apr. 23, 2009)
Patent Literature 3
Japanese Patent Application Publication, Tokukai, No. 2009-194375 A (Publication Date: Aug. 27, 2009)
Patent Literature 4
Japanese Patent Application Publication, Tokukai, No. 2009-94488 A (Publication Date: Apr. 30, 2009)
Patent Literature 5
Japanese Patent Application Publication, Tokukai, No. 2009-94496 A (Publication Date: Apr. 30, 2009)
Patent Literature 6
Japanese Patent Application Publication, Tokukai, No. 2010-80938 A (Publication Date: Apr. 8, 2010)

SUMMARY OF INVENTION

Technical Problem

As disclosed in Patent Literatures 3 through 6 described above, the plurality of Si layers to be transferred onto the base substrate are normally transferred onto the base substrate with interspaces between the Si layers.

In a case where the plurality of silicon substrates 812 are once provided on the concave parts of the tray 810 as is the case of Patent Literatures 4 and 5, it is still necessary to provide the plurality of silicon substrates 812 in the concave parts without coming into contact with the front surfaces of the silicon substrates 812 so as to avoid affecting a combining process.

Specifically, it is necessary to (i) use a jig such as a robot arm to hold the side surfaces or the back surfaces of the silicon substrates 812 and then to provide the silicon substrates 812 onto the concave parts and then (ii) remove the jig.

Since clearance for the jig to be removed is required, it is difficult in practice to provide, on the tray, the Si substrates without interspaces therebetween. This causes the plurality of semiconductor layers to be transferred onto the base substrate with interspaces between the semiconductor layers.

According to Patent Literature 6, the other parts of the silicon substrates, which parts have been broken apart at the breakable regions from the semiconductor layers transferred onto the base substrate, is to be collected. In so doing, the other parts need to be prevented from shifting sideways, so that the semiconductor layers can be prevented from being damaged by the other parts that have shifted. Therefore, the silicon substrates are preferably provided apart from one another so that they can be provided in the respective concave parts of the tray.

(a) of FIG. 22 is a plan view illustrating a configuration of an SOI substrate 940 before being subjected to an etch back process. (b) of FIG. 22 is a plan view illustrating an SOI substrate 941 after being subjected to the etch back process.

As illustrated in (a) of FIG. 22, a substrate, which has been obtained by combining Si wafers with a large glass substrate and carrying out a heat treatment for transfer of the Si wafers and which is yet to be subjected to an etch back process, inevitably has spaces of approximately 10 mm between the Si wafers thus transferred. This results in regions at which the base glass substrate is exposed.

Then, the base substrate, onto which the semiconductor layers have been transferred as such, is subjected to the etch back process.

FIG. 23 is a view illustrating an etch back process being carried out on an SOI substrate which has been obtained by providing a plurality of semiconductor layers on a base substrate with spaces between the semiconductor layers.

An SOI substrate 940 is obtained by a plurality of Si thin films 916 on an insulating substrate 930 via insulating films 912. After the plurality of Si thin films 916 are transferred, an etch back process is carried out so as to cause the Si thin films 916 to have a desired thickness.

The etch back process is carried out as follows. The SOI substrate 940 is placed in a chamber 901, and is provided on a lower electrode 903.

Then, etching gas is introduced into the chamber 901, and then electric power having a high frequency of 13.56 MHz is applied to the lower electrode 903. The high frequency electric power excites the etching gas thus introduced. This causes plasma to be generated between an upper electrode 904 and the lower electrode 903. Then, ions in the plasma are pulled toward the lower electrode 903.

Note that the plurality of Si thin films 916 provided on the insulating substrate 930 have interspaces of approximately 10 mm therebetween. Therefore, (insulated) parts of the insulating substrate 930, which parts fall on spaces Z between the Si thin films 916, are sufficiently exposed.

That is, the SOI substrate 940 has a structure in which there is a mixture of (i) the Si thin films 916 and (ii) the insulated parts between the Si thin films 916 where the insulating substrate 930 is exposed. This causes a difference in electric potential between the Si thin films 916 and the spaces Z.

The SOI substrate 940 thus has a front surface on which the there is a mixture of (i) the Si thin films 916 and (ii) parts where the insulating material is exposed between the Si thin films 916. In a case where such a front surface is subjected to the dry etching process, electric fields (electric lines of force) are concentrated on end parts of the Si thin films 916 as shown by dotted arrows in FIG. 23. This causes the end parts (peripheral parts) of the Si thin films 916 to be more subjected to etching than center parts of the Si thin films 916, and become thinner than the center parts.

As illustrated in (a) of FIG. 22, each of the Si thin films 916 has surface area including a region on which six of panels (liquid crystal display panels or the like) 947 can be formed. In other words, each of the Si thin films 916 has a thickness that is so uniform as to include a region 947 in which six panels can be formed.

The SOI substrate 940, on which such Si thin films 916 are provided, is subjected to the etch back process.

Then, as illustrated in (b) of FIG. 22, peripheral parts 946b of respective semiconductor thin films 946, which are provided on the SOI substrate 941 that has been subjected to the etch back process, become thin or disappear. Therefore, panel formation regions 946a, which are regions each having a uniform thickness and which fall in the respective center parts of the semiconductor thin films 946, each become smaller in surface area than a corresponding one of the Si thin films 916 before the etch back process. This causes a panel formation region 946a of each semiconductor thin film 946 to be able to include approximately four of the panels 947. Therefore, such a problem arises that the panels 947 are obtained less efficiently and therefore a panel production cost increases.

In addition, in a case where the Si thin films 916 combined with the insulating substrate are designed too close to one another, silicon substrates 812, which are to later become Si thin films 916, collide with one another and therefore become chipped when provided on the tray 810 (see FIG. 21). In addition, when a heating process is carried out for the transfer of the Si thin films 916, the silicon substrates 812 collide with one another due to a difference in thermal expansion coefficient between the insulating substrate 930 and the silicon substrates 812. Furthermore, such a problem is posed as failing to alleviate stress so that (i) the silicon substrates 812 and/or the insulating substrate 930 become fractured and (ii) the Si thin films 916 cannot properly be transferred onto all over the insulating substrate 930.

The present invention has been made in view of the problem, and it is an object of the present invention to (i) increase a region of each of a plurality of semiconductor thin films provided on an insulating substrate, which region has a uniform thickness and (ii) prevent semiconductor wafers and an insulating substrate from being fractured or chipped.

Solution to Problem

In order to attain the object, a semiconductor substrate in accordance with one aspect of the present invention includes: an insulating substrate; and a plurality of semiconductor thin films which are transferred onto the insulating substrate by separating part of each of a plurality of semiconductor wafers from a remaining part of the each of the plurality of semiconductor wafers, the plurality of semiconductor wafers being provided apart from one another, the plurality of semiconductor thin films having a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

In order to attain the object, a method of producing a semiconductor substrate in accordance with one aspect of the present invention is method of producing a semiconductor substrate, said semiconductor substrate including: an insulating substrate; and a plurality of semiconductor thin films which are transferred onto the insulating substrate by separating part of each of a plurality of semiconductor wafers from a remaining part of the each of the plurality of semiconductor wafers, the plurality of semiconductor wafers being provided apart from one another, said method including the step of: combining, with the insulating substrate, the plurality of semiconductor wafers which are to become the plurality of semiconductor thin films such that the plurality of semiconductor thin films will have a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

In order to attain the object, a semiconductor substrate production device in accordance with one aspect of the present invention is a semiconductor substrate production semiconductor substrate production device, said semiconductor substrate including: an insulating substrate; and a plurality of semiconductor thin films provided apart from one another on the insulating substrate, said semiconductor substrate production device including: an insulating substrate supporting table for supporting the insulating substrate; and semiconductor situating tables on which a plurality of semiconductor wafers to become the plurality of semiconductor thin films are to be situated, the insulating substrate supporting table and the semiconductor situating tables are changeable in positions relative to each other and are changeable in distance from each other, and the semiconductor substrate production device having a step of causing the plurality of semiconductor wafers, which are situated on the semiconductor situating tables, to be combined with the insulating substrate, which are supported by the insulating substrate supporting table, such that the plurality of semiconductor thin films will have a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

Advantageous Effects of Invention

A semiconductor substrate in accordance with one aspect of the present invention includes: an insulating substrate; and a plurality of semiconductor thin films which are transferred onto the insulating substrate by separating part of each of a plurality of semiconductor wafers from a remaining part of the each of the plurality of semiconductor wafers, the plurality of semiconductor wafers being provided apart from one another, the plurality of semiconductor thin films having a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

A method of producing a semiconductor substrate in accordance with one aspect of the present invention is method of producing a semiconductor substrate, said semiconductor substrate including: an insulating substrate; and a plurality of semiconductor thin films which are transferred onto the insulating substrate by separating part of each of a plurality of semiconductor wafers from a remaining part of the each of the plurality of semiconductor wafers, the plurality of semiconductor wafers being provided apart from one another, said method including the step of: combining, with the insulating substrate, the plurality of semiconductor wafers which are to become the plurality of semiconductor thin films such that the plurality of semiconductor thin films will have a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

A semiconductor substrate production device in accordance with one aspect of the present invention is a semiconductor substrate production semiconductor substrate production device, said semiconductor substrate including: an insulating substrate; and a plurality of semiconductor thin films provided apart from one another on the insulating substrate, said semiconductor substrate production device including: an insulating substrate supporting table for supporting the insulating substrate; and semiconductor situating tables on which a plurality of semiconductor wafers to become the plurality of semiconductor thin films are to be situated, the insulating substrate supporting table and the semiconductor situating tables are changeable in positions relative to each other and are changeable in distance from each other, and the semiconductor substrate production device having a step of causing the plurality of semiconductor wafers, which are situated on the semiconductor situating tables, to be combined with the insulating substrate, which are supported by the insulating substrate supporting table, such that the plurality of semiconductor thin films will have a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

This brings about effects of (i) preventing an insulating substrate and a plurality of semiconductor wafers combined with the insulating substrate from being fractured or chipped, (ii) preventing a transfer failure, and (iii) producing a semiconductor substrate in which a plurality of semiconductor thin films combined with an insulating substrate each have a uniformly reduced thickness including a thickness its peripheral parts.

BRIEF DESCRIPTION OF DRAWINGS

FIG. 5 is view showing a relationship between (i) spaces between semiconductor thin films and (ii) a percentage of surface area of peripheral parts with respect to surface area of the semiconductor thin films.

FIG. 6 is a view showing a relationship between (i) spaces between semiconductor thin films and (ii) widths of peripheral parts of the semiconductor thin films.

FIG. 9 is a view for describing steps involved before an Si wafer is combined with an insulating substrate.

DESCRIPTION OF EMBODIMENTS

Embodiment 1

The following description will discuss Embodiment 1 of the present invention in detail.

(Configuration of Semiconductor Substrate)

A configuration of a semiconductor substrate in accordance with Embodiment 1 of the present invention will be described below with reference to (a) and (b) of FIG. 1, FIG. 8, FIG. 11, and the like.

Figure 1:
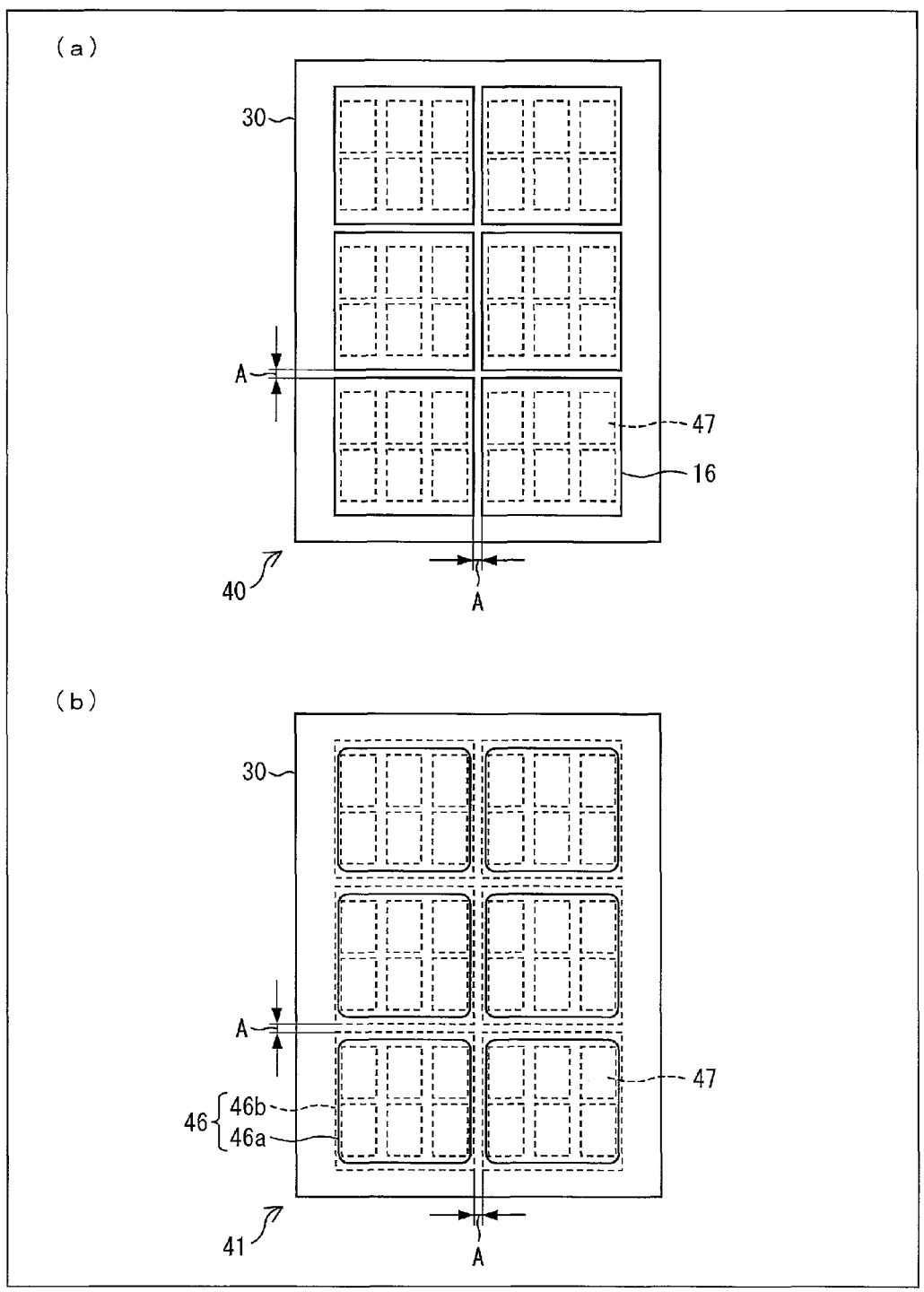
FIG. 1 is a set of plan views (a) and (b) illustrating a configuration of a semiconductor substrate of Embodiment 1, (a) of FIG. 1 illustrating a semiconductor substrate before an etch back process and (b) of FIG. 1 illustrating a semiconductor substrate after the etch back process.

FIG. 1 is a set of plan views (a) and (b) illustrating the configuration of the semiconductor substrate of Embodiment 1. (a) of FIG. 1 is a plan view illustrating a semiconductor substrate before an etch back process. (b) of FIG. 1 is a plan view illustrating a semiconductor substrate after the etch back process.

Figure 8:
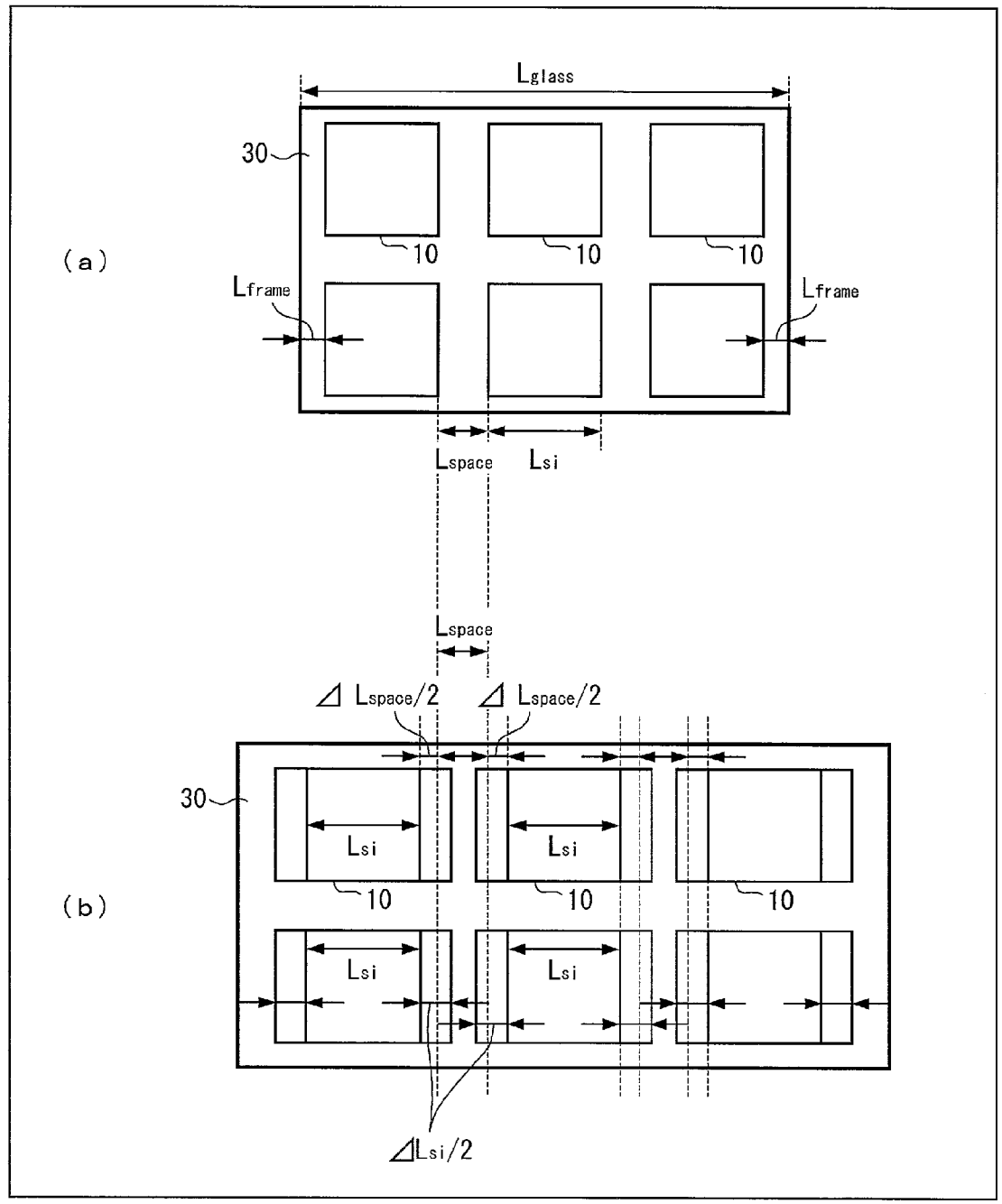
FIG. 8 is a set of views (a) and (b), (a) of FIG. 8 illustrating an insulating substrate and Si wafers at room temperature before a heating treatment and (b) of FIG. 8 illustrating the insulating substrate and the Si wafers during the heating treatment.

(a) of FIG. 8 is a view schematically illustrating an insulating substrate 30 and Si wafers 10 at room temperature before a heating treatment. (b) of FIG. 8 is view illustrating the insulating substrate 30 and the Si wafers 10 during the heating treatment.

Figure 11:
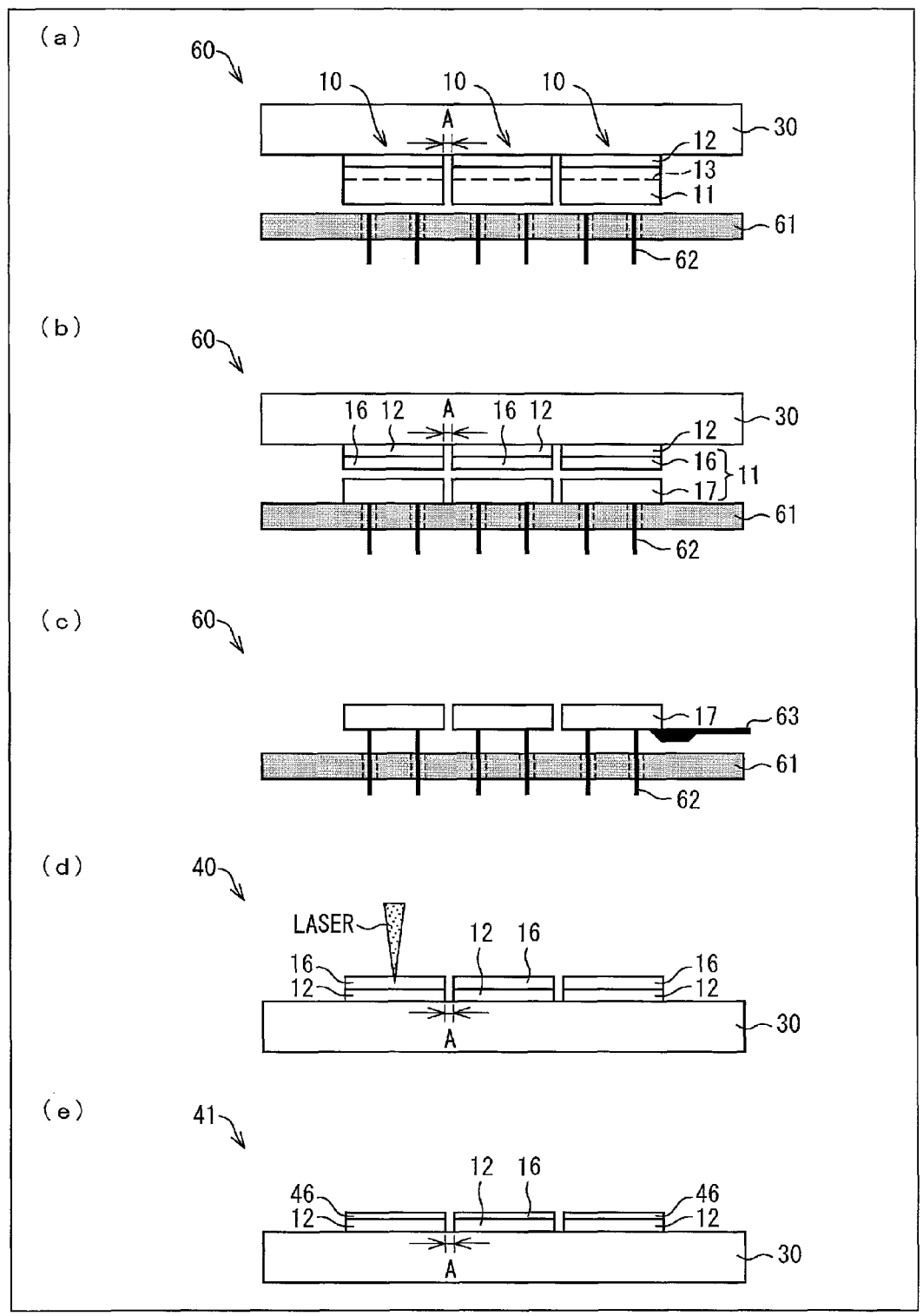
FIG. 11 is a view for describing production steps after the Si wafers are combined with the insulating substrate and until a semiconductor substrate is obtained.

FIG. 11 is a view for describing production steps after the Si wafers 10 are combined with the insulating substrate 30 and until a semiconductor substrate 41 is obtained.

Semiconductor substrates 40/41 illustrated in (a) and (b) of FIG. 1, respectively, are each an SOI (Silicon on Insulator) substrate formed by (i) combining the plurality of Si wafers 10 (described later) with the insulating substrate 30 and then (ii) transferring Si thin films (semiconductor thin films) 16/46, which are part of the Si wafers 10, by a heat treatment (see FIG. 11). A step of combining the Si wafers 10 with the insulating substrate 30 and a step of obtaining the Si thin films 16/46 from the Si wafers 10 thus combined will be described later in detail with reference to FIG. 11.

Normally, a thickness of a semiconductor thin film transferred onto an insulating substrate is adjusted to a desired thickness by thinning the semiconductor thin film through subjecting the semiconductor thin film to an etch back process.

The semiconductor substrate 40 illustrated in (a) of FIG. 1 is a semiconductor substrate before being subjected to the etch back process. The Si thin films 16 included in the semiconductor substrate 40 are formed so as to have a thickness thicker than a desired thickness.

On the other hand, the semiconductor substrate 41 illustrated in (b) of FIG. 1 is a semiconductor substrate after being subjected to the etch back process. The Si thin films 46 have been adjusted to have the desired thickness.

The semiconductor substrate 40 includes (I) the insulating substrate 30 made of an insulating material and (II) the Si thin films 16 which have been transferred onto the insulating substrate 30 by separating part of each of the Si wafers 10 from a remaining part of the each of the Si wafers 10, the Si wafers 10 being provided apart from one another on the insulating substrate 30. The semiconductor substrate 41 includes (I) the insulating substrate 30 made of an insulating material and (II) the Si thin films 46 which have been transferred onto the insulating substrate 30 by separating part of each of the Si wafers 10 from a remaining part of the each of the Si wafers 10, the Si wafers 10 being provided apart from one another on the insulating substrate 30.

The insulating substrate 30 is made of an insulating material. Examples of the insulating material encompass quartz and glass. By using a glass substrate as the insulating substrate 30, it is possible to fabricate an SOI substrate which is inexpensive and is large in surface area.

In particular, by using, as an insulating substrate 30, a mother glass substrate which has been developed for production of a liquid crystal panel, it is possible to produce a liquid crystal display panel by use of a completed semiconductor substrate 40/41.

For example, by using, as the insulating substrate 30, a large glass substrate designed for a liquid crystal display panel, such as fourth-generation glass substrate (730 mm×920 mm), a sixth-generation glass substrate (1500 mm×1850 mm), or an eighth-generation glass substrate (2200 mm×2400 mm), it is possible to produce, for example, a large-surface-area SOI substrate with which a large number of approximately 5-inch-by-5-inch (125 mm×125 mm) Si wafers (corresponding to the Si thin films 16/46 after the transfer) are combined.

As illustrated in (a) of FIG. 1 and (a) and (b) of FIG. 8, the plurality of Si wafers 10 (corresponding to the Si thin films 16 after the transfer) are provided apart from one another on the insulating substrate 30. The plurality of Si thin films 16 are arranged in a matrix on the insulating substrate 30. According to Embodiment 1, as an example, six Si wafers 10 (corresponding to the Si thin films 16 after the transfer) are provided apart from one another on the single insulating substrate 30.

The Si thin films 16 are semiconductor thin films formed on the insulating substrate 30 by (i) combining, with the insulating substrate 30, the Si wafers in each of which a fragile layer is formed and then (ii) separating each of the Si wafers at the fragile layer by heating. A specific method of producing Si thin films 16 will be described later.

The Si thin films 16 are provided on the insulating substrate 30 via an insulating layer formed between the insulating substrate 30 and the Si thin films 16. The Si thin films 46 are provided on the insulating substrate 30 via an insulating layer formed between the insulating substrate 30 and the Si thin films 46.

The Si thin films 46 are semiconductor thin films whose thickness has been adjusted to a desired thickness by subjecting the Si thin films 16 to the etch back process. A specific method of the etch back process will be described later.

The plurality of Si thin films 46 are provided apart from one another on the insulating substrate 30. The plurality of Si thin films 46 are arranged in a matrix on the insulating substrate 30. According to Embodiment 1, as an example, six of the Si thin films 46 are provided apart from one another on the single insulating substrate 30.

A front surface of the insulating substrate 30 serving as a base is exposed between the plurality of Si thin films 16. In other words, only the insulating substrate 30 made of an insulating material is provided between the Si thin films 16.

The Si thin films 16 provided on the insulating substrate 30 have spaces A therebetween. The spaces A may be regarded as spaces between the Si wafers 10 before the transfer. The Si thin films 46 provided on the insulating substrate 30 have spaces A therebetween.

The Si thin films 16 are provided on the insulating substrate 30 so that the spaces A between the Si thin films 16 are extremely small. The Si thin films 46 are provided on the insulating substrate 30.

The spaces A between the Si thin films 16 and the spaces A between the Si thin films 46 are less than 5 mm, and are preferably less than 2 mm.

The semiconductor substrate 40 is thus configured so that the spaces A between the adjacent Si thin films 16 provided on the insulating substrate 30 are each as small as 5 mm or less. This causes the insulating substrate 30 to be hardly exposed between the Si thin films 16.

In other words, the entire portion of the front surface of the insulating substrate 30 of the semiconductor substrate 40 is in effect covered with a semiconductor material.

Therefore, according to the semiconductor substrate 40, an in-plane distribution of potential difference in the semiconductor substrate 40 is suppressed when plasma is generated during the etch back process. In other words, a difference in electric potential is suppressed between (i) the spaces between the Si thin films 16 and (ii) inside the Si thin films 16. This causes an electric field to be suppressed from concentrating on peripheral parts (edge parts) of a surface of each Si thin film 16, and therefore allows for uniform etching in the surface of each Si thin film 16.

As a result, as illustrated in (b) of FIG. 1, it is possible to obtain the Si thin films 46 which have been subjected to the etch back process while the electric field is suppressed from concentrating on the peripheral parts (edge parts) of the surface of each Si thin film 16.

Although peripheral parts 46b of each Si thin film 46 become thin as a result of the etch back process, a surface area of thinned parts ends up being extremely small. This allows a large surface area of a panel formation region 46a to be secured, which panel formation region 46a (i) is part of each Si thin film 46 other than the peripheral parts 46b and (ii) has a uniform thickness. The panel formation region 46a is a region enclosed with the peripheral parts 46b.

For example, in a case where six of panels 47 can be obtained in a single Si thin film 16 before the etch back process, six of panels 47 can be obtained from a panel formation region 46a of each Si thin film 46 after the etch back process as well.

With the semiconductor substrate 40, (i) it is possible to sufficiently secure a surface area of each panel formation region 46a which has a uniform thickness so that panels 47 can be formed and (ii) it is possible to obtain a semiconductor substrate 41 including Si thin films 46 whose thickness has been adjusted to a desired thickness.

In addition, the spaces A between the Si thin films 16 are each preferably less than 2 mm. This, when the Si thin films 16 combined with the insulating substrate 30 are subjected to the etch back process, allows a further reduction in surface area of the peripheral parts 46b which have varying thicknesses. As a result, it is possible to obtain a semiconductor substrate 41 that is provided with Si thin films 46 each having a panel formation region 46a (having an even thickness) whose surface area is increased.

Note that each of the spaces A between the adjacent Si thin films 46 provided on the semiconductor substrate 41 is also as extremely small as 5 mm or less or 2 mm or less. This means that the entire portion of a front surface of the insulating substrate 30 of the semiconductor substrate 41 is in effect covered with a semiconductor material.

The semiconductor substrate 40 configured as such can be described as having a structure in which only an insulating material is provided between the adjacent Si thin films 16 since the insulating substrate 30 is exposed between the adjacent Si thin films 16.

Each of the spaces A between the adjacent Si thin films 16 is as sufficiently small as less than 5 mm and preferably less than 2 mm. Therefore, while the semiconductor substrate 40 has such a structure described above, it is possible to obtain Si thin films 46, each of which has a desired thickness, by, when subjecting the Si thin films 16 combined with the insulating substrate 30 to the etch back process, (i) decreasing the surface area of peripheral parts 46b having varying thicknesses and (ii) increasing the surface area of panel formation regions 46a.

In addition, according to the semiconductor substrate 40, each of the spaces A between the adjacent Si thin films 16 (i.e. spaces between adjacent Si wafers 10) at room temperature is configured to be larger than a difference, which is made during a heat treatment in which a temperature of the semiconductor substrate 40 is changed from the room temperature to any particular temperature higher than the room temperature, between (i) elongation of part of the insulating substrate 30 which part falls on each of the spaces A and (ii) elongation of a corresponding one of the Si wafers 10.

Therefore, even in a case where the insulating substrate and the Si wafers 10 are heated at the particular temperature after being combined with each other, it is still possible prevent the Si wafers 10, which have been elongated by the heat, from interfering with one another. This makes it possible to (i) prevent the Si wafers 10 and the insulating substrate 30 from being fractured or chipped due to a difference in thermal expansion coefficient (elongation) between the Si wafers 10 and the insulating substrate 30 that have been elongated by heat at the particular temperature and (ii) prevent particles from being generated, which particles would otherwise be generated by the elongated Si wafers 10 interfering with one another.

The particular temperature is a highest one of temperatures at which the semiconductor substrates 40 and 41 are heated during a step of producing the semiconductor substrates 40 and 41. This ensures that the Si wafers 10 and the insulating substrate 30 are prevented from being fractured or chipped as a result of the heat.

According to Embodiment 1, the particular temperature refers to a temperature at which the Si wafers 10 and the insulating substrate 30 are heated so as to obtain Si thin films 16 by separating the Si wafers 10 at fragile layers 13 after the insulating substrate 30 is combined with the Si wafers (semiconductor wafers) 10 which are each configured to contain a fragile layer 13 and an Si thin film 16 (described later with reference to (a) and (b) of FIG. 11). Note that a process of heating at the particular temperature may be referred to as "heat treatment" in the following description.

Since it is possible to prevent the Si wafers 10 and the insulating substrate 30 from being fractured or chipped due to the heat during the separation at the fragile layers 13, it is ensured that Si thin films 16 combined with the insulating substrate 30 can be obtained.

The Si thin films 16/46 are arranged in a matrix on the insulating substrate 30. In other words, the Si thin films 16/46 are provided so as to be closely laid (i.e. without interspaces) in a pattern on the insulating substrate 30. This minimizes regions of the insulating substrate 30, on which regions the Si thin films 16/46 are not provided, to be minimized, and therefore allows an increase in efficiency with which panels are to be obtained.

The Si thin films 16/46 are formed on the insulating substrate 30 by, for example, being transferred onto the insulating substrate 30 by use of the Smart Cut (Registered Trademark) method or the like.

According to Embodiment 1, the Si thin films 16/46 are made of single-crystal silicon. Since such Si thin films 16/46 are provided on the insulating substrate 30 made of glass, semiconductor substrates 40/41 serving as SOI substrates can be obtained.

The Si thin films 16, which have not been subjected to an etch back process, are formed so as to have a thickness thicker than a desired thickness. For example, the Si thin films 16 are formed so as to have a thickness of 50 nm or more and 200 nm or less. This causes a sufficient thickens of the Si thin films 16 to be secured in advance before the Si thin films 16 is transferred onto the insulating substrate 30, and therefore prevents a hole(s) in the Si thin films 16 and/or prevents a transfer failure.

Then, by subjecting the Si thin films 16, which have been transferred onto the insulating substrate 30, to the etch back process to form a desired thickness, the Si thin films 46 are formed.

An amount (thickness) of Si thin films 16 to be etched is preferably limited to approximately 100 nm or less. This makes it possible to place a limit on the amount of thickness to be etched and/or on a length of time for which the etching is carried out, and therefore causes the semiconductor substrate 41 to be less likely to be affected by variations in etching rates within the substrate (in-plane distribution). Hence, it is possible to obtain a semiconductor substrate 41 including semiconductor thin films having a uniform thickness.

In addition, the Si thin films 46, which have been subjected to the etch back process, are formed so as to have a thickness of 30 nm or more and 100 nm or less as an example of the desired thickness. This makes it possible to form a semiconductor layer having a thickness that is suitable for, for example, a TFT for driving pixels provided on a liquid crystal display panel.

For example, it is possible to form, by use of an Si thin film 46, a semiconductor for use in a TFT for driving pixels of a liquid crystal display panel.

With a single Si thin film 46, for example, six panels for production of liquid crystal display panels can be obtained. In other words, a single Si thin film 46 includes a region having a thickness so uniform as to, for example, bring about six of panels 47 for producing six liquid crystal display panels.

(Etch Back Step)

Figure 2:
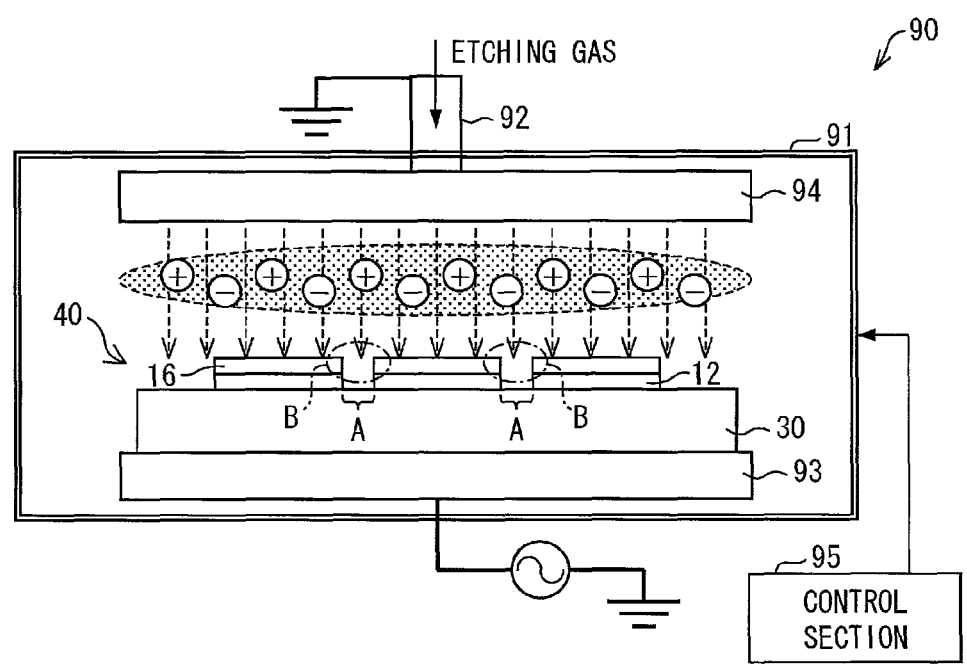
FIG. 2 is a view for describing an etch back step.

An etch back step for forming the Si thin films 16 into a desired thickness will be described next with reference to FIG. 2 and the like. FIG. 2 is a view for describing the etch back step.

According to the semiconductor substrate 40 illustrated in (a) of FIG. 1, the Si thin films 16 and oxide films 12, which are provided on a layer below the Si thin films 16, are formed by being transferred onto the insulating substrate 30. In order to cause the Si thin films 16 thus transferred onto the insulating substrate 30 to have a desired thickness, the semiconductor substrate 40 including the Si thin films 16 thus transferred is subjected to the etch back process by dry etching.

A dry etching device (device for production of a semiconductor substrate) 90 for use in the etch back process includes a chamber 91, a channel 92, a lower electrode 93, an upper electrode 94, and a control section 95.

The control section 95 is a computer for controlling an entire operation of the dry etching device 90.

The upper electrode 94 and the lower electrode 93 are provided inside the chamber 91. The upper electrode 94 is provided at an upper part inside the chamber 91 whereas the lower electrode 93 is provided at a lower part inside the chamber 91 so as to face the upper electrode 94.

The channel 92 is connected to the chamber 91 such that etching gas can be introduced into the chamber 91.

The semiconductor substrate 40 is to be situated on a front surface of the lower electrode 93 by use of, for example, a robot arm or the like (not illustrated).

Then, etching gas is introduced into the chamber 91, and then electric power, which has a high frequency of 13.56 MHz, is applied to the lower electrode 93. This causes the etching gas to be excited. As a result, plasma is generated between the upper electrode 94 and the lower electrode 93, and then ions in the plasma are pulled toward the lower electrode 93.

Figure 22:
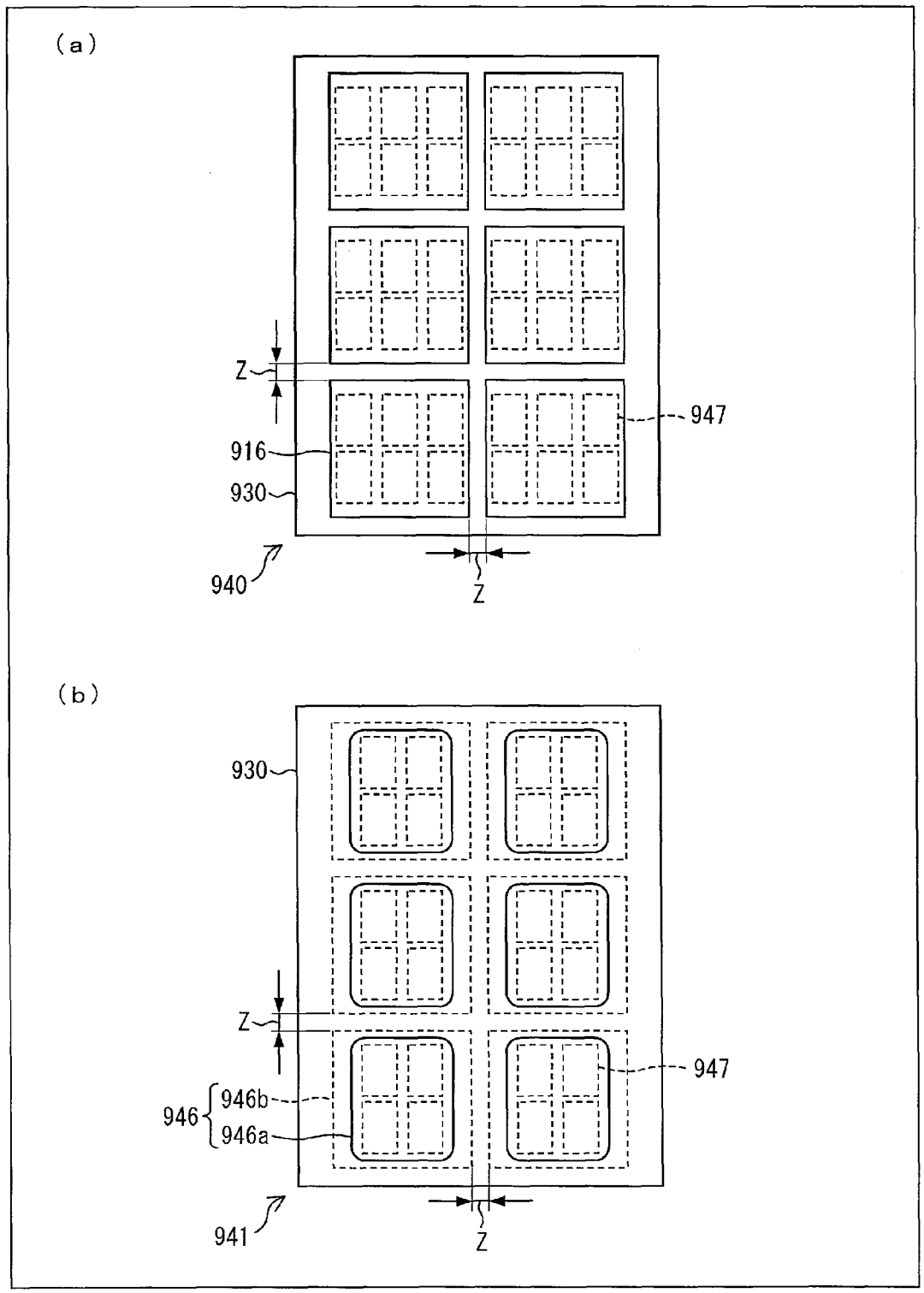
FIG. 22 is a set of views (a) and (b), (a) being a plan view illustrating a configuration of a conventional SOI substrate before an etch back process and (b) being a view illustrating a configuration of the conventional SOI substrate after the etch back process.
Figure 23:
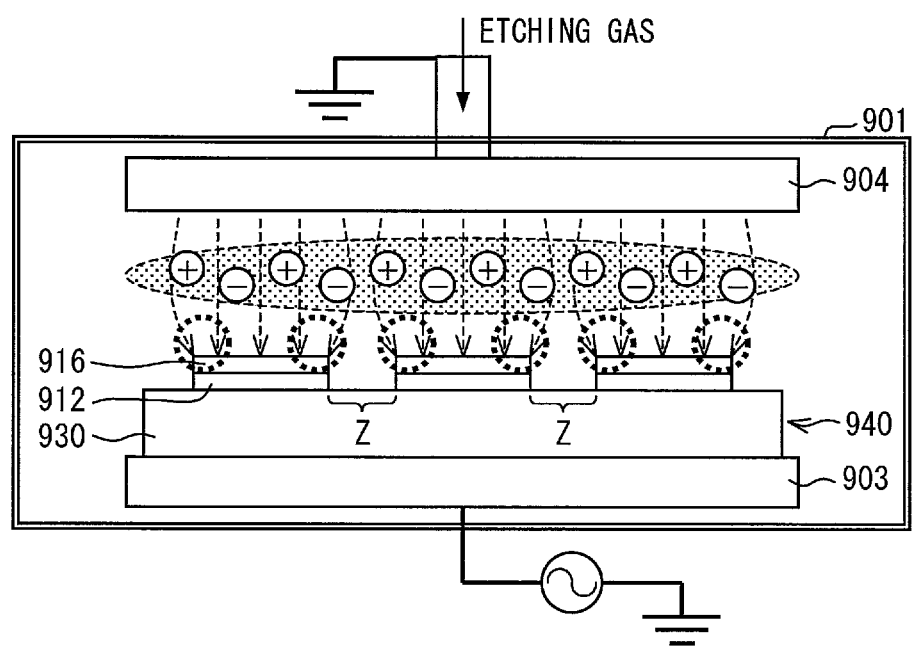
FIG. 23 is a view illustrating an etch back process being carried out on an SOI substrate which has been obtained by providing a plurality of semiconductor layers on a base substrate with spaces between the semiconductor layers.

According to the SOI substrate 940 employing the conventional technology, each of the spaces Z, which are provided between the Si thin films 916 on the insulating substrate 930 that is made of an insulating material, is as large as approximately 10 mm, as described above with reference to FIGS. 22 and 23. Therefore, parts of the front surface of the insulating substrate 930, which parts are opened and exposed at the spaces Z between the Si thin films 916, are large in surface area. This causes the front surface of the SOI substrate 940 to be, in effect, configured by a mixture of a semiconductor material and an insulating material.

Since the SOI substrate 940 employing the conventional technology has a mixed structure of the Si thin films 916 and the insulated regions, a difference in electric potential occurs between (i) the Si thin films 916 and (ii) the spaces Z between the Si thin films 916. This causes an electric field (electric line of force) to be concentrated on end parts of each Si thin film 916. This causes the end parts (peripheral parts) of each Si thin film 916 of the SOI substrate 940 to be etched and therefore made thin by the etch back process. Hence, after the etch back process, panel formation regions of the Si thin films 916, which panel formation regions have a uniform thickness, become small in surface area.

According to the semiconductor substrate 40, on the other hand, each of the spaces A between the Si thin films 16 is small, so that exposed parts of the insulating material below are small in surface area (see FIG. 2).

Specifically, each of the spaces A between the adjacent Si thin films 16 is less than 5 mm, and is preferably less than 2 mm.

According to the semiconductor substrate 40, the exposure of parts of the insulating substrate 30, which parts fall on the spaces A between the Si thin films 16, is limited. Therefore, the semiconductor substrate 40, in effect, has a structure in which the insulating substrate 30 is covered with a semiconductor material.

Therefore, according to the semiconductor substrate 40, an in-plane distribution of potential difference within the semiconductor substrate 40 is limited when plasma is generated in the etch back step. In other words, a limit is placed on the difference in electric potential between (i) the Si thin films 16 and (ii) the spaces between the Si thin films 16. This causes an electric field to be suppressed from concentrating on the peripheral parts (edge parts) of each Si thin film 16, and therefore allows uniform in-plane etching.

As a result, as illustrated in (b) of FIG. 1, it is possible to obtain Si thin films 46 which have been subjected to the etch back process while an electric field is suppressed from concentrating on the peripheral parts (edge parts) of each Si thin film 16. In other words, it is possible to obtain Si thin films 46 (i) in which surface area for forming panels 47 (surface area of regions of the Si thin films 46 which regions have a uniform thickness) is sufficiently secured and (ii) which have a thickness that has been adjusted to a desired thickness.

Note that as a result of extensive experiments and examinations, the inventor of the present invention found new knowledge that larger spaces A between Si thin films 46 (i.e. a larger percentage of exposed parts of a base insulating substrate 30) lead to a larger percentage (wider widths) of regions of peripheral parts 46b of Si thin films 46, which peripheral parts 46b are to be made thin by an etch back process.

Furthermore, as a result of the experiments, the inventor of the present invention also found new knowledge that configuring the spaces A to be each preferably 5 mm or less and more preferably 2 mm or less brings about a remarkable effect of reducing the widths of the peripheral parts 46*b* after the Si thin films 16 is subjected to the etch back process. This remarkable effect will be described below with reference to results of the experiments.

(Experiment Results Concerning Maximum Length of Spaces A)

As described above, the experiments were conducted to verify that a maximum length of each of the spaces A between the Si thin films 46 is preferably less than 5 mm and more preferably less than 2 mm. The experiments will be described below with reference to (a) through (d) of FIG. 3, (a) through (d) of FIG. 4, and FIGS. 5 through 7.

Semiconductor substrates 41*a*, 41*b*, 941*a*, and 941*b*, each of which was a multi-transfer substrate, were produced. The semiconductor substrates 41*a*, 41*b*, 941*a*, and 941*b* had spaces which (i) correspond to spaces A on Si thin films 16/46 and (ii) range from 2 mm to 40 mm. Then, examinations were conducted of relationships (i) between spaces A on an Si thin film 16 and uniformity of in-plane film thickness of an Si thin film 46 which has been subjected to an etch back process and (ii) between spaces Z of a semiconductor thin film 946 and uniformity of in-plane film thickness of an Si thin film 946.

Figure 3:
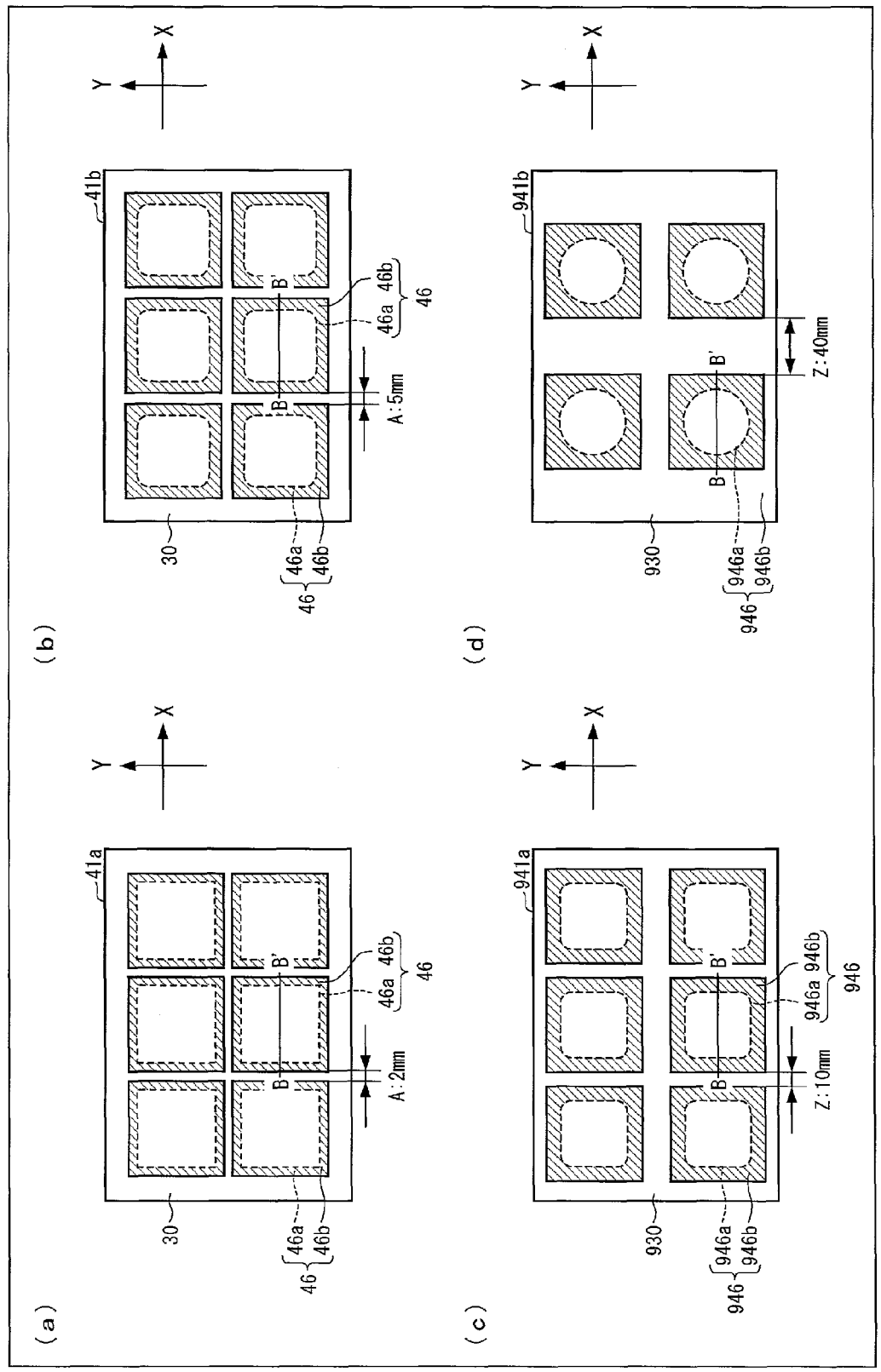
FIG. 3 is a set of views (a) through (d) illustrating appearances of semiconductor substrates after an etch back process, (a) of FIG. 3 illustrating an appearance of a semiconductor substrate in which spaces between Si thin films are each 2 mm, (b) of FIG. 3 illustrating an appearance of a semiconductor substrate in which spaces between Si thin films are each 5 mm, (c) of FIG. 3 illustrating an appearance of a semiconductor substrate in which spaces between Si thin films are each 10 mm, and (d) of FIG. 3 illustrating an appearance of a semiconductor substrate in which spaces between Si thin films are each 40 mm.

(a) through (d) of FIG. 3 are plan views illustrating semiconductor substrates which have been subjected to an etch back process. (a) of FIG. 3 is a plan view illustrating the semiconductor substrate 41*a* configured such that spaces A between Si thin films 46 are each 2 mm. (b) of FIG. 3 is a plan view illustrating the semiconductor substrate 41*b* configured such that spaces A between Si thin films 46 are each 5 mm. (c) of FIG. 3 is a plan view illustrating the semiconductor substrate 941*a* configured such that spaces Z between Si thin film 946 are each 10 mm. (d) of FIG. 3 is a plan view illustrating the semiconductor substrate 941*b* configured such that spaces Z between Si thin film 946 are each 40 mm.

Glass was used for insulating substrates 30, and single-crystal Si was used for Si thin films 46 and 946. Note that the Si thin films 46 and 946 each had a 5-inch-by-5-inch shape.

In (a) through (d) of FIG. 3, (i) a direction from a left hand side to a right hand side is designated as an X-positive direction and (ii) a direction from a near side to a far side of end parts (parallel to the X-axis) of insulating substrates 30 and 930 is designated as a Y-positive direction.

In the present experiments, the semiconductor substrates 41*a*, 41*b*, 941*a*, and 941*b*, each of which was a sample, were obtained by carrying out an etching process by use of (i) an RIE (Reactive Ion Etching) device of a parallel plate type and (ii) $CF_4$ and $O_2$ as etching gas.

Evidently, the etching gas is not limited to these types of gas, but can be obtained by using, in proper combination, gases such as $ClF_3$, $BrF_2$, $XeF_2$, $F_2$, $Cl_2$, $O_2$, and $NF_3$ by which Si can be etched.

As an example, a thickness of an Si thin film 16 (or semiconductor thin film 946) before each semiconductor substrate is subjected to the etch back process was set to approximately 130 nm.

Then, the etching process was carried out for approximately 50 seconds so as to thin down the Si thin films 16 and 946 each ultimately to approximately 50 nm. This resulted in Si thin films 46 and 946.

In (a) through (d) of FIG. 3, (i) regions of the Si thin films 46 and 946, which regions are enclosed with dashed lines, are panel formation regions 46*a* and 946*a* each having a uniform thickness, respectively and (ii) regions of the Si thin films 46 and 946, which regions fall outside (surround) the dashed lines, are peripheral parts 46*b* and 946*b*, respectively, which have been made thin by the etch back process.

In the actual experiments, the peripheral parts 46*b* and 946*b* were observed as regions having a film color different (lighter) than that of the rest of the Si thin films 46 and 946 as schematically illustrated in (a) through (d) of FIG. 3. In other words, it was recognized that larger spaces A between the adjacent Si thin films 46 and 946 (i.e. larger surface area of exposed parts of the base insulating substrate 30) cause wider widths of regions of the peripheral parts 46*b* and 946*b* which regions have a color that has been changed (i.e. regions that have been made thin).

In the actual experiments, it was thus possible to observe, even by visual observation, the panel formation regions 46*a* and 946*a* and the peripheral parts 46*b* and 946*b* of the Si thin films 46 and 946, respectively.

Thicknesses of the Si thin films 46 and 946 of the semiconductor substrates 41*a*, 41*b*, 941*a*, and 941*b* were measured by use of an optical interferotype film thickness measuring device. The results are shown in (a) through (d) of FIG. 4.

Figure 4:
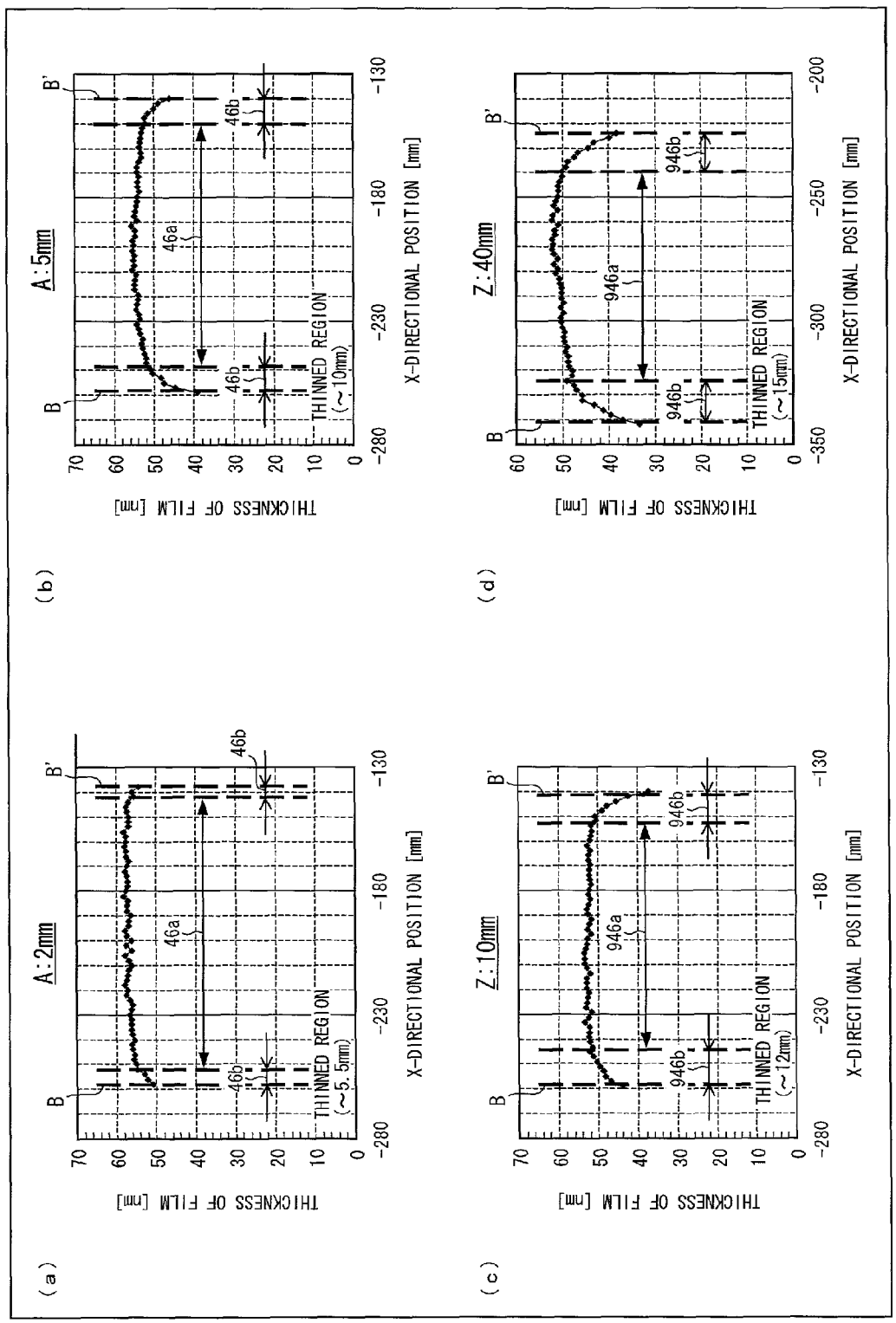
FIG. 4 is a set of views (a) through (d), (a) of FIG. 4 showing results of film thickness measurement of the Si thin films of the semiconductor substrate illustrated in (a) of FIG. 3, (b) of FIG. 4 showing results of film thickness measurement of the Si thin films of the semiconductor substrate illustrated in (b) of FIG. 3, (c) of FIG. 4 showing results of film thickness measurement of the Si thin films of the semiconductor substrate illustrated in (c) of FIG. 3, and (d) of FIG. 4 showing results of film thickness measurement of the Si thin films of the semiconductor substrate illustrated in (d) of FIG. 3.

(a) of FIG. 4 is a view showing results of film thickness measurement performed of a cross section taken along the line B-B' of an Si thin films 46 of the semiconductor substrate 41*a* illustrated in (a) of FIG. 3. (b) of FIG. 4 is a view showing results of film thickness measurement performed of a cross section taken along the line B-B' of an Si thin films 46 of the semiconductor substrate 41*b* illustrated in (b) of FIG. 3. (c) of FIG. 4 is a view showing results of film thickness measurement performed of a cross section taken along the line B-B' of an Si thin film 946 of the semiconductor substrate 941*a* illustrated in (c) of FIG. 3. (d) of FIG. 4 is a view showing results of film thickness measurement performed of a cross section taken along the line B-B' of an Si thin film 946 of the semiconductor substrate 941*b* illustrated in (d) of FIG. 3.

In each of (a) through (d) of FIG. 4, (i) a horizontal axis indicates an X-directional position (mm) on the cross section taken along the line B-B' and (ii) a vertical axis indicates a thickness (nm) of the cross section of the Si thin films 46 taken along the line B-B'.

As illustrated in (a) of FIG. 4, in a case where the spaces A between the Si thin films 46 are each set to 2 mm, each of the Si thin films 46 showed that each of both sides of a peripheral part 46*b* (i.e. a region that has been made thin), by which a corresponding panel formation region 46*a* (i.e. a region having a uniform thickness) is sandwiched, had a width of approximately 5.5 mm.

As illustrated in (b) of FIG. 4, in a case where the spaces A between the Si thin films 46 are each set to 5 mm, each of the Si thin films 46 showed that each of both sides of a peripheral part 46*b* (i.e. a region that has been made thin), by which a corresponding panel formation region 46*a* (i.e. a region having a uniform thickness) is sandwiched, had a width of approximately 10 mm.

As illustrated in (c) of FIG. 4, in a case where the spaces A between the Si thin films 946 are each set to 10 mm, each of the Si thin films 946 showed that each of both sides of a peripheral part 946*b* (i.e. a region that has been made thin), by which a corresponding panel formation region 946*a* (i.e. a region having a uniform thickness) is sandwiched, had a width of approximately 12 mm.

As illustrated in (d) of FIG. 4, in a case where the spaces A between the Si thin films 946 are each set to 40 mm, each of the Si thin films 946 showed that each of both sides of a peripheral part 946*b* (i.e. a region that has been made thin), by which a corresponding panel formation region 946*a* (i.e. a region having a uniform thickness) is sandwiched, had a width of approximately 15 mm.

It was thus recognized that smaller spaces A and Z between adjacent Si thin films 46 and 946 thus (i) result in narrower widths in the X-axis direction of the peripheral parts 46*b* and 946*b* which are, of the Si thin films 46 and 946, regions that have been made thin by the etch back process and therefore (ii) cause a reduction in increase of surface area of the peripheral parts 46*b* and 946*b* of the Si thin films 46 and 946.

FIGS. 5 and 6 are views illustrating dependency of peripheral parts of semiconductor thin films on spaces between the semiconductor thin films.

FIG. 5 is a view illustrating a relationship between (i) spaces between semiconductor thin films and (ii) a percentage of surface area of peripheral parts (that have been thinned) with respect to surface area of the semiconductor thin films.

In FIG. 5, (i) a horizontal axis indicates spaces A (or space Z) (unit: mm) between Si thin films 46 (or Si thin film 946) and (ii) a vertical axis indicates a percentage (%) of surface area of thinned peripheral parts 46*b* (or peripheral parts 946*b*) with respect to surface area of the Si thin films 46 (or Si thin films 946). A smaller value of the percentage results in smaller surface area of the thinned peripheral parts, and therefore allows for larger surface area of regions having a uniform thickness.

As illustrated in FIG. 5, (i) the surface area of a peripheral part took up approximately 44% of a corresponding semiconductor thin film in a case where the spaces between the semiconductor thin films were each 40 mm, (ii) the surface area of a peripheral part took up approximately 36% of a corresponding semiconductor thin film in a case where the spaces between the semiconductor thin films were each 10 mm, (iii) the surface area of a peripheral part took up approximately 31% of a corresponding semiconductor thin film in a case where the spaces between the semiconductor thin films were each 5 mm, (iv) the surface area of a peripheral part took up approximately 18% of a corresponding semiconductor thin film in a case where the spaces between the semiconductor thin films were each 2 mm, and (v) the surface area of a peripheral part took up 0% of a corresponding semiconductor thin film in a case where the spaces between the semiconductor thin films were each 0 mm.

From (a) through (d) of FIG. 3 and (a) through (d) of FIG. 4, it was found that a decrease in each space between semiconductor thin films results in a reduction in regions (surface area) of peripheral parts that are made thin. In addition, plotting the measured data as illustrated in FIG. 5 showed a marked tendency that a reduction rate is not merely monotonic, but, where the spaces between the semiconductor thin films each change from 10 mm to 5 mm, the percentage of surface area of the peripheral parts starts dropping drastically (i.e. reduction rate starts increasing drastically) and is not located on an extension of an approximate straight line that shows a decrease where the spaces between the semiconductor thin films each change from 40 mm to 10 mm.

It was also found that the percentage (%) of surface area of the peripheral parts of the semiconductor thin films decreases more drastically where the spaces between the semiconductor thin films each change from 5 mm to 2 mm than where the spaces between the semiconductor thin films each change from 40 mm to 5 mm.

It was further found that the percentage (%) of surface area of the peripheral parts of the semiconductor thin films decreases even more drastically where the spaces between the semiconductor thin films each change from 2 mm to 0 mm than where the spaces between the semiconductor thin films each change from 5 mm to 2 mm.

That is, the experiment results showed that the reduction rate of the percentage (%) of surface area of the peripheral parts where the spaces between the semiconductor thin films each decrease from 5 mm to 2 mm is not in line with the extension of the straight line showing the reduction rate of that where the spaces each decrease from 40 mm to 5 mm, but changes drastically.

Furthermore, the experiment results showed that the reduction rate of the percentage (%) of surface area of the peripheral parts where the spaces between the semiconductor thin films each decrease from 2 mm to 0 mm is not in line with the extension of the straight line showing the reduction rate of that where the spaces each decrease from 5 mm to 2 mm, but changes more drastically.

FIG. 6 is a view showing a relationship between (i) spaces between semiconductor thin films and (ii) widths of peripheral parts of the semiconductor thin films.

In FIG. 6, (i) a horizontal axis indicates the spaces A/Z (mm) between the Si thin films 46/946 and (ii) a vertical axis indicates the widths (mm) in the X-axis direction of the peripheral parts 46*b*/946*b* of the Si thin films 46/946.

As illustrated in FIG. 6, (i) the widths of the peripheral parts of the semiconductor thin films are each approximately 15 mm in a case where the spaces between the semiconductor thin films are each 40 mm, (ii) the widths of the peripheral parts are each 12 mm in a case where the spaces are each 10 mm, (iii) the widths of the peripheral parts are each 10 mm in a case where the spaces are each 5 mm, (iv) the widths of the peripheral parts are each approximately 5.5 mm in a case where the spaces are each 2 mm, and (v) the widths of the peripheral parts are each 0 mm in a case where the spaces are each 0 mm.

As illustrated in FIG. 6, it was found that the widths (mm) of the peripheral parts of the semiconductor thin films start decreasing drastically (i.e. the reduction rate starts increasing) where the spaces between the semiconductor thin films each change from 10 mm to 5 mm, and is not located on an extension of an approximate straight line that shows a decrease in widths (mm) of the peripheral parts where the spaces between the semiconductor thin films each change from 40 mm to 10 mm.

It was also found that the widths (mm) of the peripheral parts of the semiconductor thin films decrease more drastically where the spaces between the semiconductor thin films each change from 5 mm to 2 mm than where the spaces each change from 40 mm to 5 mm.

It was further found that the widths (mm) of the peripheral parts of the semiconductor thin films decrease even more drastically where spaces between the semiconductor thin films each change from 2 mm to 0 mm than where the spaces each change from 5 mm to 2 mm.

That is, the experiment results showed that the reduction rate of the widths (mm) of the peripheral parts of the semiconductor thin films where the spaces between the semiconductor thin films each decrease from 5 mm to 2 mm is not in line with the extension of the straight line showing the reduction rate of the widths (mm) of the peripheral parts where the spaces decrease from 40 mm to 5 mm, but changes drastically.

Furthermore, the experiment results showed that the reduction rate of the widths (mm) of the peripheral parts of the semiconductor thin films where the spaces between the semiconductor thin films each decrease from 2 mm to 0 mm is not in line with the extension of the straight line showing the reduction rate of the widths (mm) of the peripheral parts where the spaces decrease from 5 mm to 2 mm, but changes more drastically.

Note that it is yet to be understood exactly what causes the non-linear changes (change in inclination) where the spaces between the semiconductor thin films are 5 mm and 2 mm in the graph as illustrated in FIGS. 5 and 6. However, it is speculated that a combination of two factors below is responsible.

<<Factor 1>>

Figure 7:
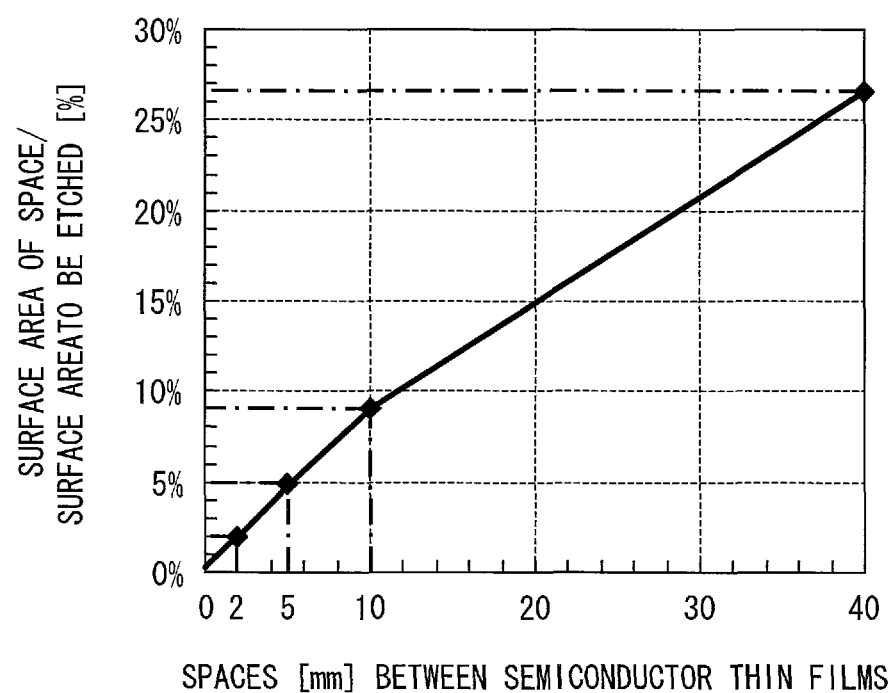
FIG. 7 is view showing a relationship between (i) spaces between semiconductor thin films and (ii) a percentage of surface area of part of an insulating substrate, which part is exposed between the semiconductor thin films, with respect to entire surface area to be etched.

FIG. 7 is a view showing a relationship between (i) spaces between semiconductor thin films and (ii) a percentage of surface area of part of an insulating substrate, which part is exposed between the semiconductor thin films, with respect to entire surface area to be etched.

In FIG. 7, (i) a horizontal axis indicates spaces A (or spaces Z) (mm) between Si thin films 46 (or Si thin films 946) and (ii) a vertical axis indicates a percentage (%) of surface area of the spaces A (or spaces Z) with respect to the entire surface area to be etched.

Note that the surface area to be etched is herein defined as surface area obtained by combining (i) surface area of all the Si thin films 46 (or Si thin films 946) provided on the insulating substrate 30 and (ii) surface area of part of the insulating substrate 30, which part is exposed between the Si thin films 46 (or Si thin films 946)

Note also that the surface area of the spaces A (or spaces Z) is herein defined as surface area of the part of the insulating substrate 30, which part is exposed between the Si thin films 46 (or Si thin films 946) that are provided on the insulating substrate 30.

As illustrated in FIG. 7, (i) a percentage (%) of surface area of the spaces Z with respect to the surface area to be etched while the spaces between the semiconductor thin films are each 40 mm is approximately 27%, (ii) the percentage (%) of surface area of the spaces Z while the spaces between the semiconductor thin films are each 10 mm is 9%, (iii) the percentage (%) of surface area of the spaces A while the spaces between the semiconductor thin films are each 5 mm is 5%, (iv) the percentage (%) of surface area of the spaces A while the spaces between the semiconductor thin films are each 2 mm is approximately 2%, and (v) the percentage (%) of surface area while the spaces between the semiconductor thin films are each 0 mm is 0%.

Smaller spaces (spaces A or spaces Z) between semiconductor thin films thus result in a lower percentage of surface area of the part of the insulating substrate, which part is exposed between the semiconductor thin films, with respect to the entire surface area to be etched.

It is speculated that a change in the percentage of surface area of the insulating substrate exposed between the semiconductor thin films, which change results from a change in spaces between the semiconductor thin films, affects (is responsible for) a change in the percentage of surface area of peripheral parts to be made thin.

It is also speculated that since the above change is of surface area, the change is proportional to the change in the spaces between the semiconductor thin films not in a linear form but normally in a form of squaring.

According to the present experiment, the surface area of the semiconductor thin films is far greater than the surface area of the insulating substrate exposed between semiconductor thin films. Therefore, as illustrated in FIG. 7, the percentage (%) of surface area of the spaces A (or spaces Z) with respect to the surface area to be etched is not exactly proportional to the square of the spaces between the semiconductor thin films. It is at least observable, however, that the percentage, in relation to the change in the spaces between the semiconductor thin films (within the range from 40 mm to 0 mm), changes not in a linear form along a single straight line but in such a form of a somewhat jagged line that the inclination changes in places.

<<Factor 2>>

In a case where, in addition to the factor 1, the spaces A between the semiconductor thin films are each less than 5 mm or are each approximately 2 mm, the spaces between the Si thin films 46 are extremely small. This, in effect, causes regions of the insulating substrate 30, which regions are provided with the Si thin films 46 (including the spaces A), to be entirely covered with a semiconductor material.

Therefore, although an analysis of the details by running electromagnetic field simulation or the like is still necessary, it can be speculated that configuring the spaces A to be each as small as less than 5 mm or as approximately 2 mm causes, during the dry etching, the electric field distribution inside a chamber to be drastically changed as compared with the electric field distribution while the spaces A were each approximately 10 mm to 40 mm. This presumably causes the electric field distribution, which is concentrated on the edges (peripheral parts 46b) of the Si thin films 46, to be significantly lessened.

It is speculated that as a result of the presumed factors 1 and 2 in combination, the graphs of FIGS. 5 and 6 do not show a monotonic change in a linear form in relation to the change in the spaces between the semiconductor thin films, but show a decrease having an inclination that becomes sharper at sections in which the spaces between the semiconductor thin films are each in the range of 5 mm to 10 mm, 2 mm to 5 mm, and 0 mm to 2 mm, in this order.

Additionally, based on the presumed factor 2, it can be said that the spaces A are preferably in such a range that the electric field distribution inside the chamber 91 of the dry etching device 90 does not become concentrated on the peripheral parts of the Si thin films 16 (or in such a range that an electric line of force becomes substantially perpendicular to an object to be etched).

(Minimum Lengths of Spaces A between Semiconductor Thin Films)

Minimum lengths of the spaces A between the Si thin films 46 will be described next with reference to (a) and (b) of FIG. 8 and the like. Note that in (a) and (b) of FIG. 8, each single-crystal Si layer 11 (see (a) and (b) of FIG. 11), a corresponding Si thin film 16, and the like are collectively referred to as an Si wafer 10.

The semiconductor substrate 41 is subjected to various processing during a production process, and is therefore, in some cases, heated at various temperatures. Note that the Si wafers 10 (or Si thin films 16) and the insulating substrate 30 (which is made of glass or the like) have differing thermal expansion coefficients. This prevents stress from being easily alleviated, and therefore may cause the substrate to be warped. As a result, the Si wafers 10 and/or the insulating substrate 30 may be fractured or chipped. In addition, the Si wafers 10 may collide with one another and may consequently cause particles to be generated.

Therefore, the spaces A between the semiconductor thin films each need to have at least a length that is substantially great enough that adjacent Si wafers 10 (or Si thin films 16) do not interfere with each other even in a case where the Si wafers 10 (Si thin films 16) and/or the insulating substrate 30 expand due to a highest temperature at which they are heated during the process of producing a semiconductor substrate 41.

An example of a step (involved in the process of producing the semiconductor substrate 41), during which the Si wafers 10 (Si thin films 16) and/or the insulating substrate 30 are heated at the highest temperature, is a heat treatment step. The heat treatment step is a step in which Si wafers 10 combined with an insulating substrate 30 are heated so that each of the Si wafers 10 is separated at a fragile layer 13 formed thereof (see (a) and (b) of FIG. 11). This causes Si thin films 16, which are thus obtained by thinning the Si wafers 10, to be transferred onto the insulating substrate 30.

A temperature used during the heat treatment step is normally set in the range of 500° C. or more to a strain point of glass (approximately 720° C.) or less, depending on which heating method is to be used, such as furnace anneal or RTA (Rapid Thermal Annealing). In the present example, as an example of conditions for the heat treatment step, (i) furnace anneal was used and (ii) the insulating substrate 30 and the Si wafers 10 were heated at a temperature of 600° C. for 1 hour.

The symbols and characteristics shown in (a) and (b) of FIG. 8 are as follows:

$L_{si}$: Length of each Si wafer 10 before heat treatment (at room temperature)

$L_{glass}$: Length of insulating substrate 30 (glass substrate) before heat treatment (room temperature)

$L_{frame}$: Distance between circumference of insulating substrate 30 (glass substrate) and outermost Si wafers 10 before heat treatment (room temperature)

$L_{space}$: Length of a part of insulating substrate 30, which part corresponds to each space A between adjacent Si wafers 10 before heat treatment (room temperature) ($L_{space}=(L_{glass}-n\cdot L_{si}-2\cdot L_{frame})/(n-1)$)

n: Number of Si wafers 10 arranged in one direction $\Delta L_{si}$: Elongation ($\Delta L_{si}=L_{si}\cdot\alpha_{si}\cdot\Delta T$) of each Si wafer 10 during heat treatment $\Delta L_{space}$: Elongation ($\Delta L_{space}=L_{space}\cdot\alpha_{glass}\cdot\Delta T$) of a part of insulating substrate 30 (glass substrate), which part corresponds to each space A during heat treatment $\alpha_{si}$: Thermal expansion coefficient of Si (silicon) (at average of room temperature and 600° C.)

$\alpha_{glass}$: Thermal expansion coefficient of glass (at average of room temperature and 600° C.)

$\Delta T$: Variation of temperature

Note that, for simplicity, FIG. 8 is a schematic view only assuming elongations in the X-axis direction, and the length and the like describe above are assumed to extend in the X-axis direction. In practice, however, similar elongations also occur in the Y-axis direction, and therefore the length and the like in the Y-axis direction can be considered likewise.

The following description will discuss a semiconductor substrate 60 in which, as illustrated in (a) of FIG. 8, a plurality (n) of Si wafers 10 each having a length (X-axis direction) of $L_{si}$ are arranged in a direction, with spaces A ($L_{space}$) therebetween, on an insulating substrate (glass substrate) 30 having a length (X-axis direction) of $L_{glass}$ at room temperature.

In addition, there is a distance of $L_{frame}$ between a circumference of the insulating substrate 30 (glass substrate) and outermost Si wafers 10.

In a case where the semiconductor substrate 60 is subjected to a heat treatment in which Si thin films are separated so as to be transferred, one side of each of the Si wafers 10 elongates by ($\Delta L_{si}/2$) at a temperature (600° C.) during the heat treatment.

Specifically, the Si wafers elongate, per space A ($L_{space}$), by $\Delta L_{si}$ obtained by combining ($\Delta L_{si}/2$) of an Si wafer 10 of one side and ($\Delta L_{si}/2$) of an Si wafers 10 of the other side ($=(\Delta L_{si}/2)+(\Delta L_{si}/2)$). In other words, each of the spaces A ($L_{space}$) becomes smaller by $\Delta L_{si}$ due to the elongation of the Si wafers 10.

On the other hand, at the temperature (600° C.) during the heat treatment, the insulating substrate 30 (glass substrate) elongates by $\Delta L_{space}$ per space A, that is, by $\Delta L_{space}/2$ at each of right and left sides of a part corresponding to each of the spaces A. In other words, each of the spaces A ($L_{space}$) elongates by $\Delta L_{space}$ due to the elongation of the insulating substrate 30 (glass substrate).

Therefore, in order to prevent the Si wafers 10 during the heat treatment (as illustrated in (a) and (b) of FIG. 8) from elongating so much as to collide with one another, it is necessary that each space A ($L_{space}$) at room temperature be larger than a difference ($\Delta L_{si}-\Delta L_{space}$) which is obtained by subtracting the elongation $\Delta L_{space}$ (of a part of the insulating substrate 30 which part corresponds to each space A) at the heat treatment (600° C.) from the elongation $\Delta L_{si}$ (of each Si wafer 10) at the heat treatment (600° C.).

That is, each space A (i.e. $L_{space}$), by which the Si wafers are to be provided apart from one another in advance under conditions (at room temperature) before the heat treatment, can be indicated by the following inequality:

$$L_{space} > \Delta L_{si} - \Delta L_{space}$$

where (i) $\Delta L_{si} = L_{si}\cdot\alpha_{si}\cdot\Delta T$, and (ii) $\Delta L_{space} = L_{space}\cdot\alpha_{glass}\cdot\Delta T$
$= \{(L_{glass} - n\cdot L_{si} - 2\cdot L_{frame})/(n-1)\}\cdot\alpha_{glass}\cdot\Delta T$ An example of specific figures is as shown below. In the example, (i) a square Si wafer measuring 125 mm by 125 mm is used as each of Si wafers 10, (ii) EAGLE-XG (Registered Trademark) glass, manufactured by Corning Inc., which measures 400 mm×320 mm, is used as an insulating substrate 30, (iii) a space of 10 mm was provided between a circumference of the insulating substrate 30 (glass substrate) and outermost Si wafers 10 (see (a) of FIG. 8), and (iv) a total of six Si wafers 10 (three Si wafers 10 in each row extending in the X-axis direction) are combined with the insulating substrate 30 (see (a) of FIG. 8). Needless to say, in a case where a change(s) is made to the size and/or the number of Si wafers and/or to the size and/or type of glass substrate, it is only necessary to use corresponding parameters.

Lglass=400 mm
Lsi=125 mm
Lframe=10 mm
n=3

$$Lspace = (Lglass - n\cdot Lsi - 2\cdot Lframe)/(n-1)$$
$$= (400 - 3\cdot 125 - 2\cdot 10)/(3-1)$$
$$= 2.5 \text{ mm}$$

$$\Delta Lsi = Lsi\cdot\alpha si\cdot\Delta T$$
$$= 125 \text{ mm} \times 3.5 \times 10\text{-}6/° \text{C.} \times (600° \text{C.} - 25° \text{C.})$$
$$= 0.251 \text{ mm}$$

$$\Delta Lspace = (Lspace\cdot\alpha glass\cdot\Delta T)$$
$$= 2.5 \text{ mm} \times 3.4 \times 10\text{-}6/° \text{C.} \times (600° \text{C.} - 25° \text{C.})$$
$$= 0.005 \text{ mm}$$

The following equations are therefore true:
$\Delta Lsi - \Delta Lspace = 0.251$ mm $-0.005$ mm $=0.246$ mm. This indicates that it is possible, by combining the Si wafers 10 with the insulating substrate 30 so as to configure each space A (i.e. Lspace) between adjacent Si wafers 10 to be larger than 0.246 mm, to prevent the adjacent Si wafers 10 from, during the heat treatment step in which each of the Si wafers 10 is separated at a fragile layer 13 thereof, undergoing thermal expansion so much as to interfere with each other. This prevents the Si wafers 10 and/or the insulating substrate 30 from becoming fractured or chipped, and therefore prevents resulting particles from being generated. This ensures Si thin films 16 of excellent quality.

In addition, the Si wafers 10 are preferably combined with the insulating substrate 30 so that each space between adjacent Si wafers 10 is larger than 0.5 mm. This makes it possible to more reliably prevent the Si wafers 10 and/or the insulating substrate 30 from being fractured or chipped by the heat treatment while the Si wafers 10 are each separated at a fragile layer 13 thereof.

(Method of Producing Semiconductor Substrate)

The following description will discuss, with reference to FIGS. 9 through 13, a method of producing (i) a semiconductor substrate 40 and/or (ii) a thin film transistor in which a semiconductor substrate 40 is used.

<Steps before Combining Si Wafers with Insulating Substrate>

First, steps involved before combining Si wafers with an insulating substrate will be described with respect to FIGS. 9 and 13.

FIG. 9 is a view for describing steps before combining the Si wafers with the insulating substrate.

First, in a step of forming oxide films, Si wafers each made of single-crystal Si are each subjected to a thermal oxidation process so that an oxide film ($SiO_2$) 12 having a thickness of approximately 50 nm to 100 nm is formed on a front surface of a single-crystal Si layer 11 (see (a) of FIG. 9). This causes each Si wafer 10, which is made up of the oxide film 12 and the single-crystal Si layer 11 formed on the front surface of the oxide film 12, to be obtained. The oxide film 12 is formed, on the front surface of the single-crystal Si layer 11, so as to have a thickness of approximately 50 nm to 100 nm.

The Si wafers 10 can be obtained by, for example, (i) cutting a quadrilateral Si wafer out of a circle having a diameter of 8 inches (200 mm), 12 inches (300 mm), 18 inches (450 mm), or the like and then (ii) subjecting the Si wafer to a thermal oxidation process.

The oxide film 12 can be obtained by, for example, (i) introducing a single-crystal Si wafer in a typical vertical furnace or horizontal furnace and then (ii) subjecting the single-crystal Si wafer to a heat treatment at a temperature of 900° C. to 1000° C. for 1 hour to 3 hours.

Note that the single-crystal Si layer 11 is not limited to an Si layer, but can be made of any single-crystal material.

Examples of a material for the single-crystal Si layer 11, other than silicon, encompass (i) germanium, (ii) a semiconductor material containing silicon and germanium, (iii) silicon compound, and (iv) III-V group compound semiconductors such as GaAs and GaN.

In a case where the single-crystal Si layer 11 is made of a semiconductor material other than silicon, it is possible to form a semiconductor wafer, which corresponds to the Si wafer 10, by depositing an oxide film 12 ($SiO_2$ film) on a front surface of a single-crystal semiconductor material by use of the CVD (chemical vapor deposition) method.

Next, in a step of forming a fragile layer, a fragile layer 13 is formed in the single-crystal Si layer 11 (see (b) of FIG. 9).

Hydrogen ions 14 are introduced into the single-crystal Si layer 11 from a top-surface side of the oxide film 12 formed on the front surface of the single-crystal Si layer 11 (hydrogen ions implantation, hydrogen ions doping). By thus introducing the hydrogen ions 14 into a certain depth inside the single-crystal Si layer 11, the fragile layer 13 is formed inside the single-crystal Si layer 11.

In a case where, for example, $H^+$ ions are to be primarily introduced, conditions in which to implant (dope) the hydrogen ions are as follows: (i) implantation energy: approximately 5 keV to 20 keV and (ii) implantation volume: approximately $1 \times 10^{16}/cm^2$ to $1 \times 10^{17}/cm^2$.

Alternatively, in a case where ions such as those containing $H_3^+$ are to be introduced into the single-crystal Si layer 11, conditions are as follows: (i) implantation energy: approximately 30 keV to 90 keV and (ii) implantation volume: $1 \times 10^{16}/cm^2$ through $1 \times 10^{17}/cm^2$.

In such a case, a fragile layer 13 is formed at a depth of approximately 50 nm to 200 nm from an interface between the oxide film 12 (having a thickness of 100 nm) and the single-crystal Si layer 11.

Examples of the hydrogen ions 14 encompass $H^+$, $H_2^+$ ions, and $H_3^+$. Along with H ions, He ions can also be implanted.

The depth, (i) from the front surface of the oxide film 12 and (ii) at which the fragile layer 13 is to be formed by the hydrogen ions 14, is determined by the implantation energy (acceleration voltage) of the hydrogen ions 14.

Figure 13:
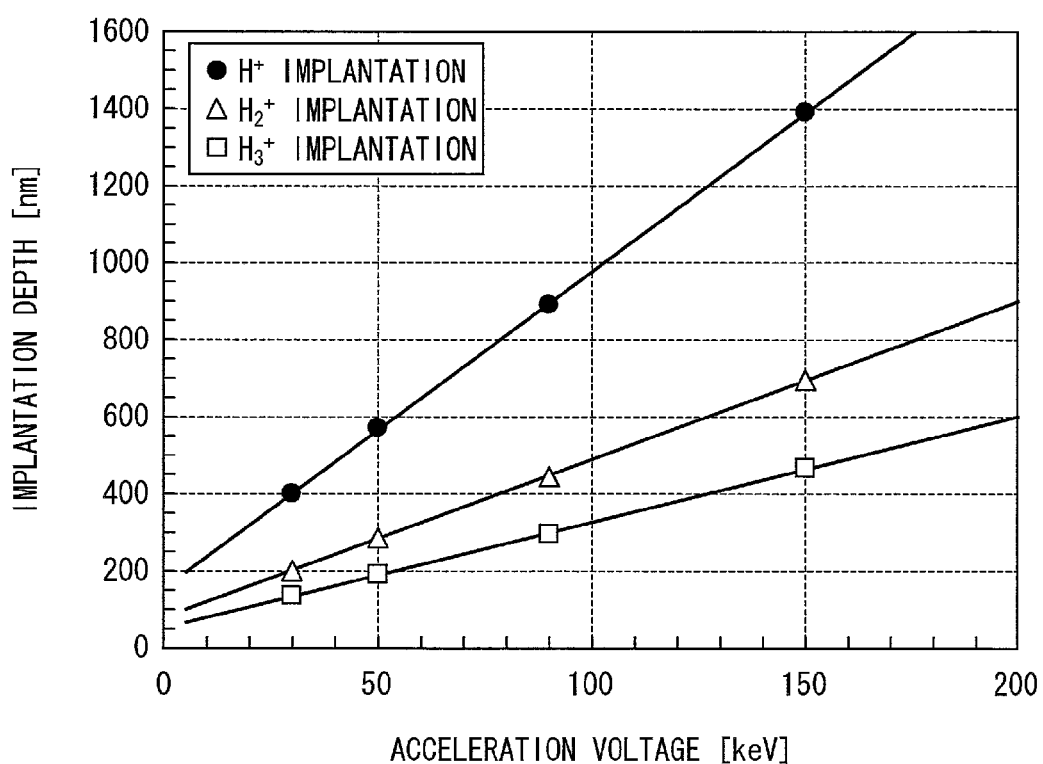
FIG. 13 is a view showing implantation depths with respect to acceleration voltages of $H^+$, $H_2^+$, and $H_3^+$.

FIG. 13 is a view showing implantation depths with respect to acceleration voltages of $H^+$, $H_2^+$, and $H_3^+$. The implantation depths of $H_2^+$ and $H_3^+$ are calculated based on the implantation depth of H. This is due to the fact that, in a case where acceleration voltage is constant, heavier ions result in a shallower implantation depth, and therefore (i) the use of $H_2^+$ results in an implantation depth which is approximately ½ of that of $H^+$ and (ii) the use of $H_3^+$ results in an implantation depth which is approximately ⅓ of that of $H^+$. The implantation depths, to which the hydrogen ions 14 is implanted in the Si wafer 10, shows dependency upon the acceleration voltages (see FIG. 13).

FIG. 13 indicates that higher acceleration voltages result in deeper implantation depths of $H^+$, $H_2^+$, and $H_3^+$. If an acceleration voltage is excessively high, however, then it causes problems such as substandard throughput and a high temperature of the Si wafer 10 in which the ions are implanted. Therefore, the acceleration voltage, at which the hydrogen ions 14 are to be implanted, is approximately 150 keV at the maximum.

Therefore, the maximum depth, to which the hydrogen ions 14 are implanted in the Si wafer 10 without causing a decrease in production efficiency, is (i) approximately 1400 nm in a case where $H^+$ is used, (ii) approximately 700 nm in a case where $H_2^+$ is used, and (iii) approximately 460 nm in a case where $H_3^+$ is used.

As illustrated in (c) of FIG. 9, an insulating substrate 30, with/onto which the Si wafers 10 are to be combined/transferred, is prepared.

As the insulating substrate 30, a glass substrate, a quartz substrate, or the like can be used. Furthermore, the insulating substrate 30 is preferably, for example, a mother glass substrate, which has been developed for use in production of a liquid crystal panel.

By using, as the insulating substrate 30, a large glass substrate, such as fourth-generation glass substrate (730 mm×920 mm), a sixth-generation glass substrate (1500 mm×1850 mm), or an eighth-generation glass substrate (2200 mm×2400 mm), it is possible to produce, for example, a semiconductor substrate 41 serving as a large-surface-area SOI substrate with which a large number of approximately 5-inch-by-5-inch (125 mm×125 mm) Si wafers are combined.

Since the insulating substrate 30 is to be combined with the Si wafers 10, the insulating substrate 30 has preferably been subjected to a top-surface-planarization process by carrying out CMP (Chemical Mechanical Polishing).

Then, before the Si wafers 10 and the insulating substrate 30 are introduced into a combining device (semiconductor substrate production device) 50 in a following step, the front surfaces (combining surfaces) of the Si wafers 10 and the insulating substrate 30 are made hydrophilic by subjecting the Si wafers 10 and the insulating substrate 30 to a plasma treatment, a drug solution treatment, or the like. In a case where the plasma treatment is to be carried out, Ar plasma, atmospheric-pressure plasma, or the like can be employed. Alternatively, it is also possible to subject the front surfaces of the Si wafers 10 and the insulating substrate 30 to a drug solution treatment such as ozone water washing or SC1 washing for several minutes so that the front surfaces of the Si wafers 10 and of the insulating substrate 30 become hydrophilic.

<Combining Step>

A step of combining the Si wafers 10 with the insulating substrate 30 will be described next with reference to FIG. 10.

Figure 10:
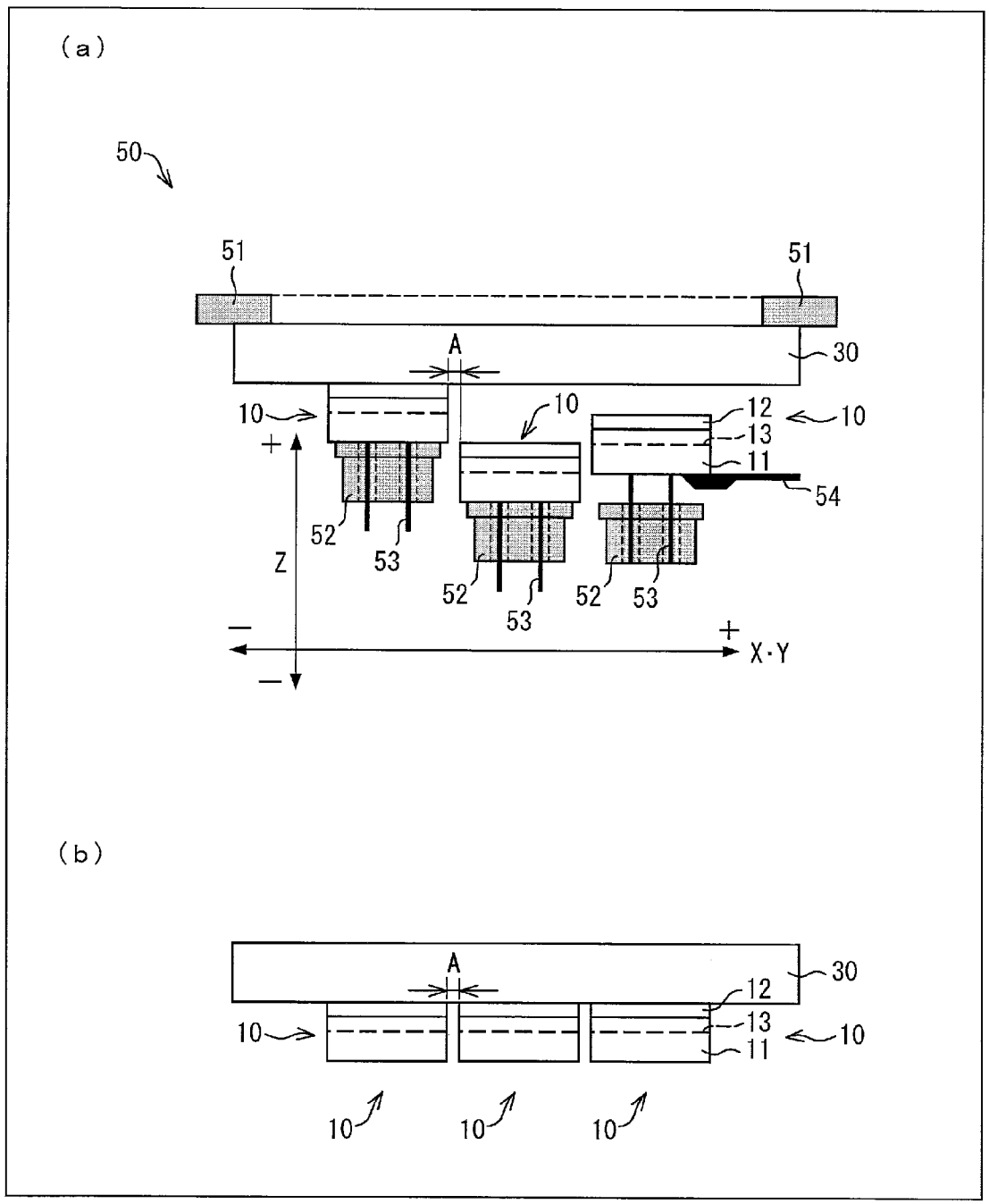
FIG. 10 is a view for describing steps in which Si wafers are combined with an insulating substrate.

FIG. 10 is a view for describing the step of combining the Si wafers 10 with the insulating substrate 30.

As illustrated in FIG. 10, the Si wafers 10 are combined with the insulating substrate 30 with the use of the combining device 50.

The combining device 50 is a device designed for combining, one after another, Si wafers 10 (i.e. single-crystal Si layers 11 to be Si thin films 16 later) with an insulating substrate 30 with spaces A between adjacent Si wafers 10.

As described earlier, the spaces A are to be each (i) larger than a difference, when a temperature is changed from room temperature to a particular temperature higher than room temperature, between (a) elongation of a part of the insulating substrate which part corresponds to each of the spaces A and (b) elongation of each of the Si wafers 10 and (ii) smaller than 5 mm. Specifically, according to the present embodiment, the spaces A are each larger than 0.246 mm and smaller than 5 mm, and preferably smaller than 2 mm.

The combining device 50 includes (i) a vacuum suction frame (insulating substrate supporting table) 51, (ii) a plurality of stages (semiconductor situating tables) 52, (iii) a plurality of lifting and lowering pins (supporting columns) 53, and (iv) a jig 54. Note that, although not illustrated, the combining device 50 further includes a control section for controlling driving of each of the vacuum suction frame 51, the stages 52, the lifting and lowering pins 53, and the jig 54 and driving of the entire device.

The vacuum suction frame 51 is a stage for situating the insulating substrate 30. According to the present embodiment, the vacuum suction frame 51 has a form of a frame. The vacuum suction frame 51 has, on a bottom surface thereof, a vacuum suction opening (not illustrated). Note that the vacuum suction frame 51 is not limited to any particular one, but can have any form, provided that the insulating substrate 30 can be stuck to the vacuum suction frame 51.

According to the present embodiment, the vacuum suction frame 51 is fixed instead of being moveable to any of X, Y, and Z-axis directions.

The stages 52 are configured to combine the Si wafers 10 with the insulating substrate 30 by situating and moving the Si wafers 10 and by causing the situated Si wafers 10 to come into contact with the insulating substrate 30.

According to the present embodiment, for example, the combining device 50 is assumed to include three stages 52 which are less in number than the Si wafers 10 to be combined with a single insulating substrate 30.

Each of the stages 52 is configured to be capable of quickly moving not only in the X-axis and Y-axis directions but in the Z-axis direction. Each of the stages 52 is a stage whose location in relation to and distance from the vacuum suction frame 51 can be changed.

The lifting and lowering pins 53 are each a pin configured to situate the stages 52 on corresponding Si wafers 10 by (i) receiving the Si wafers 10 after the previous step and then (ii) lowering the Si wafers 10 without tilting.

The lifting and lowering pins 53 are provided so as to run through openings of corresponding stages 52. A plurality of lifting and lowering pins 53 are provided per stage 52.

It is only necessary to provide, per stage 52, an enough number of lifting and lowering pins 53 to be able to (i) support a corresponding Si wafer 10 from a back-surface side of the Si wafer 10 and (ii) lift/lower the Si wafer 10 without tilting. For example, the present embodiment assumes that four lifting and lowering pins 53 are provided per stage 52.

The lifting and lowering pins 53, as part of their corresponding stages 52, are capable of quickly moving in the X-axis and Y-axis directions and in the Z-axis direction. Furthermore, the lifting and lowering pins 53 are capable of such vertical movements as protruding out (in the Z-axis direction) of stage surfaces of their corresponding stages 52 and withdrawing back into stages 52, in order to support the corresponding Si wafers 10 from the back-surface side of the Si wafers 10.

The jig 54 is configured to (i) receive each of the Si wafers 10 after the previous step and then (ii) situate the Si wafer 10 on lifting and lowering pins 53 that extend upwards from a corresponding stage 52.

The insulating substrate 30 whose combining surface was made hydrophilic in the previous step is introduced into the combining device 50 with the use of a robot arm or the like. Then, the insulating substrate 30 is situated on the bottom surface of the vacuum suction frame 51 such that the combining surface faces downwards in the vertical direction.

After the insulating substrate 30 is situated on the bottom surface of the vacuum suction frame 51, the vacuum suction frame 51 vacuum-holds the back surface (opposite the combining surface) of the insulating substrate 30. This is how the vacuum suction frame 51 causes the combining surface of the insulating substrate 30 to be fixed so as to face downwards.

When the Si wafers 10, each including an oxide film 12 whose front surface (combining surface) has been made hydrophilic, are introduced into the combining device 50, the jig 54 receives each of the Si wafers 10 while supporting a back surface (opposite the combining surface) of the Si wafer 10. Then, the jig 54 situates the Si wafer 10 on lifting and lowering pins 53 that protrude and extend from a situating surface of a corresponding stage 52.

The lifting and lowering pins 53 receive the Si wafer 10 from the jig 54 by using their top-end parts to support the back surface of the Si wafer 10. Then, the lifting and lowering pins 53 descend so as to cause the Si wafer 10, which is supported by the top-end parts of the lifting and lowering pins 53, to be situated on the situating surface of the stage 52.

The stages 52, on which the Si wafer 10 has been situated, quickly moves to a position on X, Y coordinates where the Si wafer 10 is to be combined with a corresponding part of the insulating substrate 30. After moving to the position of on X, Y coordinates where the Si wafer 10 is to be combined, the stage 52 ascends in the vertical direction (i.e. toward a positive Z-axis direction) while having the Si wafer 10 situated on the situating surface thereof.

Then, the stage 52 causes the combining surface of the Si wafer 10 to come into contact with the combining surface of the insulating substrate 30 which is fixed onto the vacuum suction frame 51. This causes the combining surfaces of the Si wafer 10 and of the insulating substrate 30 to be combined with each other by Van der Waals force.

Therefore, even when the stage 52 descends, the Si wafer 10 remains combined with the insulating substrate 30. This is how the stage 52 causes the corresponding Si wafer 10 to be combined with the insulating substrate 30.

Then, another Si wafer 10, whose combining surface has been made hydrophilic, is (i) introduced into the combining device 50, (ii) received by the jig 54, and (iii), (the) via lifting and lowering pins 53, received by and situated on the same stage 52 or another stage 52.

Then, the stage 52 quickly moves, as viewed from above, to a next point on X, Y coordinates where the another Si wafer 10 is away from the Si wafer 10 which was combined with the insulating substrate 30 first.

Then, while having the another Si wafer 10 situated on the situating surface thereof, the stage 52 ascends in the vertical direction (i.e. toward the positive Z-axis direction). Then, the stage 52 causes the combining surface of the another Si wafer 10 (situated on the situating surface of the stage 52) and the combining surface of the insulating substrate 30 (fixed onto the vacuum suction frame 51) to come into contact with each other. This causes the combining surfaces of the another Si wafer 10 and of the insulating substrate 30 to be combined with each other by Van der Waals force. Therefore, even when the stage 52 descends, the another Si wafer 10 remains combined with the insulating substrate 30.

The stage 52 causes the another Si wafer 10 to be thus combined with the insulating substrate 30 such that the another Si wafer 10 is away from the adjacent first Si wafer 10 by a space A.

Until a necessary number of Si wafers 10 are combined with the insulating substrate 30, the combining device 50 repeats the process of combining an Si wafer 10 with the insulating substrate 30.

The combining device 50 thus combines, one after another, the Si wafers 10 (situated on the corresponding stages 52) with the insulating substrate 30 (held by the vacuum suction frame 51) such that the spaces A between adjacent Si wafers 10 are each (i) larger than a difference, when a temperature is changed from room temperature to a particular temperature higher than room temperature, between (a) elongation of a part corresponding to each of the spaces A and (b) elongation of each of the Si wafers 10 and (ii) smaller than 5 mm.

Specifically, the Si wafers 10 can be combined, one after another, with the insulating substrate 30 such that spaces A are each larger than 0.246 mm and smaller than 5 mm, preferably smaller than 2 mm.

In a case where combining of a necessary number of Si wafers 10 with the insulating substrate 30 is completed, (i) the vacuum suction frame 51 releases the insulating substrate 30 and (ii) the combining device 50 causes a robot arm or the like to hold the insulating substrate 30 with which the Si wafers 10 have been combined. Then, the insulating substrate 30 is transported to a device that will carry out a following process.

As illustrated in (b) of FIG. 10, the insulating substrate 30, with which the Si wafers 10 were combined in the combining device 50, is transported to an annealing device. Then, the insulating substrate 30, with which the Si wafers 10 are combined, is subjected to a pre-annealing process at a temperature of 200° C. for approximately two hours in the annealing device. This causes dehydration to progress, and therefore causes covalent bonding to be formed. This causes the Si wafers 10 to be combined more firmly with the insulating substrate 30.

<Steps Involved in Obtaining Semiconductor Substrate 41 after Combining Step>

The following description will discuss, with reference to FIG. 11, production steps involved in obtaining a semiconductor substrate 41 after the Si wafers 10 are combined with the insulating substrate 30.

The Si wafers 10, which have been subjected to the pre-annealing process by use of the annealing device, are then subjected to a heat treatment by use of a heat treatment device (semiconductor production device) 60. This causes each of the Si wafers 10 to be separated at a fragile layer 13.

As illustrated in (a) through (c) of FIG. 11, a heat treatment device 60 includes a tray 61, lifting and lowering pins 62, and a jig 63. Although not illustrated, the heat treatment device 60 further includes (i) a robot arm for transporting in/out an insulating substrate 30, (ii) an insulating substrate supporting table for holding the insulating substrate 30 transported in, (iii) a heater for heating inside of the device, (iv) a control section for controlling driving of these members, and (v) the like.

The tray 61 is configured to receive single-crystal Si layers 17 which have been separated at respective fragile layers 13 and have been separated from the insulating substrate 30.

The lifting and lowering pins 62 are configured to (i) support the single-crystal Si layers 17 from a back-surface side of the single-crystal Si layers 17 and (ii) lift and lower the single-crystal Si layers 17. The lifting and lowering pins 62 are provided so as to run through respective openings formed in the tray 61. In addition, the lifting and lowering pins 62 are configured to be capable of moving in the Z-axis direction so as to (a) locate their respective top-end parts lower than a situating surface (i.e. front surface) of the tray 61 and (b) causing their respective top-end parts to protrude out of the situating surface.

The jig 63 is configured to (i) support the back surfaces of the single-crystal Si layers 17 which are lifted by the lifting and lowering pins 62 and (ii) remove the single-crystal Si layers 17 from the tray 61 while supporting the single-crystal Si layers 17.

As illustrated in (a) of FIG. 11, the heat treatment device 60 receives the insulating substrate 30 transported from the annealing device, and then causes the insulating substrate supporting table to hold the insulating substrate 30 such that the combining surface (with which surface the Si wafers 10 are combined) of the insulating substrate 30 face downwards in the vertical direction. In addition, the heat treatment device 60 causes the tray 61 to be provided so as to face the insulating substrate 30 without being in contact with the insulating substrate 30.

The heat treatment device 60 causes the tray 61 to be provided such that a gap between an Si-wafer-10 surface (i.e. surface opposite the combining surface) of the insulating substrate 30 and the tray 61 is as small as possible, for example, approximately 0.1 mm to 1 mm, so that positions of the single-crystal Si layers 17 in X, Y coordinates shift as little as possible when the single-crystal Si layers 17 are separated and dropped on the tray 61.

Note that a material for the tray 61 preferably has a high coefficient of friction. Alternatively, the tray 61 can have, although not illustrated, convex parts (protruding parts) for providing partitions between adjacent single-crystal Si layers 17 so that the single-crystal Si layers 17 are prevented from shifting when dropped on the tray 61.

The heat treatment device 60 in such a state is heated so that the insulating substrate 30 and the Si wafers 10 combined with the insulating substrate 30 are each heated at a temperature of 500° C. or more and a strain point (670° C.) of glass or less.

The insulating substrate 30 and the Si wafers 10 (combined with the insulating substrate 30) are thus heated at a temperature, as a particular temperature for the heat treatment, of 500° C. or more which is necessary for implanted hydrogen to expand so as to induce separation at the fragile layers. This ensures that the semiconductor wafers 10 are separated at their respective fragile layers 13.

In addition, such a relatively high temperature as 500° C. or more causes the separation at the fragile layers to progress smoothly. This allows a reduction in unevenness of surfaces of Si thin films 16 which are part of the semiconductor wafers 10 separated at the respective fragile layers 13.

Furthermore, it is possible to heat the insulating substrate 30 and the Si wafers 10 (combined with the insulating substrate 30) at a temperature, as a particular temperature for the heat treatment, of 720° C. or less which is a temperature close to a strain point of glass (for example, LOTUS (Registered Trademark) glass manufactured by Corning Inc.). This makes it possible to prevent heat from producing adverse effects such as distortion of the insulating substrate 30.

As a result, the Si wafers 10 can be reliably separated at the respective fragile layers 13 while maintaining excellent quality.

Note that in the example above, the heat treatment was carried out at a temperature of 600° C. for 1 hour.

According to the heat treatment device 60, the insulating substrate 30 and the Si wafers 10 combined with the insulating substrate 30 are heated from room temperature to a temperature at which the Si wafers 10 are separated at the respective fragile layers 13.

This heat treatment step is one of the steps, of all the production steps involved in production of the semiconductor substrate 41, in which the insulating substrate 30 and the Si wafers 10 combined with the insulating substrate 30 are heated at the highest temperature.

As illustrated in (b) of FIG. 11, in a case where the heat treatment device 60 is heated, micro-holes formed in the fragile layers 13 of the single-crystal Si layer 11 of the Si wafers 10 expand, so that the cracks develop across the Si wafers 10. This causes the Si wafers 10 to be separated along the respective fragile layers 13. Specifically, the single-crystal Si layer 11 are separated into (i) Si thin films 16 which are located closer to the insulating substrate 30 than are the respective fragile layers 13 and which have respective one sides designated as combining surfaces and (ii) single-crystal Si layers 17 which are located lower than are the respective fragile layers 13 and which face the tray 61.

Hence, the Si thin films 16, each of which has a thickness of approximately 50 nm to 200 nm, are transferred onto the insulating substrate 30.

Meanwhile, the single-crystal Si layers 17, which are separated from the Si thin films 16 are located lower, are dropped on the tray 61 so as to be collected. Since the gap between the Si wafers 10 and the tray 61 are as extremely small as approximately 0.1 mm to 1 mm as described above, it is possible to cause the separated single-crystal Si layers 17 to be prevented from shifting horizontally.

Note that if the Si wafers 10 are excessively close to one another when combined with the insulating substrate 30 during the heat treatment, then it may cause the Si wafers, which are undergoing thermal expansion, to collide with one another, so that the Si wafers 10 and/or the insulating substrate 30 may be fractured or chipped. This may cause particles to be generated. In addition, due to the difference in thermal expansion coefficient between the insulating substrate 30 made of glass and the Si wafers 10, stress is not easily alleviated, so that the Si wafers 10 and the insulating substrate 30 may become warped. This may cause the insulating substrate 30 to be fractured.

Therefore, according to the present embodiment, the Si wafers 10 are combined with the insulating substrate 30 such that the spaces A between adjacent Si wafers 10 are each larger than 0.246 mm.

This prevents the adjacent Si wafers 10 from interfering with each other even in a case where the insulating substrate and the Si wafers 10, which have differing thermal expansion coefficients, are heated at a temperature of approximately 600° C. during the heat treatment step so as to each undergo thermal expansion. As a result, the Si wafers 10 and/or the insulating substrate 30 can be prevented from being fractured or chipped.

As illustrated in (c) of FIG. 11, the heat treatment device 60 transports out, to a device for use in a following step, the insulating substrate 30 onto which the Si thin films 16 have been transferred as a result of the separation at the respective fragile layers 13.

Then, by causing the lifting the lifting and lowering pins 62 provided at predetermined locations of the tray 61 to ascend, the heat treatment device 60 causes the single-crystal Si layers 17, which have been dropped on the tray 61, to be lifted from a back-surface side so as to come apart from tray 61.

Next, the heat treatment device 60 causes the jig 63 to (i) support and vacuum-hold back surfaces of the single-crystal Si layers 17 which have been lifted by the lifting and lowering pins 62 and (ii) remove the single-crystal Si layers 17 from the respective lifting and lowering pins 62. This is how the heat treatment device 60 removes the single-crystal Si layers 17 which have been dropped on the tray 61.

The heat treatment device 60 thus includes the lifting and lowering pins 62 which are provided so as to run through the tray 61 and are capable of ascending and descending. This allows the single-crystal Si layers 17, which are dropped on the tray 61, to be lifted by causing the lifting and lowering pins 62 to come into contact with the back surfaces of the single-crystal Si layers 17. Therefore, it is possible to cause the jig 63 to collect the single-crystal Si layers 17 by coming into contact with and vacuum-holding the back surfaces of the single-crystal Si layers 17. According to the heat treatment device 60, it is thus unnecessary to touch side surfaces or front surfaces of the single-crystal Si layers 17 to collect the single-crystal Si layers 17. This makes it possible to individually collect the single-crystal Si layers 17 even in a case where the single-crystal Si layers 17 have small spaces therebetween after being dropped on the tray 61.

In addition, since it is unnecessary to touch the front surfaces of the single-crystal Si layers 17 when collecting the single-crystal Si layers 17, it is possible to collect the single-crystal Si layers 17 without causing the front surfaces to become dirty.

The front surfaces of the single-crystal Si layers 17 thus collected are made flat by polishing by use of CMP. Then, the single-crystal Si layers 17 are again subjected to a thermal oxidation process such as one illustrated in FIG. 9, and are then reused as Si wafers 10 to be combined with an insulating substrate.

By thus recycling the Si wafers 10 to be combined, it is possible to transfer an Si thin films 16 onto an insulating substrate 30 several dozens of times or more by use of a single Si wafer 10. This allows a significant reduction in material cost, and therefore makes it possible to provide an inexpensive semiconductor substrate 40 that is highly cost-competitive.

As illustrated in (d) of FIG. 11, the insulating substrate 30, onto which the Si thin films 16 have been transferred as a result of the separation at the respective fragile layers 13 due to the heat treatment by the heat treatment device 60, is next subjected to (i) a peripheral parts removing step and (ii) a laser treatment step.

In the peripheral parts removing step, the peripheral parts of the Si thin films 16 are removed by carrying out photolithography and a developing process by use of an exposure and developing device.

The peripheral parts (of a thickness of approximately several dozens of μm to 100 μm) of the Si thin films 16, which are transferred onto the insulating substrate 30, are weak in adhesion, and are therefore to be removed. The removal of the peripheral parts of the Si thin films 16 is optional, and can be carried out between (i) the step of forming a fragile layer described with reference to (b) of FIG. 9 and (ii) the step of combining the Si wafers 10 with the insulating substrate 30.

Alternatively, it is also possible to fix the peripheral parts by, instead of carrying out the photolithography and the developing process, irradiating the peripheral parts with a laser beam or the like (e.g. CW laser beam) and therefore melting the peripheral parts. In such a case, the peripheral parts are fixed instead of being removed. This allows the transferred Si thin films 16 to be put to use without wasting any surface area thereof.

Next, in the laser treatment step, the front surfaces of the Si thin films 16 are irradiated with a laser beam with the use of a laser treatment device. This (i) repairs damage caused by the implantation of hydrogen and (ii) causes the front surfaces to be flat.

Examples of the laser encompass an XeCl excimer laser that outputs a laser beam having a wavelength of 308 nm. An irradiating energy density is to be adjusted as appropriate according to the thickness of the transferred Si thin films 16. For example, in a case where the thickness of the Si thin films 16 is approximately 130 nm, the irradiating energy density is approximately 400 mJ/cm$^2$ to 700 mJ/cm$^2$.

A semiconductor substrate 40 is thus formed such that the plurality of Si thin films 16 are provided on the insulating substrate 30.

Alternatively, the laser treatment step can be, together with the peripheral parts removing step, carried out after carrying out an etch back process (see (e) of FIG. 11) to follow.

As illustrated in (e) of FIG. 11, the semiconductor substrate 40 is subjected to the etch back process. In the etch back step, as described earlier with reference to FIG. 2, the thickness of the Si thin films 16 is adjusted (made thin) to a desired thickness by carrying out an etch back process by dry etching with the use of the dry etching device 90 (not illustrated in (e) of FIG. 11). The thickness of the Si thin films 16 is reduced by approximately 50 nm to 100 nm in the etch back step.

The semiconductor substrate 40 is configured so that the plurality of transferred Si thin films 16 are laid so as to have, therebetween, small spaces of 5 mm or less, preferably 2 mm or less.

Therefore, substantially the entire front surface of the insulating substrate 30 is covered with semiconductor films (Si thin films 16). This causes in-plane distribution of potential difference to hardly occur within the front surface of the semiconductor substrate 40 when plasma is generated in the dry etching device 90.

As a result, according to the semiconductor substrate 40, electric fields are not concentrated on the peripheral parts (end parts) of the Si thin films 16. This causes a significant reduction in amount by which the peripheral parts 16b of the Si thin films 16 are to be reduced. It is therefore possible to cause the surfaces of the Si thin films 16 to be uniformly etched.

Therefore, it is possible to sufficiently secure panel formation regions 16a (regions having a uniform Si thin film thickness) on which panes can be formed. This causes an increase in efficiency with which panels can be obtained, and therefore allows (i) an increase in yield and (ii) a reduction in production costs.

By subjecting the Si thin films 16 to the etch back process, it is possible to obtain Si thin films 46 each having a thickness of, for example, 50 nm to 100 nm which is suitable for driving a display.

It is possible to obtain a semiconductor substrate 41 thus configured such that the plurality of Si thin films 46 are formed on the insulating substrate 30.

(Method of Producing TFT)

Figure 12:
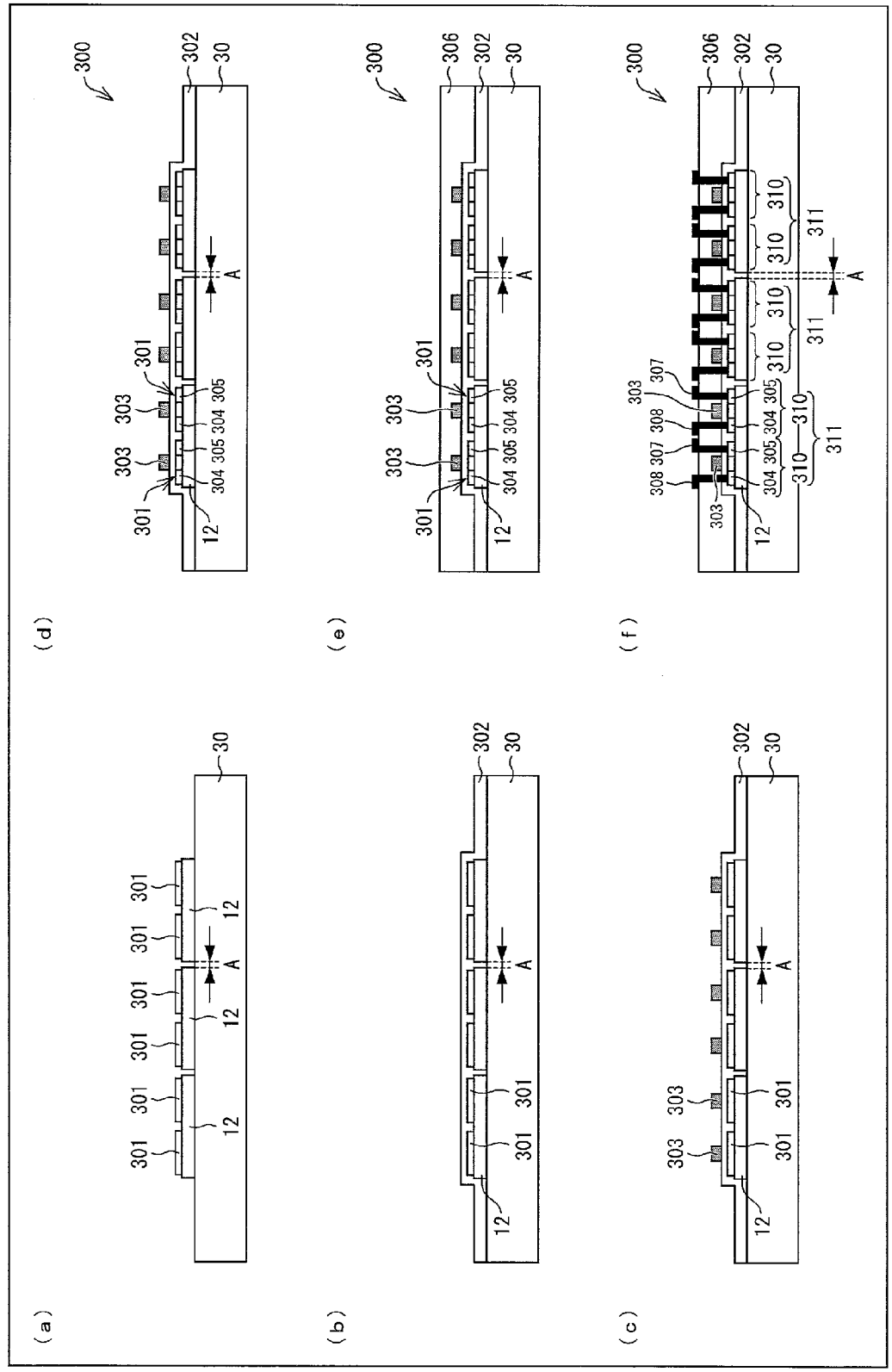
FIG. 12 is a view for describing a method of producing TFTs by use of a semiconductor substrate.

The following description will discuss, with reference to FIG. 12, a method of producing a transistor substrate 300 in which a TFT is formed from a semiconductor substrate 41.

FIG. 12 is a view for describing the method of producing a TFT by use of the semiconductor substrate 41.

It is only necessary to form a TFT from the semiconductor substrate 41 by carrying out a typical TFT formation process (from island formation to gate insulating film formation to gate electrode formation to source/drain ion implantation to interlayer deposition to activation to contact hole formation to metal wire formation) in which poly-Si or the like is employed. The TFT formation process will be briefly described below.

In an island formation step, the Si thin films 46, whose front surfaces were optionally subjected to the laser treatment, are formed into islands each having a desired TFT pattern by use of, for example, photolithography (see (a) of FIG. 12). This results in semiconductor thin films 301 (SOI layers) which are formed on the oxide films 12 into islands such that part of the oxide films 12 is exposed.

Next, in a gate insulating film formation step, a gate insulating film 302 is formed by covering, by use of the CVD method, (i) the semiconductor thin films 301, (ii) the oxide films 12 whose front surfaces are partially exposed, and (iii) the insulating substrate 30 (see (b) of FIG. 12).

The gate insulating film 302 is formed as to have a thickness of approximately 10 nm or more and 100 nm or less. Examples of a material for the gate insulating film 302 encompass (i) SiO$_2$, (ii) SiON, and (iii) a combination of SiO$_2$ and SiON. In addition, after the gate insulating film 302 is formed, channel doping for controlling a threshold can be carried out as necessary.

Next, in a gate electrode formation step, (i) a gate electrode material is formed into films on parts of front surfaces of the gate insulating film 302, which parts are located above the respective semiconductor thin films 301 and then (ii) gate electrodes 303 are formed in a pattern by photolithography (see (c) of FIG. 12).

The gate electrodes 303 are formed so as to each have a thickness of approximately 50 nm or more and 400 nm or less. Examples of a material for the gate electrodes 303 encompass W, Mo, MoW, Al, Al—Si, Ti, and a combination of these.

Next, in a step of forming source regions and drain regions, a source region 305 and a drain region 304 are formed in each of the semiconductor thin films 301 by carrying out ion doping or ion implantation on the semiconductor thin films 301 with the gate electrodes 303 each serving as a mask (see (d) of FIG. 12).

In a case where Nch-TFTs are to be formed, P, As, or the like can be ion-doped or ion-implanted on the source regions 305 and the drain regions 304. In a case where Pch-TFTs are to be formed, B (boron) or the like can be ion-doped or ion-implanted on the source regions 305 and the drain regions 304.

In a step of forming an interlayer insulating film, an interlayer insulating film 306 is formed, by use of the CVD method for example, all over the insulating substrate 30 so as to cover the gate electrodes 303 and the gate insulating film 302 (see (e) of FIG. 12).

The interlayer insulating film 306 is to be formed so as to have a thickness of approximately 200 nm or more and 600 nm or less. Examples of a material for the interlayer insulating film 306 encompass (i) $SiO_2$, (ii) SiN, and (iii) a combination of $SiO_2$ and SiN.

Then, in a step of carrying out a heat treatment, a heat treatment is carried out for the activation of ions implanted into the source regions 305 and the drain regions 304. In the step of carrying out the heat treatment, (i) furnace anneal is carried out at a temperature of 550° C. or more and 600° C. or less for approximately 1 hour to 2 hours or (ii) an RTA treatment is carried out at a temperature of 550° C. or more and 650° C. or less for approximately 10 minutes.

Next, in a step of forming source electrodes and drain electrodes, contact holes are made through the gate insulating film 302 and the interlayer insulating film 306 by, for example, photolithography and etching (see (f) of FIG. 12).

Then, a source/drain electrode material is formed into films on the interlayer insulating film 306 and in the contact holes by the sputtering method. Then, the source/drain electrode material, which have been formed into the films, are patterned. This results in (i) source electrodes 307 which are formed on the interlayer insulating film 306 and are connected to the respective source regions 305 via the respective contact holes and (ii) drain electrodes 308 which are formed on the interlayer insulating film 306 and are connected to the respective drain regions 304 via the respective contact holes.

Examples of the source/drain electrode material encompass Al, Al—Si, and Ti.

Thus, a transistor substrate 300 can be obtained, which is configured such that a plurality of (Nch (n-channel) or Pch (p-channel)) TFTs 310 are provided on the insulating substrate 30, each of the TFTs 310 including at least (i) a semiconductor thin film 301 (serving as an active layer) on which a source region 305 and a drain region 304 are formed, (ii) a gate electrode 303, (iii) a source electrode 307, and (iv) a drain electrode 308.

It is also possible to form CMOS (complementary MOS transistor) circuits 311 by combining together an Nch-TFT 310 and a Pch-TFT 310 which are provided on each of the oxide films 12.

According to the transistor substrate 300, the semiconductor thin films 301, which serve as active layers, have a uniform thickness. This causes little variance in characteristics of the TFTs 310. Therefore, it is possible to obtain a high-performance transistor substrate 300 of little variance, which is suitable for a liquid crystal panel, an organic EL panel, and the like.

By using such a transistor substrate 300 in the process of producing a liquid crystal panel and in the process of producing an organic EL panel, it is possible to obtain a liquid crystal panel and an organic EL panel, on each of which CMOS circuits 311 each having little display unevenness and consuming little electric power are monolithically formed.

In addition, the use of the CMOS circuits 311 realizes various semiconductor circuits. For example, it is possible to produce an amplifier circuit, a power supply circuit, a feedback circuit, a differential amplifier circuit, and the like. Furthermore, it is also possible to produce a phase compensating circuit, a filter circuit, and the like which are essential for wireless communication.

Since the transistor substrate 300 obtained in the present embodiment is an extremely large glass substrate, it may be used after being cut into a piece(s) of a size of a required panel or the like by use of the following device.

(Electronic Device)

The following description will discuss configurations of electronic devices each produced by use of the transistor substrate 300.

First, a liquid crystal display device obtained by use of the transistor substrate 300 will be described below.

Figure 14:
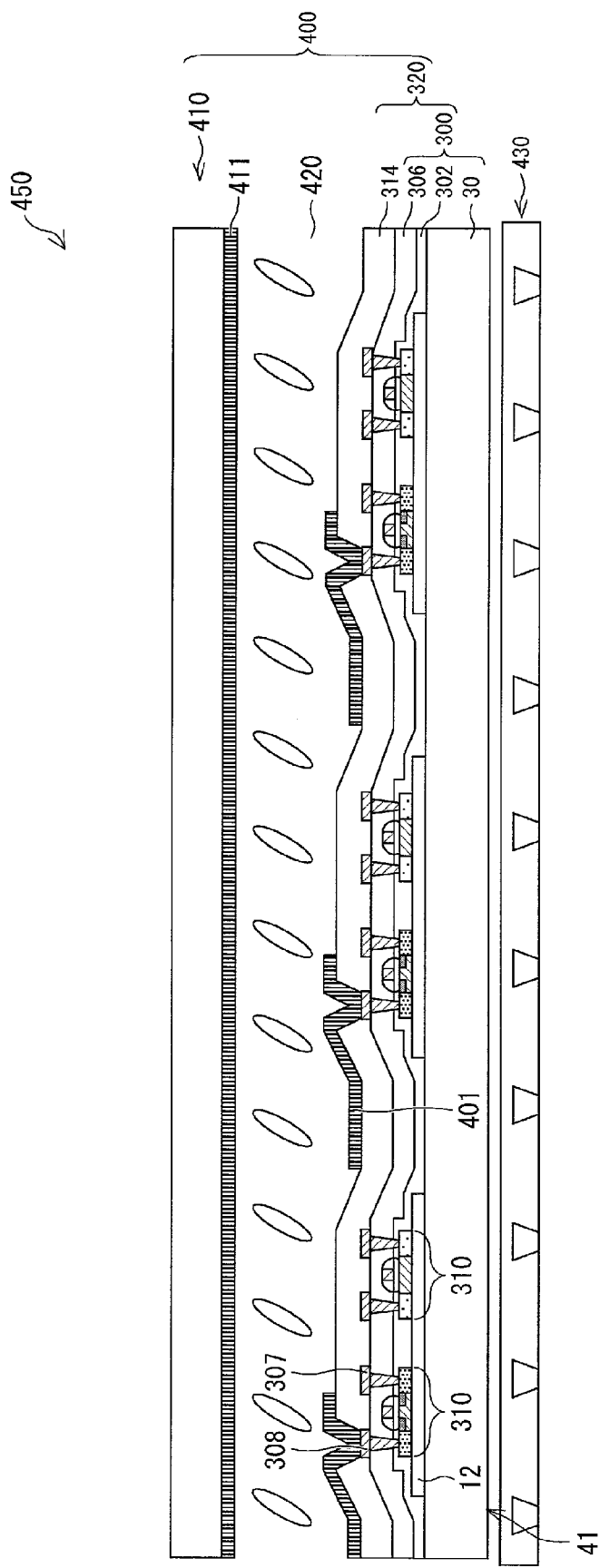
FIG. 14 is a cross-sectional view illustrating a liquid crystal display device produced by use of an active matrix substrate.

FIG. 14 is a cross-sectional view illustrating a liquid crystal display device produced by use of the transistor substrate 300 of the present embodiment.

Some of the TFTs 310 of the transistor substrate 300 illustrated in (f) of FIG. 12 serve as pixel transistors (switching elements) for driving pixels.

First, an interlayer insulating film 306 of a transistor substrate 300 is covered with source electrodes 307 and drain electrodes 308, and then covered with an interlayer insulating film 314. Then, contact holes are made through parts of the interlayer insulating film 314, which parts are located on the drain electrodes 308.

Next, pixel electrodes 401 are formed on the interlayer insulating film 314 so as to be connected to the respective drain electrodes 308 of the TFTs 310 via the respective contact holes. This results in an active matrix substrate 320 that includes the TFTs 310 each serving as a switching element to be used for pixels.

It is also possible to produce a liquid crystal drive circuit by combining together TFTs 310 which do not serve as pixel transistors. It is also possible to further provide photodetection elements and photodiodes on the active matrix substrate 320 so as to use the TFTs 310 for controlling driving of the photodetection elements. This makes it possible to constitute a liquid crystal display device equipped with a touch panel function which works by detecting a position of light received by the photodetection elements.

A liquid crystal panel 400 is obtained by (i) combining (a) together the active matrix substrate 320 on which the pixel electrodes 401 are formed, (b) a counter substrate 410 on which a counter electrode 411 is formed, (ii) sealing the active matrix substrate 320 and the counter substrate 410, and then (iii) inserting liquid crystals 420 between the active matrix substrate 320 and the counter substrate 410. In a case where voltage is applied to the liquid crystal panel 400, an orientation of the liquid crystals 420 changes. This causes the liquid crystals 420 to serve as shutters that let through or block light from the pixels. Then, backlight modules 430 are provided on a back surface of the liquid crystal panel 400. This allows for a liquid crystal display device 450 which displays an image by causing the liquid crystal panel 400 to (as shutters) turn on/off light from the backlight modules 430. The backlight modules 430 can be realized by use of LEDs, cold-cathode tubes, or the like.

Next, an electroluminescence device obtained by use of the transistor substrate 300 will be described below.

Figure 15:
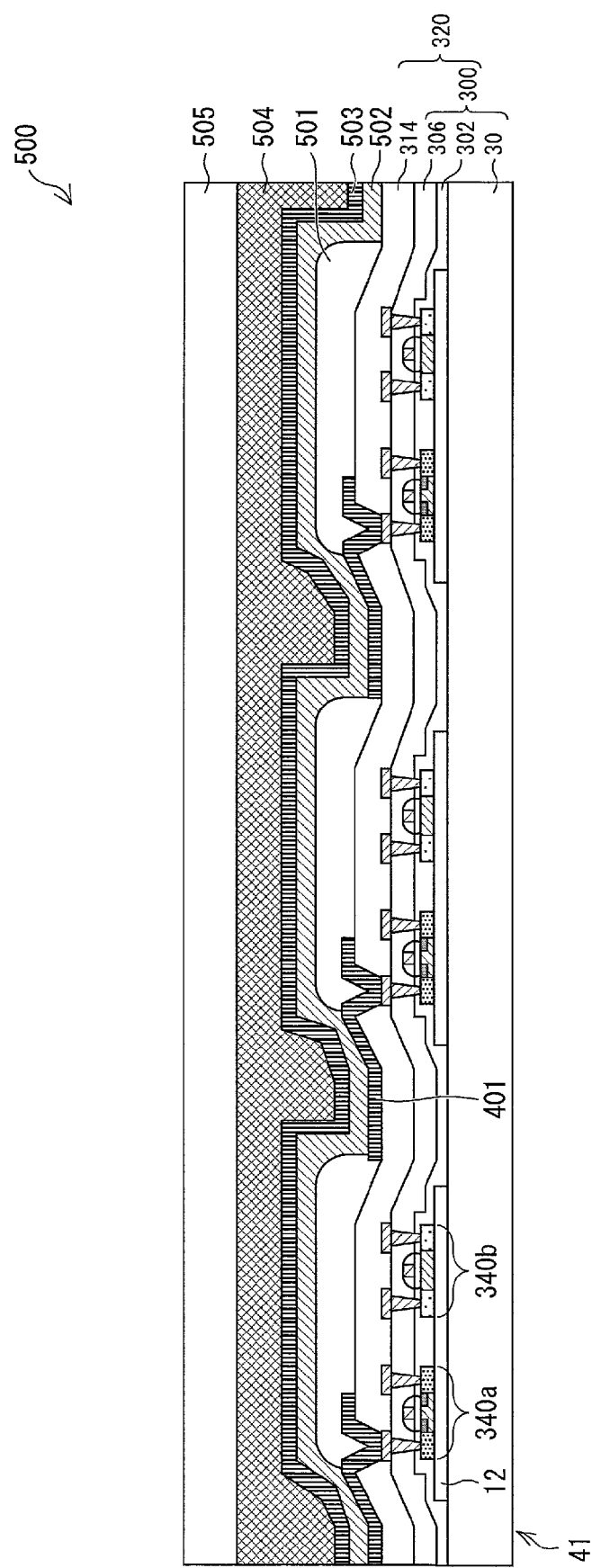
FIG. 15 is a cross-sectional view illustrating an electroluminescence device produced by use of an active matrix substrate.

FIG. 15 is a cross-sectional view illustrating an electroluminescence device obtained by use of the transistor substrate 300.

First, as is the case of the liquid crystal display device 450 illustrated in FIG. 14, an interlayer insulating film 306 of a transistor substrate 300 is covered with source electrodes 307 and drain electrodes 308, and then covered with an interlayer insulating film 314. Then, contact holes are made through parts of the interlayer insulating film 314, which parts are located on the drain electrodes 308.

Next, pixel electrodes 401 are formed on the interlayer insulating film 314 so as to be connected to the respective drain electrodes 308 of the TFTs 310 via the respective contact holes. This results in an active matrix substrate 320 that includes the TFTs 310 each serving as a switching element to be used for pixels.

Next, on the active matrix substrate 320 in which the pixel electrodes 401 are formed, isolation layers 501 are formed so as to prevent adjacent pixels from being short-circuited with each other. Then, an electroluminescence-material-containing layer (EL layer 502), a counter electrode 503, and a resin layer 504 are formed in this order, and are finally combined with a counter substrate 505 which is intended for protection. An electric current flows through the EL layer 502 sandwiched between the pixel electrodes 401 and the counter electrode 503. This results in an electroluminescence (EL) device 500 including the EL layer 502 that emit light.

The electroluminescence device 500 can be used as a display device such as a display, or as a light emitting device such as a light emitting device.

Next, a wireless communication device obtained by use of the transistor substrate 300 will be described below.

Figure 16:
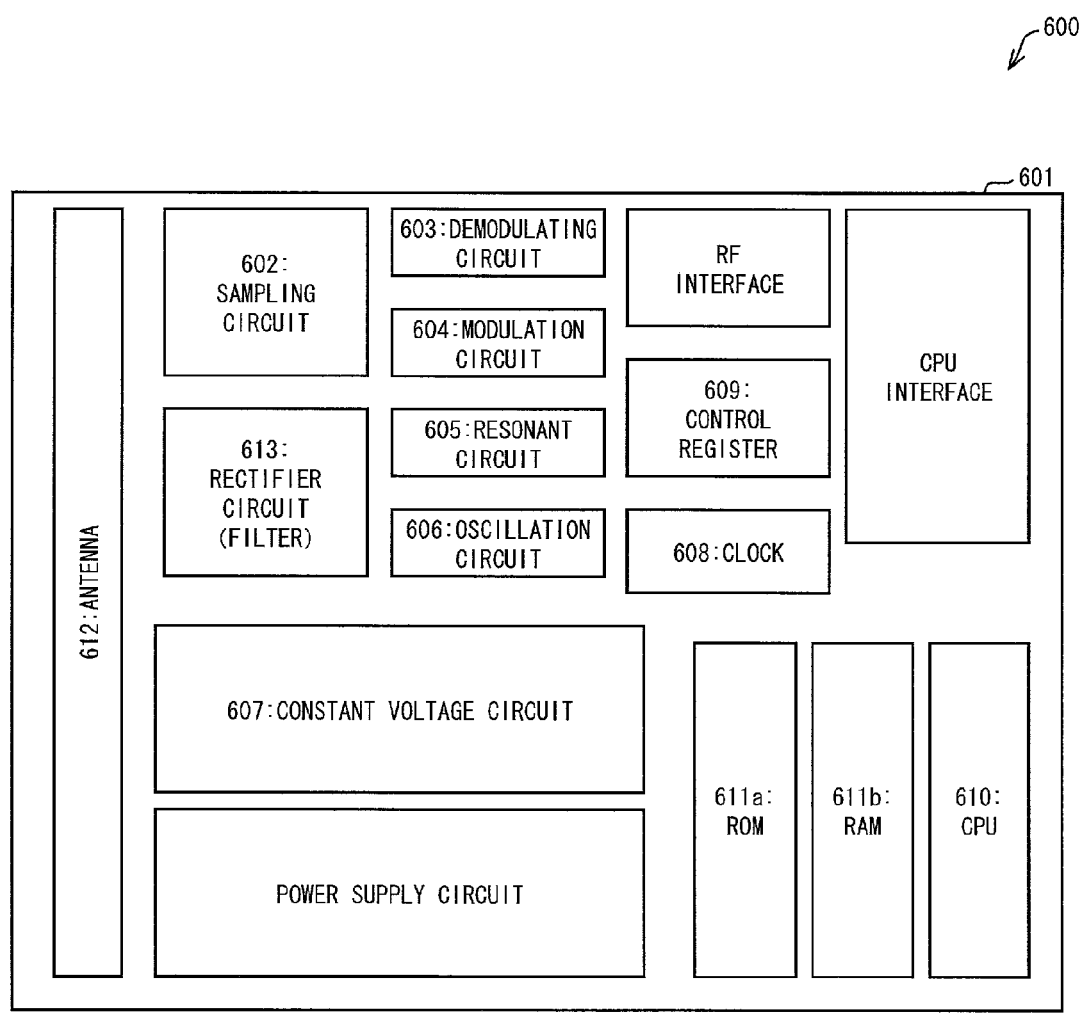
FIG. 16 is a circuit block diagram for describing a wireless communication device produced by use of a transistor substrate.

FIG. 16 is a circuit block diagram for describing a wireless communication device produced by use of the transistor substrate 300 in accordance with the present embodiment. It may be assumed that configurations involved in a wireless communication device 600 are fundamentally identical to that of each CMOS circuit 311 illustrated in FIG. 12. The wireless communication device 600 includes a wireless communication circuit 601 including circuits each constituted by the transistor substrate 300 illustrated in FIG. 12.

The wireless communication circuit 601 includes (i) communications system circuits such as: an antenna 612 and a sampling circuit 602 for receiving radio waves; a demodulating circuit 603 for demodulating the radio waves thus received (and/or a modulation circuit 604 for attaching a signal to the carrier wave); a rectifier (filter) circuit 613 for obtaining frequency characteristics; and a resonant circuit 605 and/or an oscillation circuit 606 for resonating and/or oscillating the signal, respectively, (ii) a power supply system circuit such as a constant voltage circuit 607 for providing constant voltage to the circuits, (iii) control system circuits such as: a clock 608 and a control register 609 for controlling timings with which signals are transmitted/received; and a CPU 610 for driving the clock 608 and the control register 609, and (iv) memory circuits such as a ROM 611a and a RAM 611b for storing data.

Next, a light emitting device obtained by use of the transistor substrate 300 will be described below.

Figure 17:
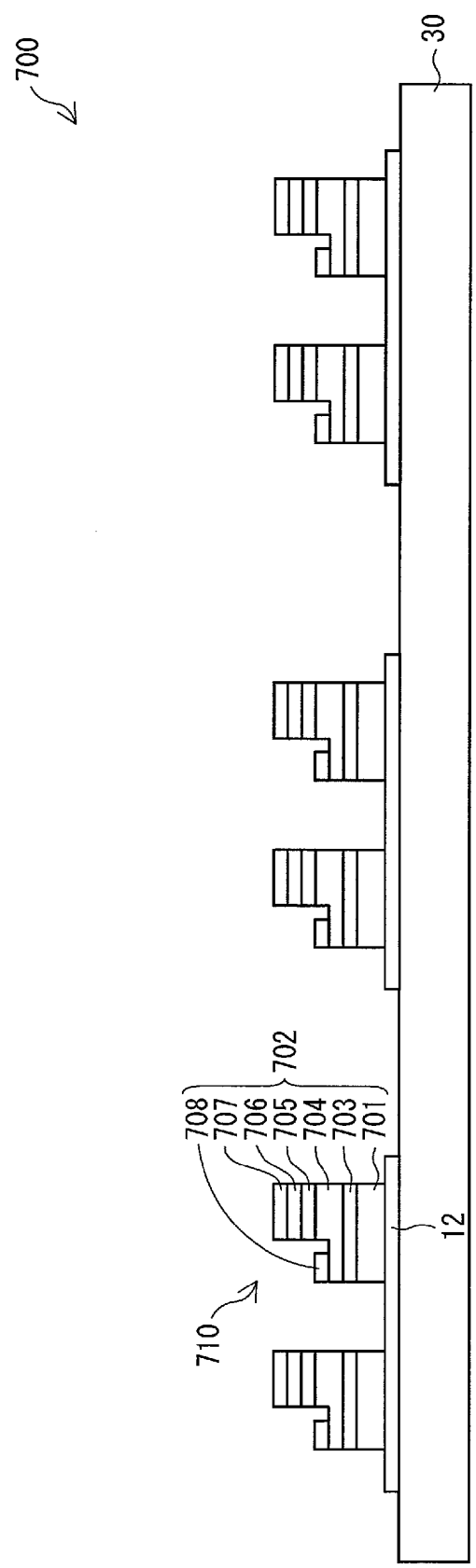
FIG. 17 is a schematic view for describing a light emitting device produced by use of a transistor substrate.

FIG. 17 is a view schematically illustrating a light emitting device obtained by use of the transistor substrate 300 in accordance with the present embodiment. Instead of the semiconductor thin films 301 (described in the present embodiment) which are made of single-crystal silicon, compound semiconductors made of GaN, GaAs, or the like are formed on oxide films 12. Specifically, laminated films 702, which are compound semiconductor films and which have undergone epitaxial growth on respective sapphire substrates 701, are transferred onto the oxide films 12 provided on an insulating substrate 30.

The laminated films 702 are each made of (I) a buffer layer 703, an n-contact layer 704, a light emitting layer 705, a p-contact layer 706, and a p-electrode 707 which are stacked in this order from a sapphire-substrates-701 side and (II) an n-electrode 708 which is stacked on the n-contact layer 704 apart from the light emitting layer 704.

A light emitting device 700 is thus obtained by forming LEDs 710, which are light emitting elements, on the insulating substrate 30.

(Electronic Apparatus)

Figure 18:
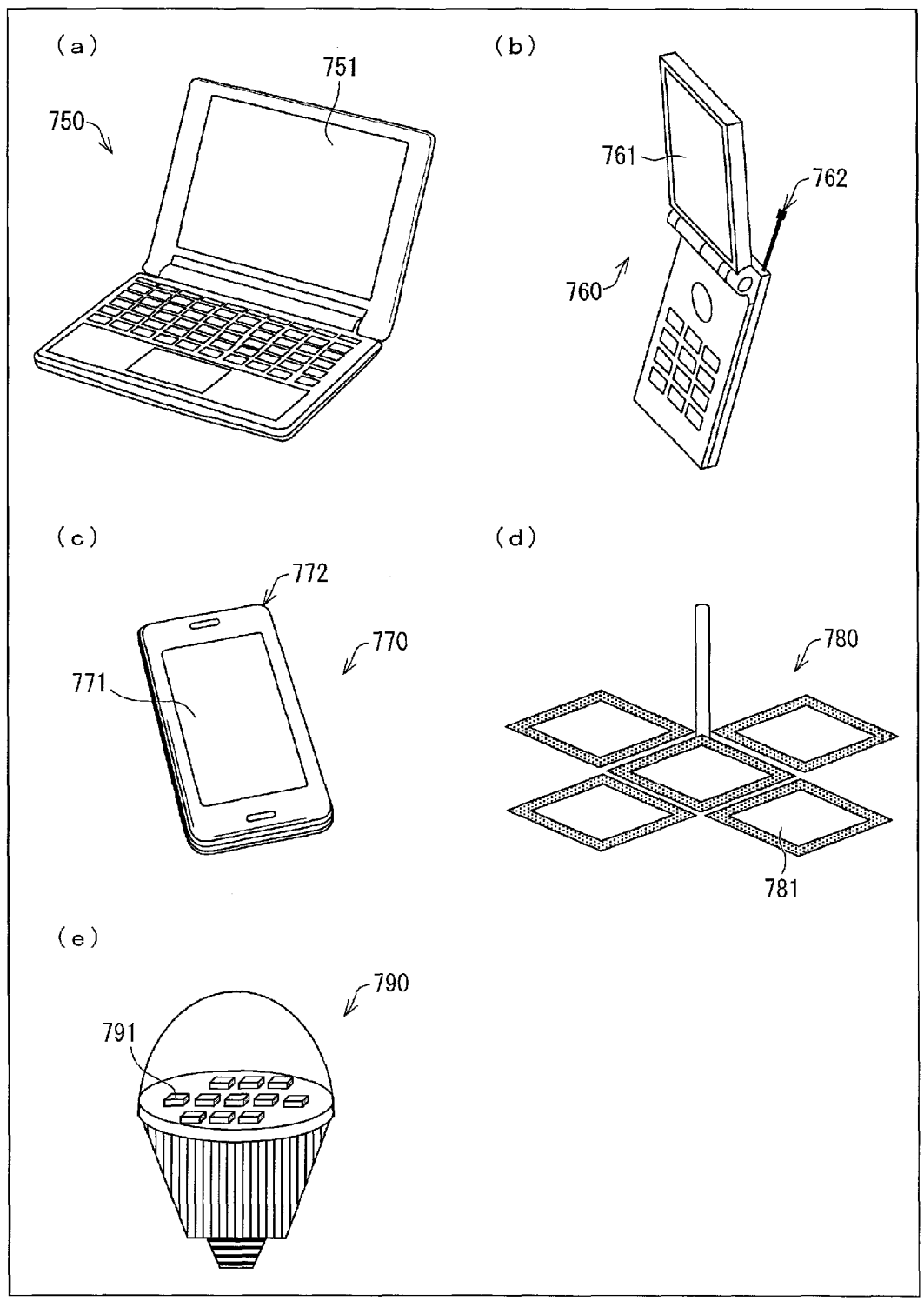
FIG. 18 is a view illustrating electronic apparatuses that can be produced by use of an electronic device which is produced by use of a transistor substrate.

The following description will discuss, with reference to FIG. 18, an electronic apparatus that can be produced by use of the electronic device obtained by use of the transistor substrate 300.

FIG. 18 illustrates products (electronic apparatuses) obtained by applying the electronic devices such as the liquid crystal display device, the electroluminescence device, the wireless communication device, and the light emitting device in accordance with the present embodiment. The liquid crystal display device 450 and the electroluminescence device 500 can be used for (i) a display section 751 of a personal computer (PC) 750 illustrated in (a) of FIG. 18, (ii) a display section 761 of a mobile phone 760 illustrated in (b) of FIG. 18, (iii) a display section 771 of a wireless communication apparatus 770 illustrated in (c) of FIG. 18, and (iv) the like.

The wireless communication device 600 can be used for (i) a wireless communication section 762 of the mobile phone 760 illustrated in (c) of FIG. 18, (ii) a wireless communication section 772 of the wireless communication apparatus 770, and (iii) the like.

The electroluminescence device 500 can be used not only for the display sections 751, 761, and 771 but can also be used for (i) a light emitting section 781 of an organic EL light 780 illustrated in (d) of FIG. 18 and (ii) the like.

The light emitting device 700 can be used for (i) light emitting sections 791 of an LED light bulb (electronic apparatus) 790 illustrated in (e) of FIG. 18 and (ii) the like.

Embodiment 2

Figure 19:
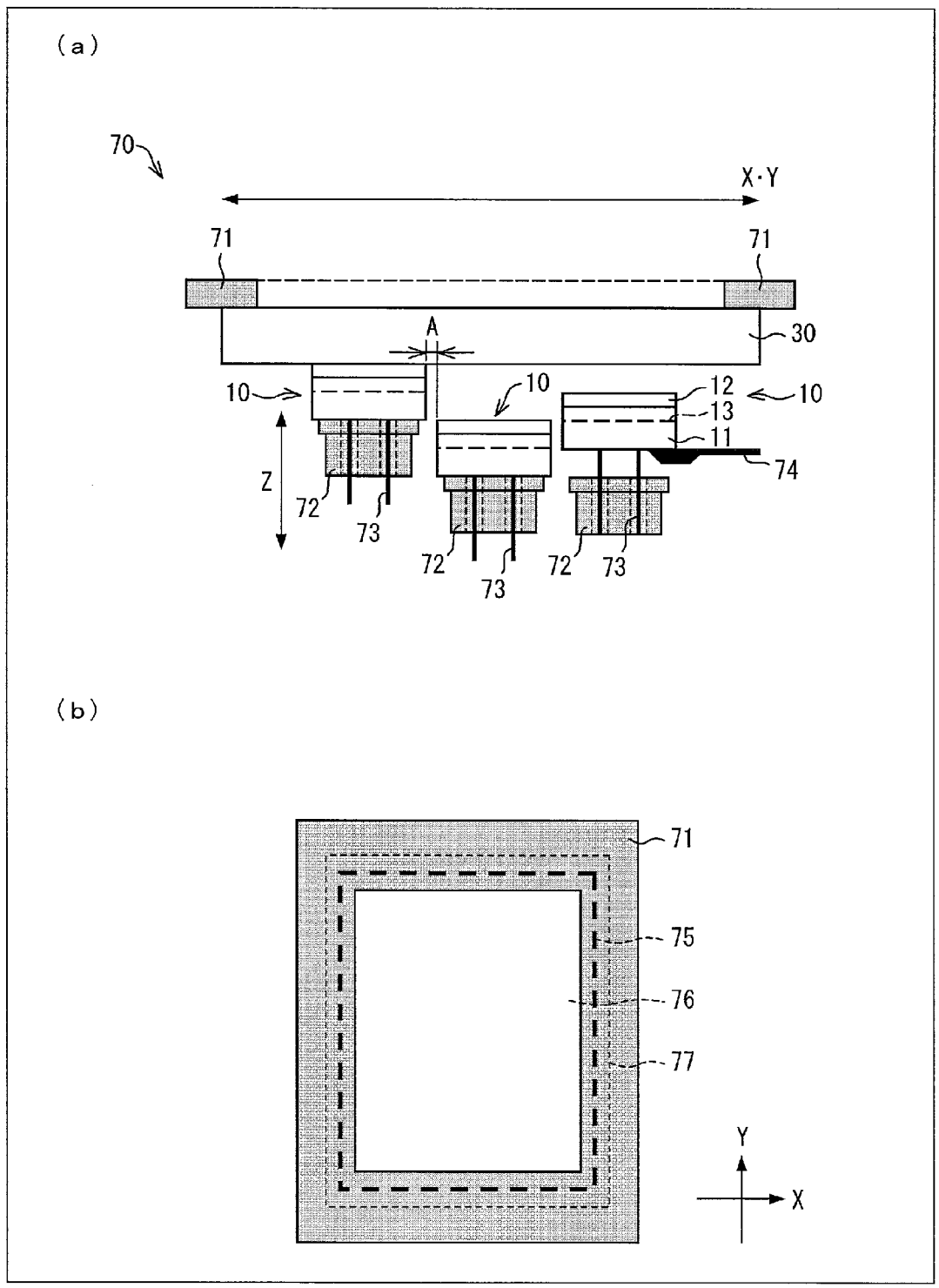
FIG. 19 is a set of views (a) and (b), (a) being a view illustrating a configuration of a combining device in accordance with Embodiment 2 and (b) being a plan view illustrating a configuration of a vacuum suction frame.

The following description will discuss Embodiment 2 of the present invention with reference to (a) and (b) of FIG. 19. (a) of FIG. 19 is a view illustrating a configuration of a combining device in accordance with Embodiment 2. (b) of FIG. 19 is a plan view illustrating a configuration of a vacuum suction frame. Note that, for convenience, members similar in function to those illustrated in the drawing of Embodiment 1 are given the same reference signs accordingly, and their description will be omitted.

Embodiment 2 only differs from Embodiment 1 in terms of the combining step of the steps described in Embodiment 1. The other steps and flows are identical to those described in Embodiment 1, and therefore will not be described.

As described above with reference to (a) through (c) of FIG. 9, respective combining surfaces of Si wafers 10 (in which fragile layers 13 are formed in corresponding single-crystal Si layer 11 by a typical Smart Cut process) and a combining surface of an insulating substrate 30 are made hydrophilic by carrying out plasma treatment or drug solution treatment.

In a case the plasma treatment is to be carried out, Ar plasma, atmospheric-pressure plasma, or the like can be employed. Alternatively, it is also possible to subject the front surfaces of the Si wafers 10 and the insulating substrate 30 to a drug solution treatment such as ozone water washing or SC1 washing for several minutes so that the front surfaces of the Si wafers 10 and of the insulating substrate 30 become hydrophilic.

Then, as illustrated in (a) of FIG. 19, the Si wafers 10 are combined with the insulating substrate 30 with the use of a combining device (semiconductor substrate production device) 70.

The combining device 70 includes (i) a vacuum suction frame (insulating substrate supporting table) 71, (ii) a plurality of stages (semiconductor situating tables) 72, (iii) a plurality of lifting and lowering pins (supporting columns) 73, and (iv) a jig 74. Note that, although not illustrated, the combining device 70 further includes a control section for controlling driving of each of the vacuum suction frame 71, the stages 72, the lifting and lowering pins 73, and the jig 74 and driving of the entire device.

The combining device 70 differs from the combining device 50 in that (i) the vacuum suction frame 71 moves in X-axis and Y-axis directions and (ii) the stages 72 do not move in the X-axis and Y-axis directions but only in a Z-axis direction. The rest of the configuration of the combining device 70 is similar to the configuration of the combining device 50.

According to the combining device 70, positions of the stages 72 and the lifting and lowering pins 73 on an imaginary X-Y plane are fixed, and the stages 72 and the lifting and lowering pins 73 can only move in the Z-axis direction.

Meanwhile, the vacuum suction frame 71 moves quickly in the X-axis and Y-axis directions while vacuum-holding edge parts of the insulating substrate 30.

(b) of FIG. 19 is a plan view illustrating the vacuum suction frame 71. The vacuum suction frame 71 has an opening 75 which is provided so as to enclose a combining position checking window 76 and is intended for vacuum-holding. The opening 75 is provided slightly inside an insulating substrate outline 77 which is a region at which the vacuum suction frame 71 is to be combined with the insulating substrate 30.

According to the combining device 70, when any stage 72 ascends so that the combining surface of the insulating substrate 30 and a combining surface of a corresponding Si wafer 10 situated on the stage 72 come into contact with each other, the combining surfaces are combined with each other by the van der Waals force. Even in a case where the stage 72 descends, the Si wafer 10 remains combined with the insulating substrate 30.

Then, after one Si wafer 10 is thus combined with the insulating substrate 30, the vacuum suction frame 71 moves to such a position that, as viewed from above, there will be a space A between (i) a following Si wafer 10 to be combined with the insulating substrate 30 next and (ii) the Si wafer 10 which has been thus combined with the insulating substrate 30.

Then, a stage 72 on which the following Si wafer 10 is situated ascends so that the following Si wafer 10 comes into contact with the insulating substrate 30.

This allows adjacent Si wafers 10 to be combined with the insulating substrate 30 such that the adjacent Si wafers 10 are provided apart from each other by the space A.

According to the combining device 70, the Si wafers 10 are thus combined with the insulating substrate 30 one after another.

The combining device 70 is thus configured such that (i) the vacuum suction frame 71 holding the stage 72 moves in the X-axis and Y-axis directions and (ii) the positions of the stages 72 in the X-axis and Y-axis directions are fixed.

By providing the stages 72, it is thus possible to omit moving mechanisms which are necessary for individually moving, in the X-axis and Y-axis directions, the stages 52 of the combining device 50. This allows the mechanisms of the combining device 70 to be simpler than those of the combining device 50.

Furthermore, even in a case where the plurality of stages 72 are arranged side by side, the stages 72 (i) are prevented from interfering with one another while simultaneously moving and (ii) have no mechanical limitations.

Therefore, with the combining device 70, it is possible to further increase throughput in the combining step.

Embodiment 3

Figure 20:
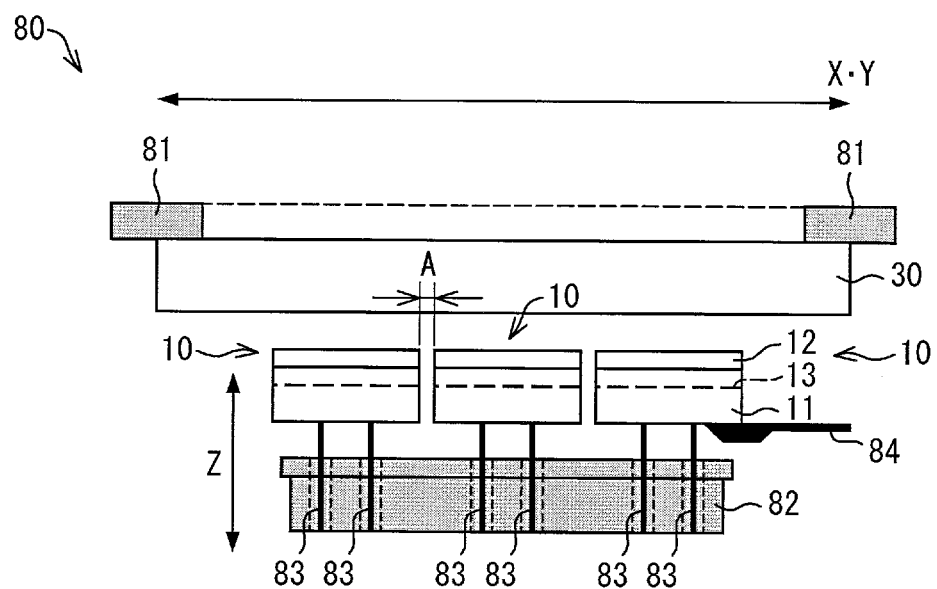
FIG. 20 is a view illustrating a configuration of a combining device in accordance with Embodiment 3.
Figure 21:
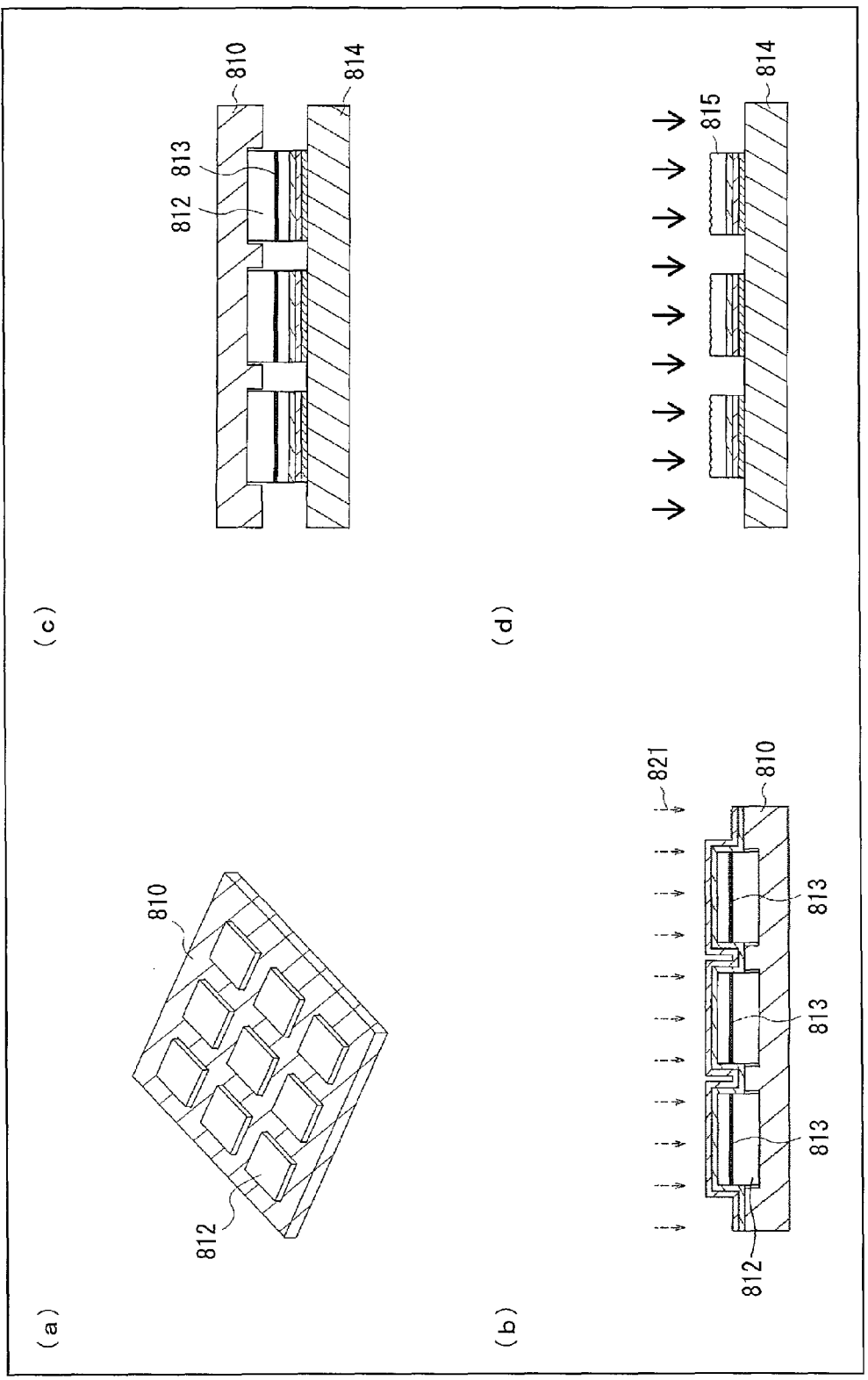
FIG. 21 is a view for describing a method of producing a conventional SOI substrate.

The following description will discuss Embodiment 3 of the present invention with reference to FIG. 20. FIG. 20 is a view illustrating a configuration of a combining device in accordance with Embodiment 3. Note that, for convenience, members similar in function to those illustrated in the drawing of Embodiments 1 and 2 are given the same reference signs accordingly, and their description will be omitted.

Embodiment 3 only differs from Embodiments 1 and 2 in terms of the combining step of the steps described in Embodiments 1 and 2. The other steps and flows are identical to those described in Embodiments 1 and 2, and therefore will not be described.

As described above with reference to (a) through (c) of FIG. 9, respective combining surfaces of Si wafers 10 (in which fragile layers 13 are formed in corresponding single-crystal Si layer 11 by a typical Smart Cut process) and a combining surface of an insulating substrate 30 are made hydrophilic by carrying out plasma treatment or drug solution treatment.

In a case the plasma treatment is to be carried out, Ar plasma, atmospheric-pressure plasma, or the like can be employed. Alternatively, it is also possible to subject the front surfaces of the Si wafers 10 and the insulating substrate 30 to a drug solution treatment such as ozone water washing or SC1 washing for several minutes so that the front surfaces of the Si wafers 10 and of the insulating substrate 30 become hydrophilic.

Then, as illustrated in FIG. 20, the Si wafers 10 are combined with the insulating substrate 30 with the use of a combining device (semiconductor substrate production device) 80.

The combining device 80 includes (i) a vacuum suction frame (insulating substrate supporting table) 81, (ii) a stage (semiconductor situating tables) 82, (iii) a plurality of lifting and lowering pins (supporting columns) 83, and (iv) a jig 84. Note that, although not illustrated, the combining device 80 further includes a control section for controlling driving of each of the vacuum suction frame 81, the stage 82, the lifting and lowering pins 83, and the jig 84 and driving of the entire device.

The combining device 80 differs from the combining device 50 and 70 in that (i) the vacuum suction frame 81 moves in X-axis and Y-axis directions, (ii) the stage 82 does not move in the X-axis and Y-axis directions but only in a Z-axis direction, and (iii) the stage 82 is one common stage that is capable of holding a plurality of Si wafers 10 instead of being a plurality of stages that hold the respective Si wafers 10. The rest of the configuration of the combining device 80 is similar to the configurations of the combining device 50 and 70.

According to the combining device 80, positions of the stage 82 and the lifting and lowering pins 83 on an imaginary X-Y plane are fixed, and the stage 82 and the lifting and lowering pins 83 can only move in the Z-axis direction.

Meanwhile, the vacuum suction frame 81 moves quickly in the X-axis and Y-axis directions while vacuum-holding edge parts of the insulating substrate 30. A shape of the vacuum suction frame 81 as viewed from above is similar to that of the vacuum suction frame 71 illustrated in (b) of FIG. 19.

According to the combining device 80, the jig 84 and the lifting and lowering pins 83 ascend/descend so as to provide, one after another on the stage 82, a desired number of Si wafers 10 to be combined with the insulating substrate 30 are provided such that spaces between adjacent Si wafers 10 are each a space A. Then, when the desired number of Si wafers 10 are provided on the stage 82, the stage 82 and the vacuum suction frame 81 are aligned with each other, and then the stage 82 ascends. Then, when combining surfaces of the Si wafers 10 provided on the stage 82 come into contact with a combining surface of the insulating substrate 30 all at once, the combining surfaces of the Si wafers 10 and the combining surface of the insulating substrate 30 are combined with each other by the Van der Waals force. Even in a case where the stage 82 descends, the Si wafers 10 remain combined with the insulating substrate 30.

According to the combining device 80, the plurality of Si wafers 10 are thus combined with the insulating substrate 30 all at once such that adjacent Si wafers 10 have a space A therebetween.

According to the combining device 80, the vacuum suction frame 81, instead of the stage 82, is capable of moving in the X-axis and Y-axis directions. This makes it possible to omit moving mechanisms which are necessary for individually moving, in the X-axis and Y-axis directions, the stages 52 of the combining device 50. This allows the mechanisms of the combining device 80 to be simpler than those of the combining device 50.

Furthermore, according to the combining device 80, the stage 82 is a one common stage that is capable of holding a plurality of Si wafers 10 all at once. Therefore, a plurality of Si wafers 10 can be combined with the insulating substrate 30 all at once. This (i) allows the throughput of the combining device 80 to be higher than that of the combining device 70 and (ii) makes it unnecessary for the vacuum suction frame 81 to quickly move, so that device cost can be reduced.

SUMMARY

As described above, a semiconductor substrate in accordance with one aspect of the present invention includes: an insulating substrate; and a plurality of semiconductor thin films which are transferred onto the insulating substrate by separating part of each of a plurality of semiconductor wafers from a remaining part of the each of the plurality of semiconductor wafers, the plurality of semiconductor wafers being provided apart from one another, the plurality of semiconductor thin films having a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

According to the configuration, the space between the semiconductor thin films is larger than the difference between the elongation of each of the semiconductor wafers and the elongation of part of the insulating substrate which part corresponds to the space when a change is made from room temperature to the particular temperature higher than the room temperature. Therefore, even in a case where the semiconductor thin films are transferred by carrying out the heat treatment to heat up the insulating substrate and the semiconductor wafers after the semiconductor wafers are combined with the insulating substrate, it is still possible to prevent the semiconductor wafers, which have been elongated by the heat, from interfering with one another. This makes it possible to prevent (i) the semiconductor wafers and the insulating substrate, which have been elongated by the heat the particular temperature, from being fractured or chipped and (ii) a transfer failure.

According to the configuration, the space between the semiconductor thin films is smaller than 5 mm. This allows surface area of peripheral parts, which have varying thicknesses, to be reduced in a case where the semiconductor thin films combined with the insulating substrate are subjected to the etch back process.

Therefore, with the configuration, it is thus possible to (i) prevent the insulating substrate and the semiconductor wafers combined with the insulating substrate from being fractured or chipped and prevent a transfer failure and (ii) produce a semiconductor substrate including semiconductor thin films each having a desired thickness by increasing a region of each of the semiconductor thin films, which region has a uniform thickness.

The semiconductor substrate is preferably configured such that the following inequality is satisfied:

$$L_{space} > \Delta L_{si} - \Delta L_{space}$$

wherein (i) $L_{space}$ indicates a length of part of the insulating substrate which part corresponds to a space between the plurality of semiconductor wafers at room temperature, (ii) $\Delta L_{si}$ indicates the elongation of each of the plurality of semiconductor wafers during the heat treatment, and (iii) $\Delta L_{space}$ indicates elongation of part of the insulating substrate which part corresponds to a space between the plurality of semiconductor wafers during the heat treatment.

According to the configuration, (i) the semiconductor wafers, which have elongated due to the heat by which to be separated at their respective fragile layers, are prevented from interfering with one another and (ii) the semiconductor wafers and the insulating substrate are prevented from being fractured or chipped. This makes it possible to reliably produce the semiconductor thin films.

The semiconductor substrate is preferably configured such that the space between the plurality of semiconductor thin films is larger than 0.246 mm. According to the configuration, the semiconductor wafers and the insulating substrate are prevented from being fractured or chipped due to the heat by which the semiconductor wafers are separated at their respective fragile layers. This makes it possible to reliably produce the semiconductor thin films.

The semiconductor substrate is preferably configured such that the space between the plurality of semiconductor thin films is larger than 0.5 mm and smaller than 2 mm.

According to the configuration, the space between the semiconductor thin films is smaller than 2 mm. This, in a case where the semiconductor thin films combined with the insulating substrate are subjected to the etch back process, allows a further reduction in surface area of the peripheral parts which have varying thicknesses. In addition, since the space between the semiconductor thin film is larger than 0.5 mm, it is possible to more reliably prevent the semiconductor wafers and the insulating substrate from being fractured or chipped due to the heat by which the semiconductor wafers are separated at their respective fragile layers.

The semiconductor substrate is preferably configured such that the plurality of semiconductor thin films are arranged in a matrix. With the configuration, it is possible to provide, on the insulating substrate, the semiconductor thin films so as to be closely laid with one another in a pattern. This makes it possible to minimize surface area of part of the insulating substrate, which part is not provided with the semiconductor thin films. It is therefore possible to increase efficiency with which panels are to be obtained.

The semiconductor substrate is preferably configured such that the particular temperature is a highest temperature among different temperatures used during a process of producing the semiconductor substrate. This reliably prevents the semiconductor wafers and the insulating substrate from being fractured or chipped by the heat during the production of the semiconductor substrate.

The semiconductor substrate is preferably configured such that: the plurality of semiconductor thin films are obtained by (i) combining, with the insulating substrate, the plurality of semiconductor wafers in each of which a fragile layer is formed and then (ii) separating each of the plurality of semiconductor wafers at its fragile layer; and the particular temperature is a temperature at which each of the plurality of semiconductor wafers is heated so as to be separated at its fragile layer.

According to the configuration, the semiconductor wafers and the insulating substrate are prevented from being fractured or chipped due to the heat by which the semiconductor wafers are separated at their respective fragile layers. This makes it possible to reliably produce the semiconductor thin films.

The semiconductor substrate is preferably configured such that the particular temperature is 500° C. or more and 720° C. or less. According to the configuration, the particular temperature is 500° C. or more which is necessary to cause implanted hydrogen to expand so as to induce the separation at the fragile layers. This allows the semiconductor wafers to be reliably separated at their respective fragile layers. In addition, since the separation at the fragile layers can progress smoothly, it is possible to suppress unevenness of the front surfaces at the semiconductor wafers are separated. Furthermore, since the particular temperature is 720° C. or less which is a temperature close to a strain point of glass, it is possible to prevent heat from causing distortion of the insulating substrate. In short, with the configuration, the semiconductor wafers can be reliably separated at the respective fragile layers while maintaining excellent quality.

The semiconductor substrate is preferably configured such that: the plurality of semiconductor thin films are made of single-crystal silicon; and the insulating substrate is made of glass. With the configuration, it is possible to produce a semiconductor substrate as an SOI substrate.

The semiconductor substrate is preferably configured such that the plurality of semiconductor thin films have a thickness of 50 nm or more and 200 nm or less before being subjected to dry etching, so that the plurality of semiconductor thin films have a desired thickness after the dry etching.

The configuration causes the semiconductor thin films to be thick enough in advance that no holes will be made through the semiconductor thin films when the semiconductor thin films are transferred onto the insulating substrate.

The semiconductor substrate is preferably configured such that, in a case where the plurality of semiconductor thin films are subjected to a dry etching process so as to have a desired thickness, the plurality of semiconductor thin films are etched by a thickness of 100 nm or less. With the configuration, it is possible to place a limit on the amount of thickness to be etched and/or on a length of time for which the etching is carried out. This causes the semiconductor substrate to be less likely to be affected by variations in etching rates and plasma damages within the substrate (in-plane distribution). Hence, it is possible to obtain a semiconductor substrate including semiconductor thin films having a uniform thickness.

In addition, it is possible to provide only an insulating material in the space between the semiconductor thin films. According to this configuration also, the space between the semiconductor thin films is as sufficiently small as 5 mm or less. This causes an increase in surface area of regions having a uniform thickness when the semiconductor thin films combined with the insulating substrate are subjected to the etch back process so that a semiconductor thin films having a desired thickness can be obtained.

The semiconductor substrate in accordance with one aspect of the present invention is preferably used to produce a thin film transistor, a semiconductor circuit, a liquid crystal display device, and an electroluminescence device. According to the configuration, a semiconductor substrate, by which panels can be efficiently obtained, is used. This makes it possible to obtain, at a low cost, a thin film transistor, a semiconductor circuit, a liquid crystal display device, and an electroluminescence device.

As described above, a method of producing a semiconductor substrate in accordance with one aspect of the present invention is method of producing a semiconductor substrate, said semiconductor substrate including: an insulating substrate; and a plurality of semiconductor thin films which are transferred onto the insulating substrate by separating part of each of a plurality of semiconductor wafers from a remaining part of the each of the plurality of semiconductor wafers, the plurality of semiconductor wafers being provided apart from one another, said method including the step of: combining, with the insulating substrate, the plurality of semiconductor wafers which are to become the plurality of semiconductor thin films such that the plurality of semiconductor thin films will have a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

With the configuration, it is possible to (i) prevent the insulating substrate and the semiconductor wafers combined with the insulating substrate from being fractured or chipped and (ii) produce a semiconductor substrate including semiconductor thin films each having a desired thickness by increasing a region of each of the semiconductor thin films, which region has a uniform thickness.

The method is preferably configured such that the plurality of semiconductor wafers are combined with the insulating substrate so as to satisfy the following inequality:

$$L_{space} > \Delta L_{si} - \Delta L_{space}$$

wherein (i) $L_{space}$ indicates a length part of the insulating substrate which part corresponds to a space between the plurality of semiconductor wafers at room temperature, (ii) $\Delta L_{si}$ indicates the elongation of each of the plurality of semiconductor wafers during the heat treatment, and (iii) $\Delta L_{space}$ indicates elongation of part of the insulating substrate which part corresponds to a space between the plurality of semiconductor wafers during the heat treatment.

According to the configuration, (i) the semiconductor wafers, which have elongated due to the heat by which to be separated at their respective fragile layers, are prevented from interfering with one another and (ii) the semiconductor wafers and the insulating substrate are prevented from being fractured or chipped. This makes it possible to reliably produce the semiconductor thin films.

The method is preferably configured such that the step of combining the plurality of semiconductor wafers with the insulating substrate is carried out such that the space between the plurality of semiconductor thin films will be larger than 0.246 mm.

With the configuration, it is possible to produce a semiconductor substrate while preventing (i) the semiconductor wafers and the insulating substrate from being fractured or chipped due to the heat by which the semiconductor wafers are separated at their respective fragile layers and (ii) a transfer failure.

The method is preferably configured such that the step of combining the plurality of semiconductor wafers with the insulating substrate is carried out such that the space between the plurality of semiconductor thin films will be larger than 0.5 mm and smaller than 2 mm.

According to the configuration, the space between the semiconductor thin films is smaller than 2 mm. This, in a case where the semiconductor thin films combined with the insulating substrate are subjected to the etch back process, allows a further reduction in surface area of the peripheral parts which have varying thicknesses, so that it is possible to produce a semiconductor substrate in which semiconductor thin films have a desired thickness. In addition, since the space between the semiconductor thin film is larger than 0.5 mm, it is possible to more reliably prevent the semiconductor wafers and the insulating substrate from being fractured or chipped due to the heat by which the semiconductor wafers are separated at their respective fragile layers.

The method is preferably configured to further include the step of: obtaining the plurality of semiconductor thin films by heating, at the particular temperature, the plurality of semiconductor wafers which are combined with the insulating substrate and in each of which a fragile layer is formed, so that each of the plurality of semiconductors wafers is separated at its fragile layer.

According to the configuration, the semiconductor wafers and the insulating substrate are prevented from being fractured or chipped due to the heat by which the semiconductor wafers are separated at their respective fragile layers. This makes it possible to reliably produce the semiconductor thin films.

The method is preferably configured such that the particular temperature is 500° C. or more and 720° C. or less. According to the configuration, the particular temperature is 500° C. or more which is necessary to cause implanted hydrogen to expand so as to induce the separation at the fragile layers. This allows the semiconductor wafers to be reliably separated at their respective fragile layers. In addition, since the separation at the fragile layers can progress smoothly, it is possible to suppress unevenness of the front surfaces at the semiconductor wafers are separated. Furthermore, since the particular temperature is 720° C. or less which is a temperature close to a strain point of glass, it is possible to prevent heat from causing distortion of the insulating substrate. In short, with the configuration, the semiconductor wafers can be reliably separated at the respective fragile layers while maintaining excellent quality.

The method is preferably configured to further include the step of: subjecting, to an etch back process, the plurality of semiconductor thin films having the space therebetween in which only an insulating material is provided. According to this configuration also, the space between the semiconductor thin films is sufficiently small as 5 mm or less. This allows a semiconductor substrate, in which semiconductor thin films combined with an insulating substrate each have a uniformly reduced thickness including a thickness of its peripheral parts, to be produced even in a case where the semiconductor thin films are subjected to an etch back process.

As described above, a semiconductor substrate production device in accordance with one aspect of the present invention is a semiconductor substrate production semiconductor substrate production device, said semiconductor substrate including: an insulating substrate; and a plurality of semiconductor thin films provided apart from one another on the insulating substrate, said semiconductor substrate production device including: an insulating substrate supporting table for supporting the insulating substrate; and semiconductor situating tables on which a plurality of semiconductor wafers to become the plurality of semiconductor thin films are to be situated, the insulating substrate supporting table and the semiconductor situating tables are changeable in positions relative to each other and are changeable in distance from each other, and the semiconductor substrate production device having a step of causing the plurality of semiconductor wafers, which are situated on the semiconductor situating tables, to be combined with the insulating substrate, which are supported by the insulating substrate supporting table, such that the plurality of semiconductor thin films will have a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

With the configuration, it is possible to (i) prevent an insulating substrate and a plurality of semiconductor wafers combined with the insulating substrate from being fractured or chipped and (ii) produce a semiconductor substrate in which a plurality of semiconductor thin films combined with an insulating substrate each have a uniformly reduced thickness including a thickness its peripheral parts.

The semiconductor substrate production device is preferably configured such that the plurality of semiconductor wafers are combined with the insulating substrate so as to satisfy the following inequality:

$$L_{space} > \Delta L_{si} - \Delta L_{space}$$

wherein (i) $L_{space}$ indicates a length part of the insulating substrate which part corresponds to a space between the plurality of semiconductor wafers at room temperature, (ii) $\Delta L_{si}$ indicates the elongation of each of the plurality of semiconductor wafers during the heat treatment, and (iii) $\Delta L_{space}$ indicates elongation of part of the insulating substrate which part corresponds to a space between the plurality of semiconductor wafers during the heat treatment.

According to the configuration, the semiconductor wafers and the insulating substrate are prevented from being fractured or chipped due to the heat by which the semiconductor wafers are separated at their respective fragile layers. This makes it possible to reliably produce the semiconductor thin films.

The semiconductor substrate production device is preferably configured such that the semiconductor substrate production device has a step of causing the plurality of semiconductor wafers, which are situated on the semiconductor situating tables, to be combined with the insulating substrate, which are supported by the insulating substrate supporting table, such that the space between the plurality of semiconductor thin films will be larger than 0.246 mm. With the configuration, it is possible to produce a semiconductor substrate in which the semiconductor wafers and the insulating substrate are prevented from being fractured or chipped due to the heat by which the semiconductor wafers are separated at their respective fragile layers.

The semiconductor substrate production device is preferably configured such that the semiconductor substrate production device has a step of causing the plurality of semiconductor wafers, which are situated on the semiconductor situating tables, to be combined with the insulating substrate, which are supported by the insulating substrate supporting table, such that the space between the plurality of semiconductor thin films will be larger than 0.5 mm and smaller than 2 mm.

According to the configuration, the space between the semiconductor thin films is smaller than 2 mm. This, in a case where the semiconductor thin films combined with the insulating substrate are subjected to the etch back process, allows a further reduction in surface area of the peripheral parts which have varying thicknesses, so that it is possible to produce a semiconductor substrate in which semiconductor thin films have a desired thickness. In addition, since the space between the semiconductor thin film is larger than 0.5 mm, it is possible to more reliably prevent the semiconductor wafers and the insulating substrate from being fractured or chipped due to the heat by which the semiconductor wafers are separated at their respective fragile layers.

The semiconductor substrate production device is preferably configured such that the plurality of semiconductor wafers, which are to be combined with the insulating substrate supported by the insulating substrate supporting table, are combined with the insulating substrate one after another. This makes it possible to produce a semiconductor substrate in which space between the plurality of semiconductor thin films is (a) larger than a difference between elongation of each of the plurality of semiconductor wafers and elongation of part of the insulating film which part corresponds to the space when a change is made from room temperature to a particular temperature higher than the room temperature and (b) smaller than 5 mm.

The semiconductor substrate production device is preferably configured to further include: supporting columns for causing the plurality of semiconductor wafers to be situated on the semiconductor situating tables, the semiconductor substrate production device having a step in which the supporting columns cause the plurality of semiconductor wafers, which are to be combined with the insulating substrate supported by the insulating substrate supporting table, to be situated on the semiconductor situating tables such that a space between the plurality of semiconductor wafers will be (a) larger than a difference between elongation of each of the plurality of semiconductor wafers and elongation of part of the insulating film which part corresponds to the space in a case where a change is made from room temperature to a particular temperature higher than the room temperature and (b) smaller than 5 mm.

With the configuration, it is possible to cause the semiconductor wafers, which are situated on the semiconductor situating tables, to be combined with the insulating substrate all at once. This allows an increase in throughput.

The semiconductor substrate production device is preferably configured such that: the semiconductor situating tables are fixed in a planar direction; and the insulating substrate supporting table is moveable in the planar direction. With the configuration, it is possible to simplify a device configuration. Therefore, even in a case where the plurality of semiconductor situating tables are provided so as to be operated simultaneously with the insulating substrate supporting table, the semiconductor situating tables and the insulating substrate supporting table are prevented from interfering with each other. This allows an increase in throughput.

The present invention is not limited to the description of the embodiments, but can be altered in many ways by a person skilled in the art within the scope of the claims. An embodiment derived from a proper combination of technical means disclosed in different embodiments is also encompassed in the technical scope of the present invention.

INDUSTRIAL APPLICABILITY

The present invention is applicable to a semiconductor substrate, a thin film transistor, a semiconductor circuit, a liquid crystal display device, an electroluminescence device, a method of producing a semiconductor substrate, and a semiconductor substrate production device.

REFERENCE SIGNS LIST

10 Si wafer (semiconductor wafer)
11 Single-crystal Si layer
12 Oxide films
13 Fragile layer
16, 46 Si thin film (semiconductor thin film)
46*a* Panel formation regions (Si region having uniform thickness)
46*b* Peripheral parts (thinned Si region)
30 Insulating substrate
40 Semiconductor substrate
41 Semiconductor substrate
41*a*, 41*b* Semiconductor substrate
46 Si thin film
50, 70, 80 Combining device (semiconductor production device)
51, 71, 81 Vacuum suction frame (insulating substrate supporting table)
52, 72, 82 Stage (semiconductor situating table)
53, 73, 83 Lifting and lowering pins (supporting columns)
60 Heat treatment device (semiconductor substrate production device)
62 Lifting and lowering pins (supporting columns)
90 Dry etching device (semiconductor substrate production device)
300 Transistor substrate
301 Semiconductor thin film
310 TFT
311 CMOS circuit
320 Active matrix substrate
400 Liquid crystal panel
450 Liquid crystal display device
500 Electroluminescence device
600 Wireless communication device
700 Light emitting device
750 Personal computer
760 Mobile phone
770 Wireless communication apparatus
780 Organic EL light
790 LED light bulb
916, 946 Si thin film (semiconductor thin film)
946*a* Panel formation regions (Si region having uniform thickness)
946*b* Peripheral parts (thinned Si region)
940 SOI substrate
941 SOI substrate

The invention claimed is:

1. A semiconductor substrate comprising:
an insulating substrate; and
a plurality of semiconductor thin films which are transferred onto the insulating substrate by separating part of each of a plurality of semiconductor wafers from a remaining part of the each of the plurality of semiconductor wafers, the plurality of semiconductor wafers being provided apart from one another,
the plurality of semiconductor thin films having a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

2. The semiconductor substrate as set forth in claim 1, wherein the following inequality is satisfied:

$$L\text{space} > \Delta L si - \Delta L \text{space}$$

wherein (i) Lspace indicates a length of part of the insulating substrate which part corresponds to a space between the plurality of semiconductor wafers at room temperature, (ii) $\Delta Lsi$ indicates the elongation of each of the plurality of semiconductor wafers during the heat treatment, and (iii) $\Delta L\text{space}$ indicates elongation of part of the insulating substrate which part corresponds to a space between the plurality of semiconductor wafers during the heat treatment.

3. The semiconductor substrate as set forth in claim 1, wherein the space between the plurality of semiconductor thin films is larger than 0.246 mm.

4. The semiconductor substrate as set forth in claim 1, wherein the space between the plurality of semiconductor thin films is larger than 0.5 mm and smaller than 2 mm.

5. The semiconductor substrate as set forth in claim 1, wherein the plurality of semiconductor thin films are arranged in a matrix.

6. The semiconductor substrate as set forth in claim 1, wherein the particular temperature is a highest temperature among different temperatures used during a process of producing the semiconductor substrate.

7. The semiconductor substrate as set forth in claim 1, wherein:
the plurality of semiconductor thin films are obtained by (i) combining, with the insulating substrate, the plurality of semiconductor wafers in each of which a fragile layer is formed and then (ii) separating each of the plurality of semiconductor wafers at its fragile layer; and
the particular temperature is a temperature at which each of the plurality of semiconductor wafers is heated so as to be separated at its fragile layer.

8. The semiconductor substrate as set forth in claim 7, wherein the particular temperature is 500° C. or more and 720° C. or less.

9. The semiconductor substrate as set forth in claim 1, wherein:
the plurality of semiconductor thin films are made of single-crystal silicon; and
the insulating substrate is made of glass.

10. The semiconductor substrate as set forth in claim 1, wherein the plurality of semiconductor thin films have a thickness of 50 nm or more and 200 nm or less before being subjected to dry etching, so that the plurality of semiconductor thin films have a desired thickness after the dry etching.

11. The semiconductor substrate as set forth in claim 1, wherein, in a case where the plurality of semiconductor thin films are subjected to dry etching so as to have a desired thickness, the plurality of semiconductor thin films are etched by a thickness of 100 nm or less.

12. An electronic apparatus produced by use of a semiconductor substrate as set forth in claim 1.

13. A method of producing a semiconductor substrate,
said semiconductor substrate comprising:
an insulating substrate; and
a plurality of semiconductor thin films which are transferred onto the insulating substrate by separating part of each of a plurality of semiconductor wafers from a remaining part of the each of the plurality of semiconductor wafers, the plurality of semiconductor wafers being provided apart from one another,
said method comprising the step of:
combining, with the insulating substrate, the plurality of semiconductor wafers which are to become the plurality of semiconductor thin films such that the plurality of semiconductor thin films will have a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

14. The method as set forth in claim 13, wherein the plurality of semiconductor wafers are combined with the insulating substrate so as to satisfy the following inequality:

$$L\text{space} > \Delta Lsi - \Delta L\text{space}$$

wherein (i) Lspace indicates a length part of the insulating substrate which part corresponds to a space between the plurality of semiconductor wafers at room temperature, (ii) $\Delta Lsi$ indicates the elongation of each of the plurality of semiconductor wafers during the heat treatment, and (iii) $\Delta L\text{space}$ indicates elongation of part of the insulating substrate which part corresponds to a space between the plurality of semiconductor wafers during the heat treatment.

15. The method as set forth in claim 13, wherein the step of combining the plurality of semiconductor wafers with the insulating substrate is carried out such that the space between the plurality of semiconductor thin films will be larger than 0.246 mm.

16. The method as set forth in claim 13, wherein the step of combining the plurality of semiconductor wafers with the insulating substrate is carried out such that the space between the plurality of semiconductor thin films will be larger than 0.5 mm and smaller than 2 mm.

17. A semiconductor substrate production device for producing a semiconductor substrate,
said semiconductor substrate comprising:
an insulating substrate; and
a plurality of semiconductor thin films provided apart from one another on the insulating substrate,
said semiconductor substrate production device comprising:
an insulating substrate supporting table for supporting the insulating substrate; and
semiconductor situating tables on which a plurality of semiconductor wafers to become the plurality of semiconductor thin films are to be situated, the insulating substrate supporting table and the semiconductor situating tables are changeable in positions relative to each other and are changeable in distance from each other, and the semiconductor substrate production device having a step of causing the plurality of semiconductor wafers, which are situated on the semiconductor situating tables, to be combined with the insulating substrate, which are supported by the insulating substrate supporting table, such that the plurality of semiconductor thin films will have a space therebetween, the space being (a) larger than a difference between elongation of each of the plurality of semiconductor wafers and elongation of part of the insulating substrate which part corresponds to the space during a heat treatment in which a change is made from room temperature to a particular temperature higher than the room temperature and (b) smaller than 5 mm.

18. The semiconductor substrate production device as set forth in claim 17, wherein the plurality of semiconductor wafers are combined with the insulating substrate so as to satisfy the following inequality:

$$L\text{space} > \Delta L si - \Delta L \text{space}$$

wherein (i) Lspace indicates a length part of the insulating substrate which part corresponds to a space between the plurality of semiconductor wafers at room temperature, (ii) $\Delta Lsi$ indicates the elongation of each of the plurality of semiconductor wafers during the heat treatment, and (iii) $\Delta L\text{space}$ indicates elongation of part of the insulating substrate which part corresponds to a space between the plurality of semiconductor wafers during the heat treatment.

19. The semiconductor substrate production device as set forth in claim 18, wherein the semiconductor substrate production device has a step of causing the plurality of semiconductor wafers, which are situated on the semiconductor situating tables, to be combined with the insulating substrate, which are supported by the insulating substrate supporting table, such that the space between the plurality of semiconductor thin films will be larger than 0.246 mm.

20. The semiconductor substrate production device as set forth in claim 17, wherein the semiconductor substrate production device has a step of causing the plurality of semiconductor wafers, which are situated on the semiconductor situating tables, to be combined with the insulating substrate, which are supported by the insulating substrate supporting table, such that the space between the plurality of semiconductor thin films will be larger than 0.5 mm and smaller than 2 mm.

* * * * *